(12) United States Patent
Meng et al.

(10) Patent No.: US 11,152,355 B2
(45) Date of Patent: Oct. 19, 2021

(54) STRUCTURE WITH EMBEDDED MEMORY DEVICE AND CONTACT ISOLATION SCHEME

(71) Applicant: Taiwan Semiconductor Manufacturing Co., Ltd., Hsin-Chu (TW)

(72) Inventors: Fan-Shuen Meng, New Taipei (TW); Huang-Kui Chen, Hsinchu (TW); Min-Yann Hsieh, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 41 days.

(21) Appl. No.: 16/524,808

(22) Filed: Jul. 29, 2019

(65) Prior Publication Data
US 2019/0355716 A1 Nov. 21, 2019

Related U.S. Application Data

(62) Division of application No. 15/884,711, filed on Jan. 31, 2018, now Pat. No. 10,366,982.
(Continued)

(51) Int. Cl.
*H01L 27/108* (2006.01)
*H01L 29/76* (2006.01)
(Continued)

(52) U.S. Cl.
CPC .... *H01L 27/0629* (2013.01); *H01L 21/76802* (2013.01); *H01L 21/76816* (2013.01);
(Continued)

(58) Field of Classification Search
CPC ......... H01L 21/31116; H01L 21/31144; H01L 21/76802; H01L 21/76831;
(Continued)

(56) References Cited

U.S. PATENT DOCUMENTS 6,133,139 A 10/2000 Dalal et al.
8,659,090 B2 * 2/2014 Huang ................ H01L 27/2436
257/368

(Continued)

FOREIGN PATENT DOCUMENTS

CN 1449034 10/2003
CN 103811461 5/2014
(Continued)

*Primary Examiner* — Theresa T Doan
(74) *Attorney, Agent, or Firm* — Haynes and Boone, LLP

(57) ABSTRACT

The present disclosure provides an integrated circuit (IC) structure that includes a fin active region on a substrate; a metal gate stack on the fin active region; a source and a drain on the fin active region, wherein the metal gate stack spans from the source to the drain; an interlayer dielectric (ILD) layer disposed on the source and the drain; a first conductive feature and a second conductive feature formed in the ILD layer and being aligned on the source and the drain, respectively; and a dielectric material layer surrounding the first and second conductive features. The dielectric material layer continuously extends to a bottom surface of the first conductive feature and isolates the first conductive feature from the source and the second conductive feature contacts the drain.

20 Claims, 52 Drawing Sheets

Related U.S. Application Data

(60) Provisional application No. 62/592,810, filed on Nov. 30, 2017.

(51) Int. Cl.

| | |
|---|---|
| *H01L 27/06* | (2006.01) |
| *H01L 49/02* | (2006.01) |
| *H01L 21/768* | (2006.01) |
| *H01L 23/522* | (2006.01) |
| *H01L 27/07* | (2006.01) |
| *H01L 23/485* | (2006.01) |
| *H01L 21/311* | (2006.01) |
| *H01L 27/112* | (2006.01) |
| *H01L 27/24* | (2006.01) |
| *H01L 29/78* | (2006.01) |

(52) U.S. Cl.
CPC .. *H01L 21/76831* (2013.01); *H01L 21/76844* (2013.01); *H01L 21/76846* (2013.01); *H01L 23/485* (2013.01); *H01L 23/5223* (2013.01); *H01L 23/5226* (2013.01); *H01L 23/5228* (2013.01); *H01L 27/0738* (2013.01); *H01L 27/1085* (2013.01); *H01L 27/10879* (2013.01); *H01L 28/20* (2013.01); *H01L 28/60* (2013.01); *H01L 28/91* (2013.01); *H01L 21/31116* (2013.01); *H01L 21/31144* (2013.01); *H01L 27/0733* (2013.01); *H01L 27/10811* (2013.01); *H01L 27/11206* (2013.01); *H01L 27/2436* (2013.01); *H01L 29/785* (2013.01)

(58) Field of Classification Search
CPC ......... H01L 21/76844; H01L 21/76846; H01L 23/485; H01L 23/5226; H01L 27/10805; H01L 27/10826; H01L 27/1085; H01L 27/10879; H01L 27/11206; H01L 27/2436; H01L 28/60; H01L 28/91; H01L 29/41791; H01L 29/66795; H01L 29/785
USPC ........................................................ 257/311
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2005/0122771 A1 | 6/2005 | Chen |
| 2006/0084211 A1 | 4/2006 | Yang et al. |
| 2007/0111429 A1 | 5/2007 | Lung |
| 2008/0079089 A1 | 4/2008 | Lee et al. |
| 2008/0150078 A1 | 6/2008 | Houston |
| 2008/0211034 A1* | 9/2008 | Tsuchiya ........... H01L 21/28097 257/371 |
| 2013/0161707 A1 | 6/2013 | Huang et al. |
| 2013/0181350 A1 | 7/2013 | Pelley et al. |
| 2014/0065782 A1 | 3/2014 | Lu et al. |
| 2014/0273366 A1* | 9/2014 | Lin ................... H01L 21/28518 438/200 |

FOREIGN PATENT DOCUMENTS

| | | |
|---|---|---|
| CN | 105336672 | 2/2016 |
| CN | 105895527 A | 8/2016 |
| CN | 107046019 | 8/2017 |
| EP | 2202816 A1 | 6/2010 |
| KR | 19980033877 | 8/1998 |
| KR | 20110084166 A | 7/2011 |
| KR | 20160100228 A | 8/2016 |
| KR | 20160124295 A | 10/2016 |
| KR | 20170081552 A | 7/2017 |
| TW | 200837881 | 9/2008 |
| TW | 201608643 A | 3/2016 |
| TW | 201735365 A | 10/2017 |
| WO | 03021693 A2 | 3/2003 |
| WO | 2008078197 A2 | 7/2008 |

* cited by examiner

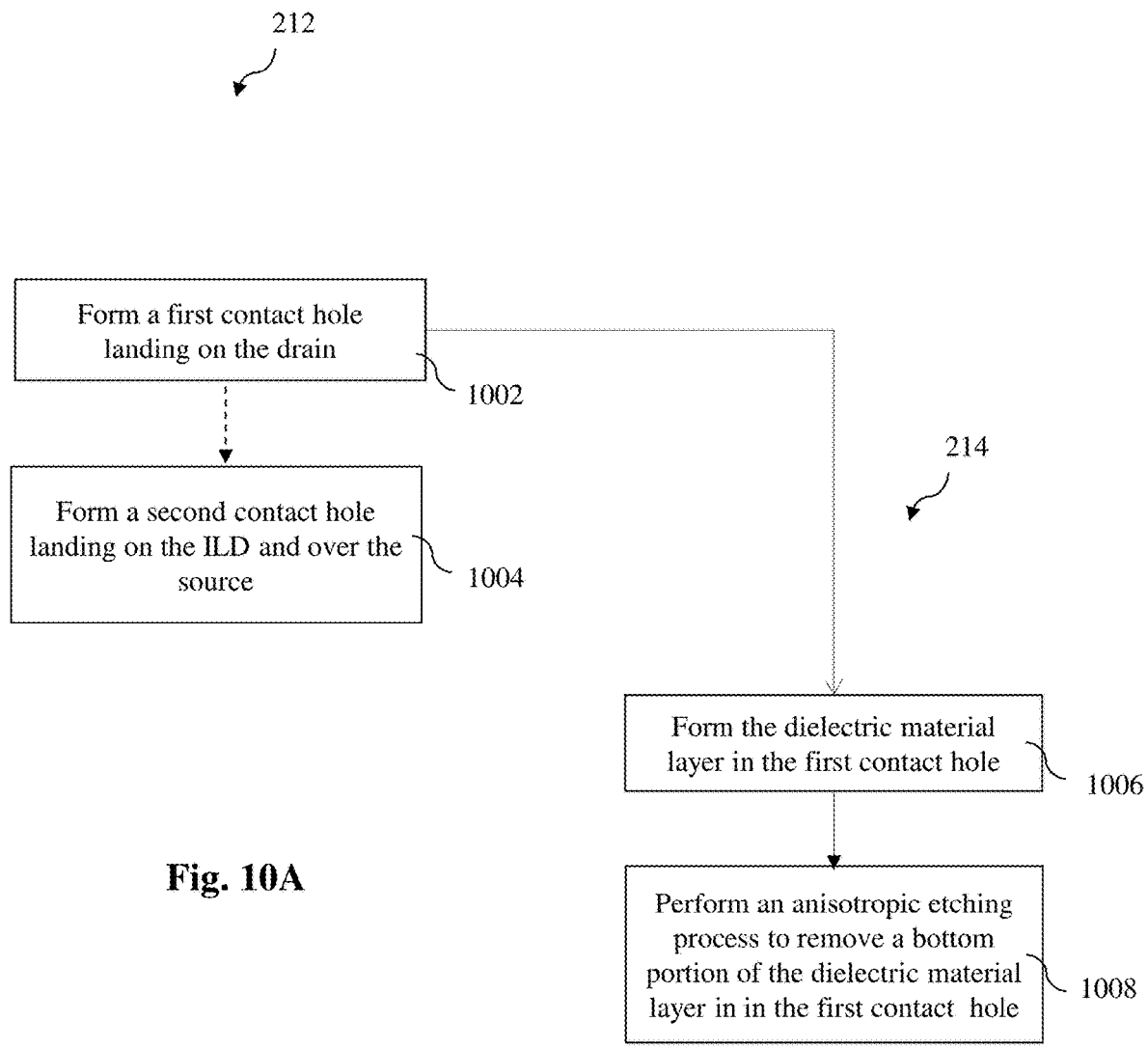

STRUCTURE WITH EMBEDDED MEMORY DEVICE AND CONTACT ISOLATION SCHEME

PRIORITY DATA

This application is a Divisional of U.S. patent application Ser. No. 15/884,711, filed Jan. 31, 2018, which further claims priority to U.S. Provisional Patent Application Ser. No. 62/592,810 filed Nov. 30, 2017, the entire disclosures of which are hereby incorporated herein by reference.

BACKGROUND

In an integrated circuit, an integrated circuit pattern can be formed on a substrate using various fabrication technologies that include photolithography patterning, etching, deposition and ion implantation. Thus formed integrated circuits include various devices, such as field-effect transistor, diode, bipolar transistor, imaging sensor, light-emitting diode, memory cell, resistor, and capacitor, integrated together. A memory device may include a passive device, such as a capacitor or a resistor coupled with other devices, such as a field-effect transistor. In the existing technologies, a passive device, such as a resistor, is formed through various semiconductor technologies that include etching. Those technologies have limited and inaccurate control to dimensions of the passive device, which causes high variations of the device dimensions and the device performance as well. In some cases, the device parameters may run out of the specification and fail the circuit. Furthermore, the existing methods are hard to be implemented in the advanced technology nodes due to high processing variation and small feature sizes. Especially, when the semiconductor technologies move forward to advanced technology nodes with smaller feature sizes, such as 7 nm or less, the misalignments have less tolerance and may cause leakage, short, opening or other failure defects or reliability issue. Therefore, the present disclosure provides a structure and a method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 10A and 10B are flowcharts of respective operations in the method of FIG. 2A in accordance with some embodiments.

DETAILED DESCRIPTION

Figure 1A:
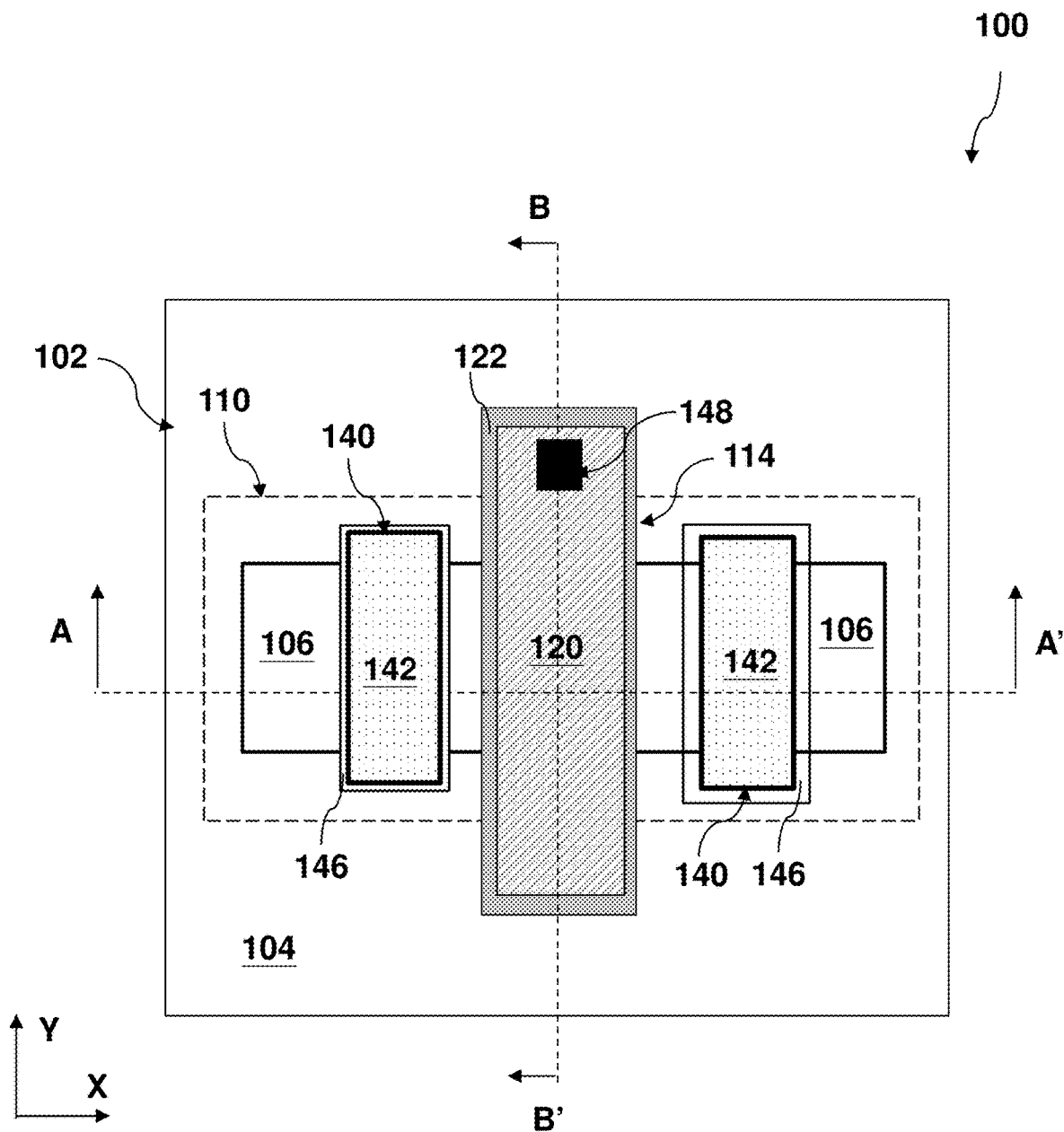
FIG. 1A is a top view of a semiconductor device structure constructed according to various aspects of the present disclosure in one embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is to be understood that the following disclosure provides many different embodiments, or examples, for implementing different features of various embodiments. Specific examples of components and arrangements are described below to simplify the present disclosure. These are, of course, merely examples and are not intended to be limiting.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1B:
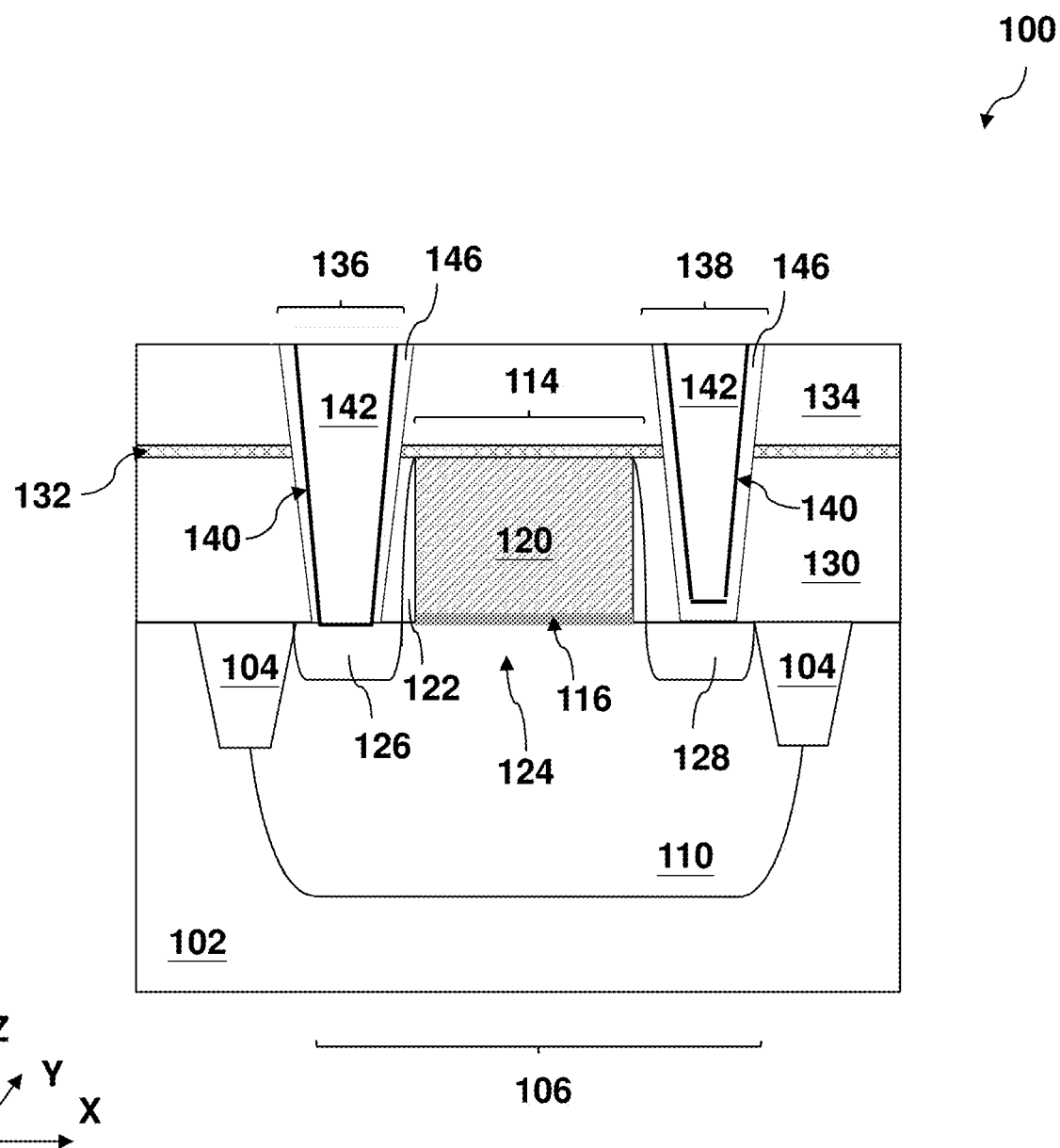
FIGS. 1B and 1C are sectional views of the semiconductor structure of FIG. 1A along the dashed lines AA' and BB' respectively, in accordance with some embodiments.
Figure 1C:
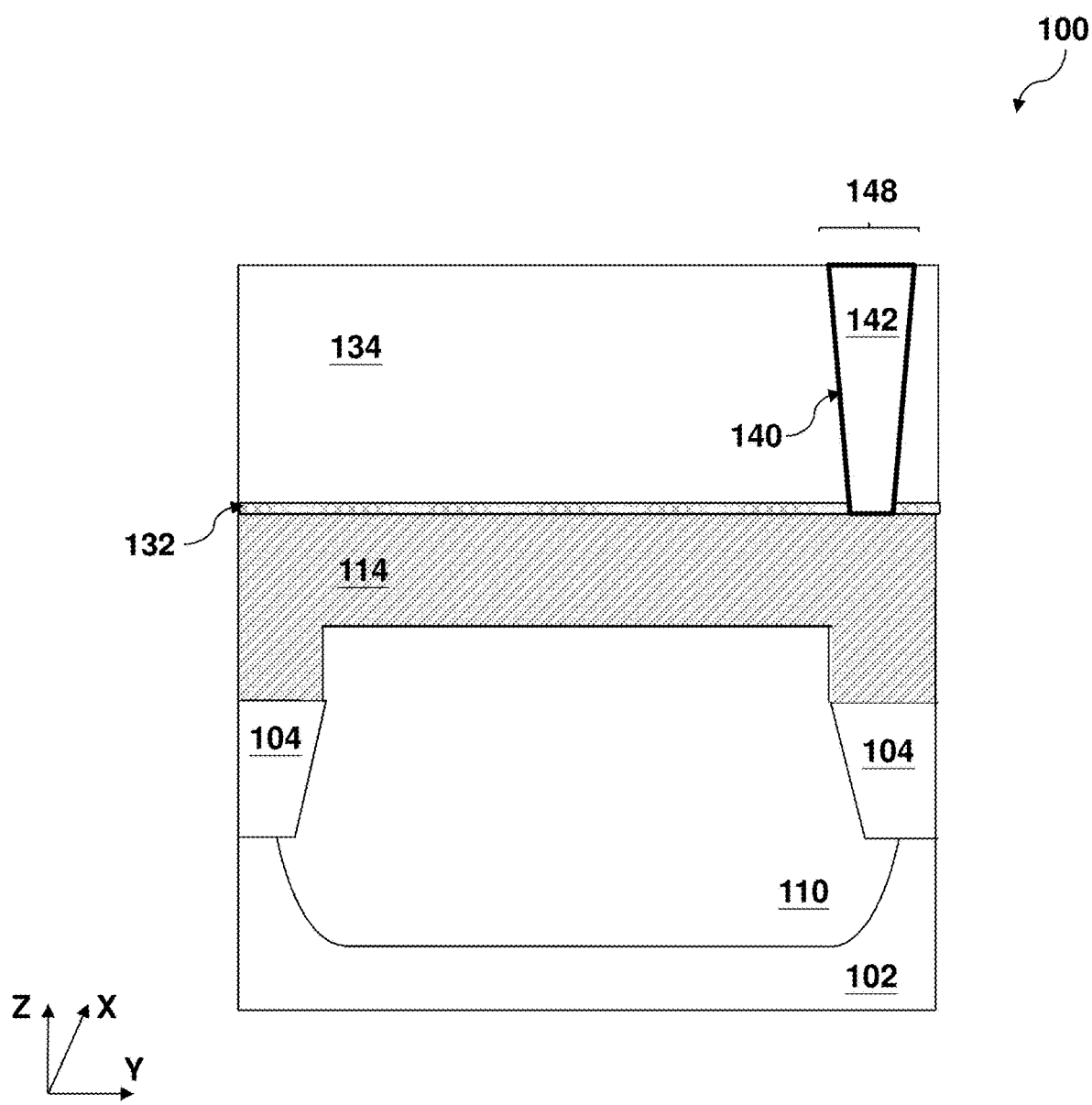

FIG. 1A is a top view of a semiconductor structure (or a work piece) 100 constructed according to various aspects of the present disclosure in one embodiment. FIG. 1B is a sectional view of the semiconductor structure 100 along the dashed lines AA' in accordance with some embodiments. FIG. 1C is a sectional view of the semiconductor structure 100 along the dashed lines BB' in accordance with some embodiments. The semiconductor structure 100 and the method making the same are collectively described with reference to FIGS. 1A through 1C and other figures. In some embodiments, the semiconductor structure 100 includes fin active regions and includes fin field-effect transistors (FinFETs) formed thereon. In some embodiments, the semiconductor structure 100 may include flat active regions and includes plain field-effect transistors (FETs) formed thereon. The semiconductor structure 100 includes a FET that may be an n-type FET (nFET) or a p-type FET (pFET). The semiconductor structure 100 further includes a capacitor electrically connected to the FET, such as to the source of the FET. As an example only for illustration but not limiting, the FET is an nFET. The FET and the capacitor are connected and collectively function as a memory device, such as a resistive random-access memory (RRAM) or a dynamic RAM (DRAM). In some other examples, the memory device is a one-time programming (OTP) memory (e.g., embedded OTP memory).

The semiconductor structure 100 includes a substrate 102. The substrate 102 includes a bulk silicon substrate. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

The substrate 102 also includes various isolation features, such as isolation features 104 formed on the substrate 102 and defining various active regions on the substrate 102, such as an active region 106. The isolation feature 104 utilizes isolation technology, such as shallow trench isolation (STI), to define and electrically isolate the various active regions. The isolation feature 104 includes silicon oxide, silicon nitride, silicon oxynitride, other suitable dielectric materials, or combinations thereof. The isolation feature 104 is formed by any suitable process. As one example, forming STI features includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multi-layer structure, such as a thermal oxide liner layer and filling layer(s) of silicon nitride or silicon oxide.

The active region 106 is a region with semiconductor surface wherein various doped features are formed and configured to one or more device, such as a diode, a transistor, and/or other suitable devices. The active region may include a semiconductor material similar to that (such as silicon) of the bulk semiconductor material of the substrate 102 or different semiconductor material, such as silicon germanium (SiGe), silicon carbide (SiC), or multiple semiconductor material layers (such as alternative silicon and silicon germanium layers) formed on the substrate 102 by epitaxial growth, for performance enhancement, such as strain effect to increase carrier mobility. In the present example, the active region 106 has an elongated shape oriented in the X direction.

In the present embodiment, the active region 106 is three-dimensional, such as a fin active region extruding above the isolation feature 104. The fin active region is extruded from the substrate 102 and has a three-dimensional profile for more effective coupling between the channel region (or simply referred to as channel) and the gate electrode of a FET. The fin active region 106 may be formed by selective etching to recess the isolation features 104, or selective epitaxial growth to grow active regions with a semiconductor same or different from that of the substrate 102, or a combination thereof. The fin active region 106 is also simply referred to a fin 106.

The semiconductor substrate 102 further includes various doped features, such as n-type doped wells, p-type doped wells, source and drain, other doped features, or a combination thereof configured to form various devices or components of the devices. In one embodiment, the semiconductor structure 100 includes a doped well 110 of a first-type dopant on the fin active region 106. The doped well 110 may extend to the regions underlying the isolation features 104 by diffusion. As noted above only for illustration, the FET formed on the fin 106 is an nFET. In this case, the doped well 110 is doped with a p-type dopant (therefore referred to as p-well). The dopant (such as boron) in the doped well 110 may be introduced to the fin 106 by ion implantation or other suitable technology. For example, the doped well 110 may be formed by a procedure that includes forming a patterned mask with an opening on the substrate 102 wherein the opening defines the region for the doped well 110; and performing an ion implantation to introduce a p-type dopant (such as boron) into the fin 106 using the patterned mask as an implantation mask. The patterned mask may be a patterned resist layer formed by lithography or a pattern hard mask formed by deposition, lithography process and etching. In an alternative embodiment, the FET on the fin 106 is a pFET and the doped well 110 may be doped with an n-type dopant, such as phosphorous.

The semiconductor structure 100 further includes a gate stack 114 disposed in the fin 106 and having an elongated shape oriented in the Y direction. The Y direction is orthogonal to the X direction, both X and Y directions defining the top surface of the substrate 102. The top surface has a normal direction along the Z direction, which is orthogonal to both X and Y directions. The gate stack 114 includes a gate dielectric layer 116 and a gate electrode 120 formed on the gate dielectric layer. The gate stack 114 may have a height ranging between 10 nm and 20 nm according to some examples.

The gate dielectric layer 116 includes a dielectric material, such as silicon oxide. In other embodiments, the gate dielectric layer alternatively or additionally includes other suitable dielectric materials for circuit performance and manufacturing integration. For example, the gate dielectric layer 116 includes a high k dielectric material layer, such as metal oxide, metal nitride or metal oxynitride. In various examples, the high k dielectric material layer includes metal oxide: ZrO2, Al2O3, and HfO2, formed by a suitable method, such as metal organic chemical vapor deposition (MOCVD), physical vapor deposition (PVD), atomic layer deposition (ALD), or molecular beam epitaxy (MBE). The gate dielectric layer may further include an interfacial layer interposed between the semiconductor substrate 102 and the high k dielectric material. In some embodiments, the interfacial layer includes silicon oxide formed by ALD, thermal oxidation or ultraviolet-Ozone Oxidation.

The gate electrode 120 includes metal, such as aluminum, copper, tungsten, metal silicide, metal alloy, doped polysilicon, other proper conductive material or a combination thereof. The gate electrode 120 may include multiple conductive films designed such as a capping layer, a work function metal layer, a blocking layer and a filling metal layer (such as aluminum or tungsten). The multiple conductive films are designed for work function matching to nFET (or pFET). In some embodiments, the gate electrode 120 for nFET includes a work function metal with a composition designed with a work function equal 4.2 eV or less. In other cases, the gate electrode for pFET includes a work function metal with a composition designed with a work function equal 5.2 eV or greater. For examples, the work function metal layer for nFET includes tantalum, titanium aluminum, titanium aluminum nitride or a combination thereof. In other examples, the work function metal layer for pFET includes titanium nitride, tantalum nitride or a combination thereof.

The gate stack 114 may further include gate spacer 122 formed on the sidewalls of the gate electrode 120. The spacer 122 includes silicon oxide, silicon nitride, silicon oxynitride, other suitable dielectric material or a combination thereof. The spacer 122 may have a multilayer structure and may be formed by depositing dielectric material and then anisotropic etching, such as plasma etching.

Figure 1D:
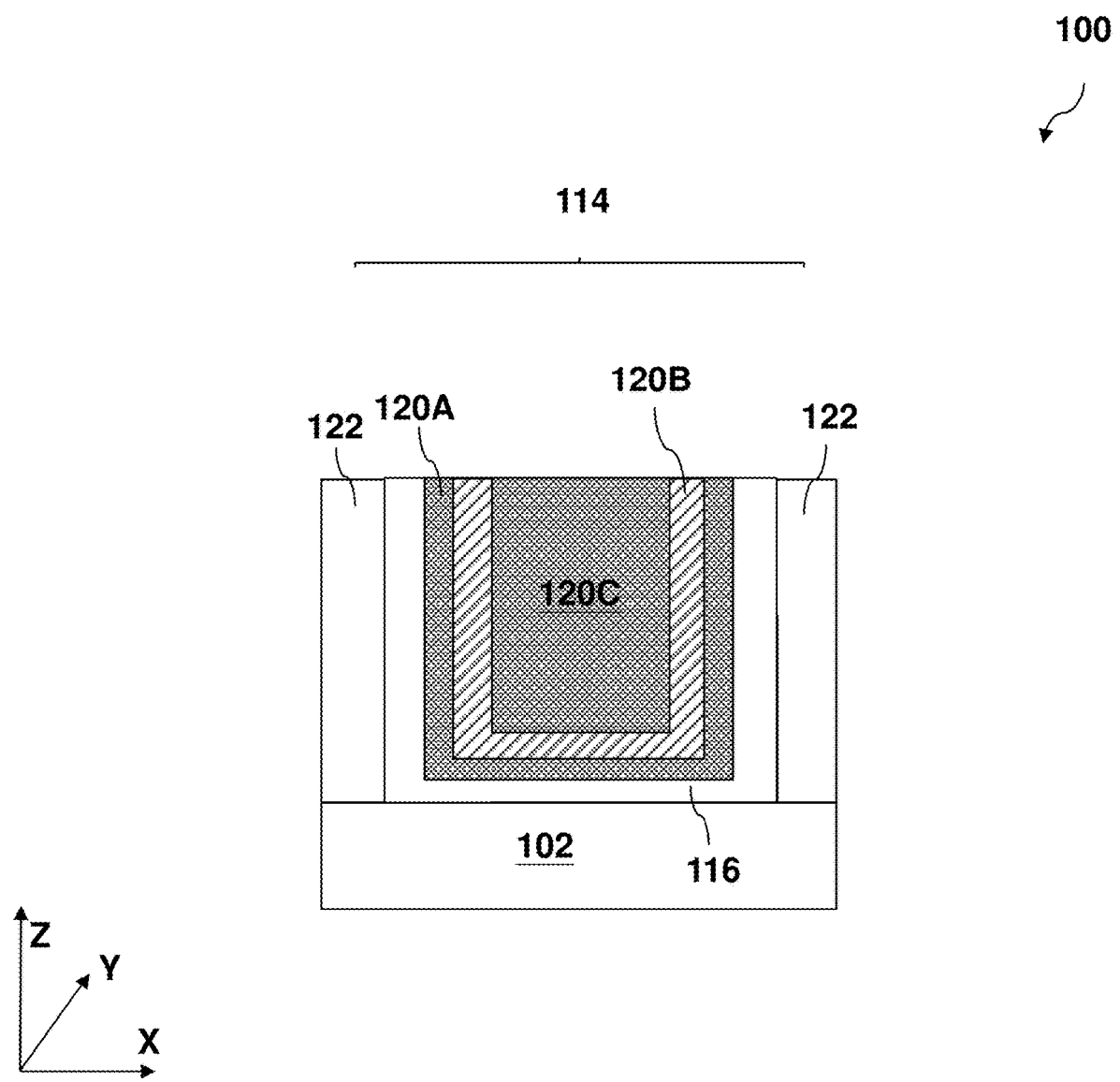
FIG. 1D is a sectional view of the gate stack of the semiconductor device structure in FIG. 1B constructed in accordance with some embodiments.

The gate stack 114 is formed by a proper procedure, such as a gate-last process, wherein a dummy gate is first formed, and then is replaced by a metal gate after the formation of the source and drain. Alternatively, the gate stack is formed by high-k-last process, wherein the both gate dielectric material layer and the gate electrode are replaced by high-k dielectric material and metal, respectively, after the formation of the source and drain. The gate stack 114 may have different structure due to gate materials and formation. One exemplary gate stack 114 is illustrated in FIG. 1D in a sectional view. The method making the same is further described in according to some embodiments. In the present embodiment, the gate stack 114 is a metal gate formed by a procedure: a dummy gate stack is formed on the fin; source and drain are formed; an ILD is deposited on the source and drain; then the dummy gate stack is removed, resulting in a gate trench; metal gate materials are deposited in the gate trench; and a CMP process is applied to remove the excessive gate materials. In the present embodiment illustrated in FIG. 1D, the gate stack 114 includes the gate dielectric layer 116 having a high-k dielectric material and being U-shaped. The gate electrode 120 includes multiple layers, such as 120A, 120B and 120C. In furtherance of the embodiments, the gate electrode layer 120A is a capping layer to prevent inter-diffusion and other integration consideration; the gate electrode layer 120B is a metal layer to tune work function (also referred to as a work-function metal layer); and the gate electrode layer 120C is a filling metal, such as tungsten, copper, aluminum, copper aluminum alloy, or other low resistivity metal.

The semiconductor structure 100 includes a channel region 124 defined on the fin 106 and underlying the gate stack 114. The channel 124 provides a current path between the source and the drain. The channel 124 has a same type of dopant to that of the doped well 110 (p-well in the present example) but with a greater doping concentration, depending on the application and device specification. The channel 124 may be tuned by ion implantation with a suitable dopant concentration for proper threshold voltage and other parameters.

The semiconductor structure 100 includes source/drain (S/D) features (or simply referred to as source and drain) formed on the fin 106 on opposite sides of the channel 124 (and the gate stack 114 as well). The S/D features are doped with a second-type dopant opposite to the first-type dopant. In this case, the S/D features doped with an n-type dopant (such as phosphorous). The S/D features may be formed by ion implantation and/or diffusion. Other processing steps may be further included to form the S/D features. For example, a rapid thermal annealing (RTA) process may be used to activate the implanted dopant. The S/D features may have different doping profiles formed by multi-step implantation. For example, additional doping features such as light doped drain (LDD) or double diffused drain (DDD) may be included. Also, the S/D features may have different structures, such as raised, recessed, or strained. For example, the formation of the S/D features may include: etching to recess the source and drain regions; selective epitaxial growth to form epitaxial S/D features with in-situ doping; and an annealing for activation. Thus formed S/D features are epitaxial S/D features with straining effect for enhanced carrier mobility and device performance. The S/D features may be formed by one or more selective epitaxial growth, whereby silicon (Si) features, silicon germanium (SiGe) features, silicon carbide (SiC) features, and/or other suitable semiconductor features are grown in a crystalline state on the fins within the source and drain regions. For the convenience of the following description, the S/D features are referred to as drain 126 and source 128, respectively.

The source, 128, the drain 126, the channel 124 and the gate stack 114 are configured to form a FET. In the present embodiment, the FET is an nFET, which is only for illustration not limiting. In alternative embodiment, the FET is a pFET.

The semiconductor structure 100 further includes an interlayer dielectric (ILD) layer 130 disposed on the substrate 102. The ILD layer 130 includes one or more dielectric material to provide isolation functions to various device components. The ILD layer 130 includes a dielectric material, such as silicon oxide, a low-k dielectric material, other suitable dielectric material, or a combination thereof. In some examples, the low-k dielectric material includes fluorinated silica glass (FSG), carbon doped silicon oxide, Xerogel, Aerogel, amorphous fluorinated carbon, Parylene, BCB (bis-benzocyclobutenes), polyimide, and/or other suitable dielectric materials with dielectric constant substantially less than that of the thermal silicon oxide. The formation of the ILD layer 130 includes deposition and CMP, for examples. The deposition may include spin-on coating, CVD, other suitable deposition technology or a combination thereof.

The semiconductor structure 100 also includes a capping layer 132 disposed on the gate stack 114 and the ILD layer 130. The capping layer 132 covers the gate stack 114 and provides protection to the gate stack 114, such as protecting from being oxidized or etch damaged during subsequent processes. The capping layer 132 may serve other functions, such as etch-stop. The capping layer 132 provides some advantages over the existing methods, such as deposition without etching to eliminate corresponding etching damage. The capping layer 132 includes a dielectric material, such as silicon oxide, silicon nitride, silicon oxynitride, other suitable dielectric material or a combination thereof. The capping layer 132 may be formed by any suitable deposition technology, such as CVD, or atomic layer deposition (ALD). In the present embodiment, the capping layer 132 is a planar layer with the bottom surface being coplanar with the top surface of the gate stack 114 and the ILD layer 130. In some examples, the capping layer 132 has a thickness ranging between 0.5 nm and 5 nm. In other examples, the capping layer 132 has a thickness ranging between 2 nm and 4 nm.

The semiconductor structure 100 further includes a second ILD layer 134 disposed on the capping layer 132. The second ILD layer 134 is similar to the ILD layer 130 in terms of composition and formation. For examples, the second ILD layer 134 may include low-k dielectric material and may be formed by deposition and CMP.

The semiconductor structure 100 further includes contact features, such as the first contact feature 136 and a second contact feature 138 to provide electrical connection. The first contact feature 136 and a second contact feature 138 include conductive material(s), such as metal or metal alloy, and are formed in the ILD layers (130 and 134). The first contact feature 136 is aligned with the drain 126 and is directly landing on the drain 126. The second contact feature 138 is aligned on the source 128 without direct contacting the source. Each of the first and second contact features includes a glue layer 140 and a filling metal 142. The glue layer 140 provides various functions, such as adhesion and inter-diffusion prevention. In the present embodiment, the glue layer 140 includes titanium and titanium nitride. The glue layer 140 may be deposited by physical vapor deposition (PVD), ALD, other suitable deposition or a combination thereof. The filling metal 142 includes tungsten, copper, aluminum, copper aluminum alloy, other suitable conductive material, or a combination thereof. The filling metal 142 is deposited by any suitable technology, such as CVD, PVD, plating, or a combination thereof.

The semiconductor structure 100 further includes another dielectric material layer 146 surrounding the first and second contact features. The dielectric material layer 146 includes a suitable dielectric material same or different from that of the capping layer 132. In some examples, the dielectric material layer 146 includes oxide, nitride, or carbide, such as silicon oxide, silicon nitride, silicon oxynitride, silicon carbide, other suitable dielectric material or a combination thereof. The dielectric material layer 146 may be deposited by CVD, ALD or other suitable technology. In some examples, the dielectric material layer 146 has a thickness ranging between 0.5 nm and 5 nm. In some examples, the dielectric material layer 146 has a thickness ranging between 1 nm and 2 nm. Particularly, the thickness T of the dielectric material layer 146 and the height H of the gate stack 114 has a ratio T/H ranging from 1/20 to 1/2 according to some examples.

Particularly, the dielectric material layer 146 extends between the source 128 and the second contact feature 138, and isolates the source 128 from the second contact feature 138. The extended portion of the dielectric material layer 146 interposed between the source 128 and the second contact feature 138 functions as a capacitor sandwiched between the source 128 and the second contact feature 138. In some embodiments, the source 128, the second contact feature 138, and the extended portion of the dielectric material layer 146 functions as a capacitor, wherein the second contact feature 138 and the source 128 function as two electrodes of the capacitor. The FET and the capacitor form a memory device, such as a RRAM or DRAM, or an eOTP.

The formation of the contact features includes patterning the ILD layers to form contact holes; depositing the dielectric material layer 146 in the contact holes; selectively removing the portion of the dielectric material layer 146 from the bottom surface of the contact hole aligned to the drain; depositing the glue layer 140; depositing the filling metal 142 on the glue layer in the contact holes; and performing a CMP process to remove excessive the filling metal 142 and the glue layer 140 on the ILD layers. The selective removal of the portion of the dielectric material layer 146 on the bottom surface of the contact hole corresponding to the drain 126 may further include: forming a patterned mask to cover the contact hole to the source 128 and uncover the contact hole to the drain 126; performing an anisotropic etching process (such as a dry etching process) to selective remove the bottom portion within the contact hole aligned to the drain; and removing the patterned mask layer. In one example, the dielectric material layer 146 is deposited by ALD with precise controlling to the corresponding thickness.

The semiconductor structure 100 further includes a third contact feature 148 aligned with the gate stack 114 and directly landing on the gate stack 114, such as landing on an extending portion of the gate stack 114 on the isolation feature 104, as illustrated in FIGS. 1A and 1C. The third contact feature 148 may be formed by a similar procedure but independent from the procedure to form the first and second contact features.

The semiconductor structure 100 may include other features, such as an interconnection structure that further includes metal lines from multiple metal layers to provide horizontal electrical connections; and vias to provide vertical connections between metal lines in adjacent metal layers.

By implementing the disclosed method and structure, the resistor (or capacitor) is formed by deposition, and the resistance (or capacitance) is determined by the thickness of the dielectric material layer 146. The resistance can be more precisely controlled since the thickness can be precisely controlled by deposition. Furthermore, the process is easy to be implemented and is more compatible with advanced technology nodes, such as 7 nm technology node.

Figures 2A, 2B:
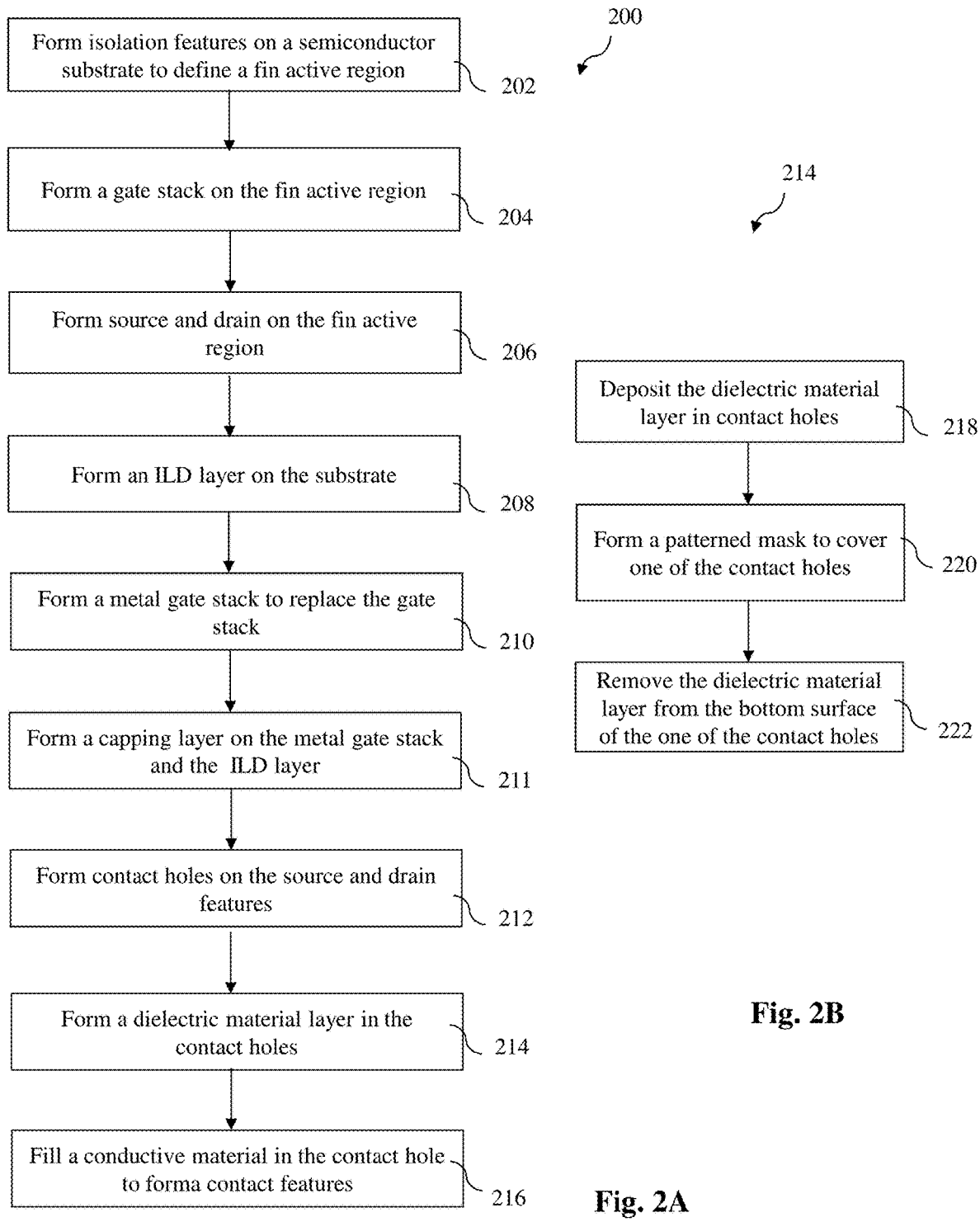
FIG. 2A is a flowchart of a method to form an integrated circuit (IC) structure in accordance with some embodiments.
FIG. 2B is a flowchart of the operation in the method of FIG. 2A in accordance with some embodiments.

FIG. 2A is a flowchart of the method 200 for making a semiconductor structure, such as the semiconductor structure 100. The method 200 and the semiconductor structure are collectively described with reference to FIG. 2A and other figures. However, the semiconductor structure 100 is only one structure made by the method 200 according to some embodiments and it is not limiting. As to be seen in following descriptions, other semiconductor structures can also be made by the method 200. Since some descriptions are provided with FIGS. 1A-1D, those languages will not be repeated below.

Figure 3A:
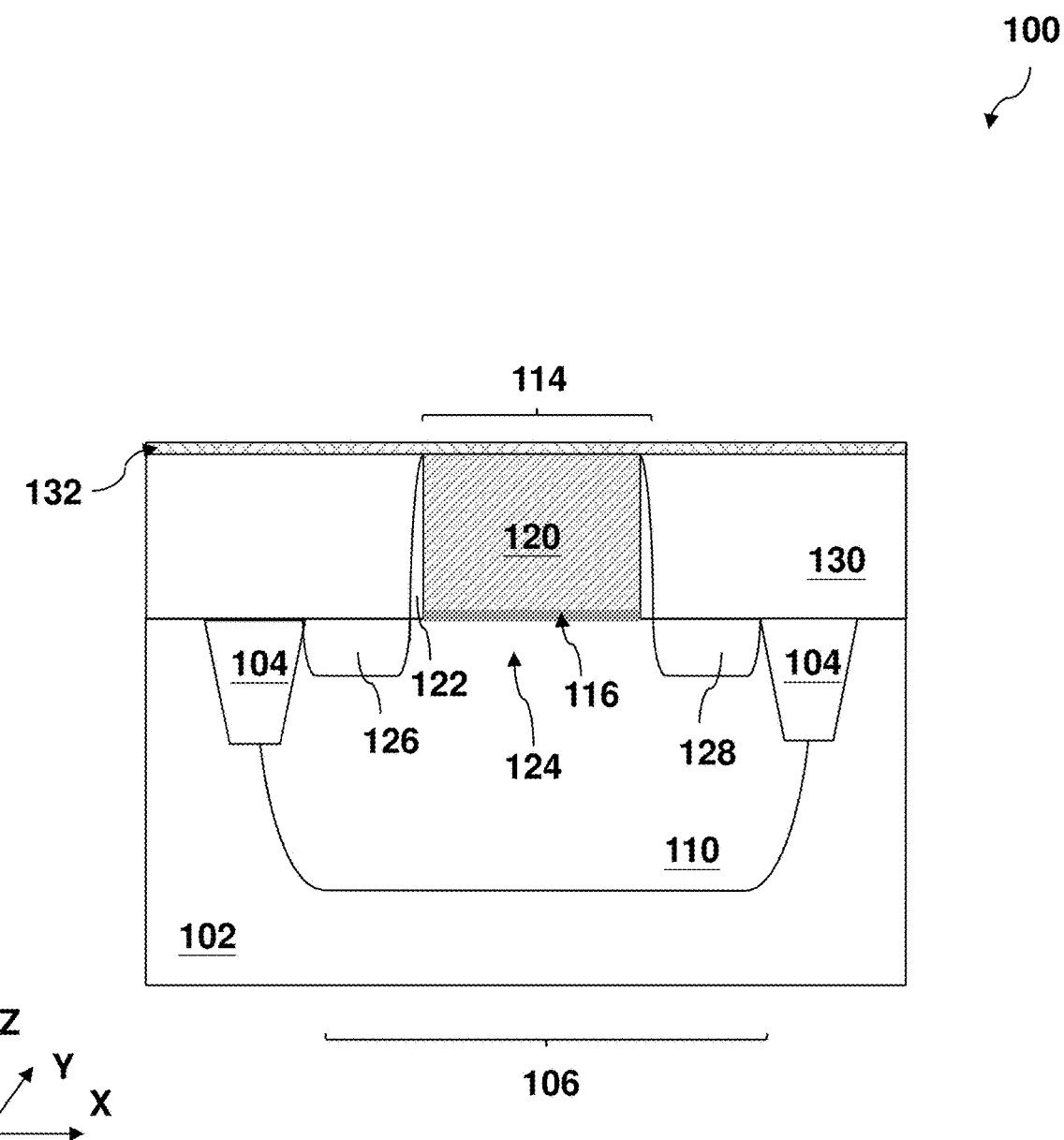
FIGS. 3A and 3B illustrate sectional views of an exemplary integrated circuit structure at a fabrication stage, made by the method of FIG. 2A, according to various embodiments.

Referring to block 202 of FIG. 2A and FIG. 3A, the method 200 includes an operation to form isolation features 104 in the semiconductor substrate 102, thereby defining one or more active region 106. The formation of the isolation features may include forming a patterned mask by lithography; etching the substrate 102 through the openings of the patterned mask to form trenches; filling the trench with one or more dielectric material; and performing a CMP process. The patterned mask includes openings to define the regions for the isolation features 104. The patterned mask may be a soft mask (such as a photoresist layer), or a hard mask (such as silicon oxide, silicon nitride or a combination thereof). A patterned photoresist layer is formed by lithography process that further includes spin-on coating, exposure, developing, and one or more baking steps. The formation of the patterned hard mask may include depositing a hard mask layer; forming a patterned resist layer by a lithography process; etching the hard mask through the openings of the patterned resist layer; and removing the patterned resist layer by wet stripping or plasma ashing.

Figure 3B:
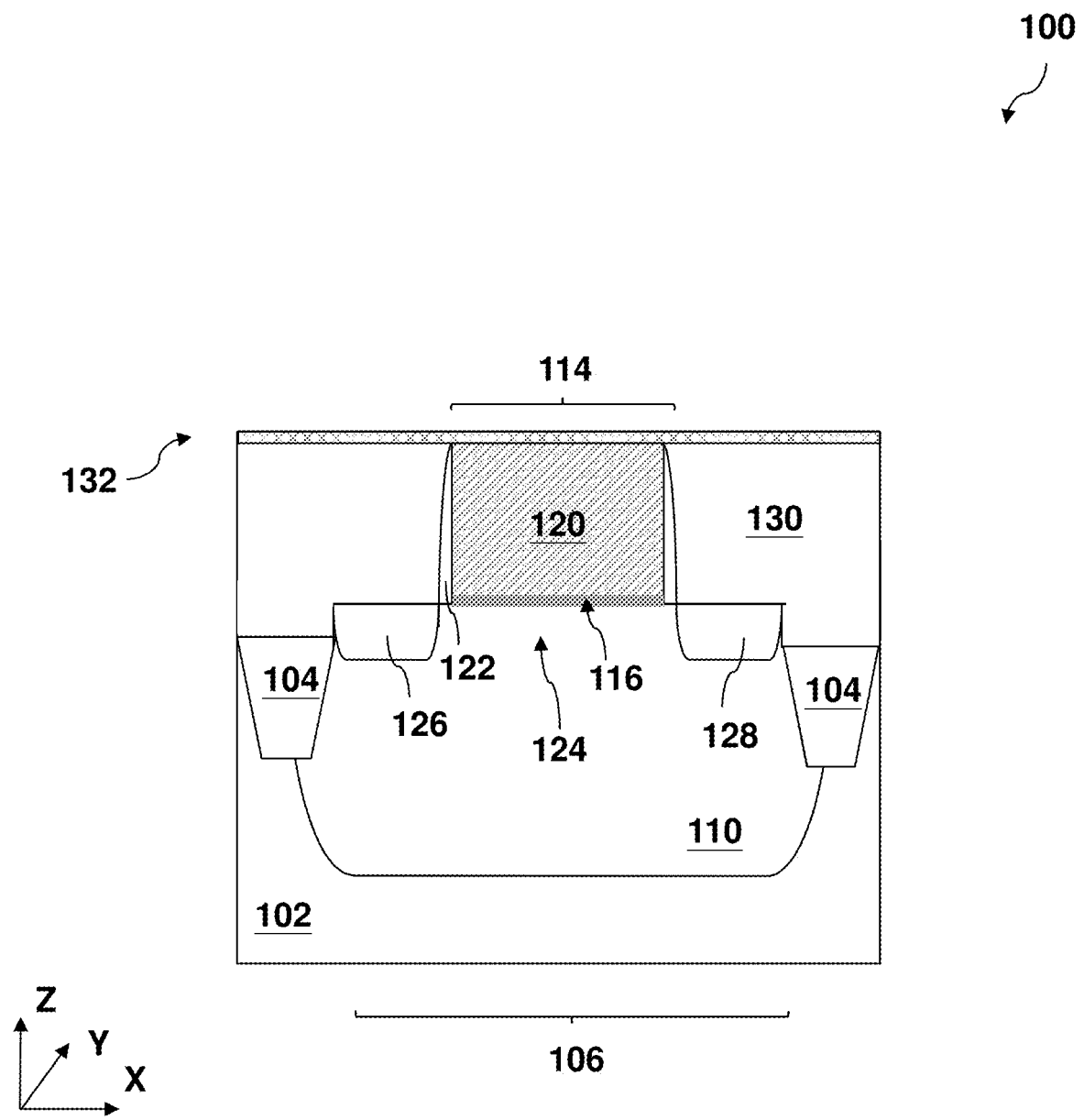

In alternative embodiments, the active region 106 is a fin active region with three-dimensional profile. In this case, the operation 202 further includes forming a fin active region 106 extruded above the isolation feature 104, as illustrated in FIG. 3B. The semiconductor structure 100 may include multiple fin active regions, being collectively referred to as a fin structure. In some embodiments, the fin structure may be formed by selective etching to recess the isolation feature 104. In some embodiments, the fin structure may be formed by selective epitaxial growth to the active regions with one or more semiconductor material. In yet some embodiments, the fin structure may be formed by a hybrid procedure having both selective etching to recess and selective epitaxial growth. The fin structure may have elongated shape oriented along the X direction. The epitaxial grown semiconductor material may include silicon, germanium, silicon germanium, silicon carbide or other suitable semiconductor materials. The selective etching process may include wet etching, dry etching, other suitable etching or a combination thereof. In the following figures, the semiconductor structure 100 shows a planar active region 106 but it is understood that the active region 106 can be a fin active region.

The method 200 may include an operation to form doped wells, such as a doped well 110 on the fin 106, as illustrated in FIG. 3A (and FIG. 3B). In the present embodiment, the doped well 110 is a p-type doped well (p-well) where p-type dopant (such as boron) is introduced into the fin 106 by a suitable technology, such as ion implantation.

Referring to block 204 of FIG. 2A and FIG. 3A, the method 200 proceeds to an operation to form the gate stack 114 on the fin 106. The formation of the gate stack 114 includes deposition and patterning, such as depositing a gate dielectric layer, depositing gate electrode material(s), and patterning the deposited gate materials to form the gate stack. In some embodiments, the operation 204 forms a dummy gate stack including polysilicon, and the dummy gate stack is replaced by a metal gate stack after the formation of the source and drain. For example, the dummy gate stack is formed by depositions and patterning process, wherein the patterning process further includes lithography process and etching. In one embodiment, the procedure to form the dummy gate stack includes: forming a thermal oxide layer on the fins by thermal oxidation; depositing a poly-silicon layer by CVD; forming a patterned mask layer by photolithography process; and performing an etching process to the deposited dummy gate materials. The patterned mask layer includes an opening to define the region for the dummy gate stack. The patterned mask layer may be a soft mask (such as a photoresist layer), or a hard mask (such as silicon oxide, silicon nitride or a combination thereof) formed with a similar process to form the hard mask for the isolation features 104 during the operation 202. The operation 204 also includes forming gate spacer 122 on sidewalls of the gate stack. The gate spacer 122 includes one or more dielectric material, such as silicon oxide, silicon nitride, or a combination thereof. The formation of the gate spacer 122 may include depositing one or more dielectric material layer on the dummy gate stack; and performing an anisotropic etching process to the dielectric material layer. In some examples, the anisotropic etching process includes dry etching using a suitable etchant, such as fluorine-containing gas or chlorine-containing gas.

Referring to block 206 of FIG. 2A and FIG. 3A, the method 200 includes an operation to form the source 128 and the drain 126 on the fin 106. The source and drain are interposed by the channel 124 underlying the gate stack. In the present embodiment, the source and drain are doped with an n-type dopant, such as phosphorous. The channel 124 is doped with a p-type dopant, such as boron. The source and drain may be formed by multiple steps.

In some embodiments, the source and drain are epitaxial source and drain. The epitaxial source and drain may be formed by selective epitaxial growth for straining effect with enhanced carrier mobility and device performance. The source and drain are formed by one or more epitaxial growth steps, whereby silicon (Si) features, silicon germanium (SiGe) features, silicon carbide (SiC) features, and/or other suitable semiconductor features are grown in a crystalline state on the fin within the source and drain regions (such as defined by a patterned hard mask). In an alternative embodiment, an etching process is applied to recess portions of the active region 106 within the source and drain regions before the epitaxy growth. The etching process may also remove any dielectric material disposed on the source/drain regions, such as during the formation of the gate sidewall features. Suitable epitaxy growth process includes CVD deposition technologies (e.g., vapor-phase epitaxy (VPE) and/or ultra-high vacuum CVD (UHV-CVD), molecular beam epitaxy, and/or other suitable processes. The source and drain may be in-situ doped during the epitaxy process by including dopant-containing gas in the epitaxial precursor, such as phosphorus or arsenic-containing gas (or alternatively p-type dopant-containing gas, (e.g., boron or $BF_2$-containing gas) if the FET is a pFET). If the source and drain are not in-situ doped, an implantation process may be performed to introduce the corresponding dopant into the source and drain. In some other embodiments, the raised source and drain are formed by epitaxial growth with more than one semiconductor material layers. In some examples, a silicon layer or a silicon carbide is epitaxially grown on the fin 106 to form the source and drain of an nFET, or alternatively a silicon germanium layer is epitaxially grown on the fin 106 to form the source and drain of a pFET.

Referring to block 208 of FIG. 2A and FIG. 3A, the method 200 includes an operation to form an inter-layer dielectric (ILD) layer 130 on the semiconductor structure 100. The ILD layer 130 includes one or more dielectric material to provide isolation functions to various device components. The ILD layer 130 includes a dielectric material, such as silicon oxide, a low-k dielectric material, other suitable dielectric material, or a combination thereof. In some examples, the low-k dielectric material includes fluorinated silica glass (FSG), carbon doped silicon oxide, Xerogel, Aerogel, amorphous fluorinated carbon, Parylene, BCB (bis-benzocyclobutenes), polyimide, and/or other suitable dielectric materials with dielectric constant less than that of the thermal silicon oxide. The formation of the ILD layer 130 includes deposition and CMP, for examples. The deposition may include spin-on coating, CVD, other suitable deposition technology or a combination thereof.

In the present embodiment, the operation 204 forms the dummy gate stack and is replaced by a metal gate stack after the operation 208. Referring to block 210 of FIG. 2A and FIG. 3A, the method 200 includes an operation to form the metal gate stack 114 to replace the dummy gate stack. The formation of the metal gate stacks includes etching, deposition and CMP. The metal gate stack 114 includes the gate dielectric layer 116 and the gate electrode 120 with a structure illustrated in FIG. 1D, according to some examples.

Figure 4:
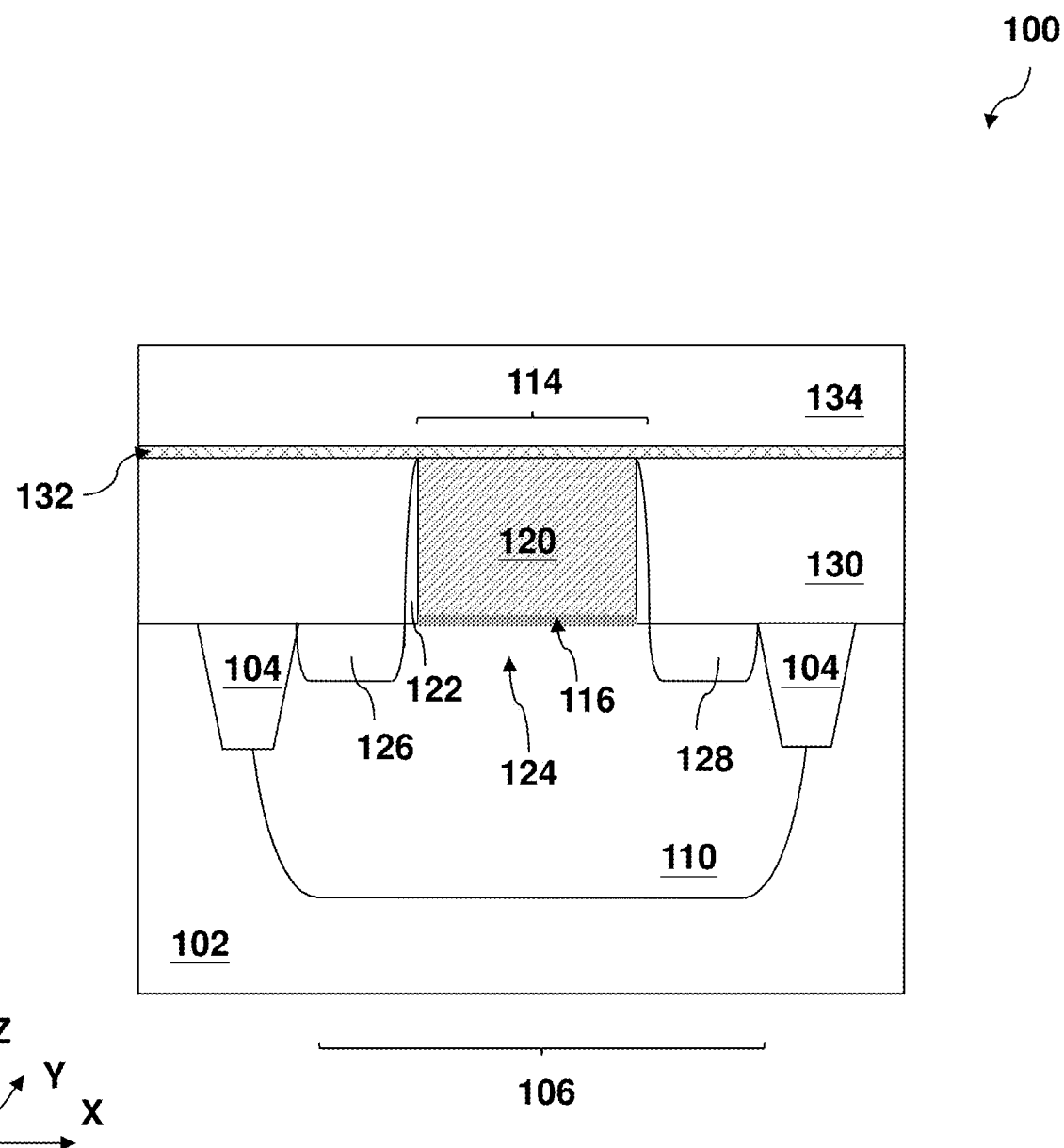
FIGS. 4, 5, 6, 7, and 8 illustrate sectional views of an exemplary integrated circuit structure during various fabrication stages, made by the method of FIG. 2A, constructed in accordance with some embodiments.

Referring to block 211 of FIG. 2A and FIG. 4, the method 200 may include an operation to form a capping layer 132 on the gate stack 114 and the ILD layer 130. The capping layer 132 includes a suitable dielectric material, such as silicon oxide, silicon nitride or silicon oxynitride. The capping layer 132 may be formed by a suitable deposition technology, such as CVD, or ALD. In the present embodiment, the capping layer 132 is a planar layer with the bottom surface being coplanar with the top surface of the gate stack 114 and the ILD layer 130. In some examples, the capping layer 132 has a thickness ranging between 0.5 nm and 5 nm. In other examples, the capping layer 132 has a thickness ranging between 2 nm and 4 nm.

Referring to FIG. 4, the method 200 may include an operation to form another ILD layer 134 on the capping layer 132. The ILD layer 134 is similar to the ILD layer 130 in terms of composition and formation.

Figure 5:
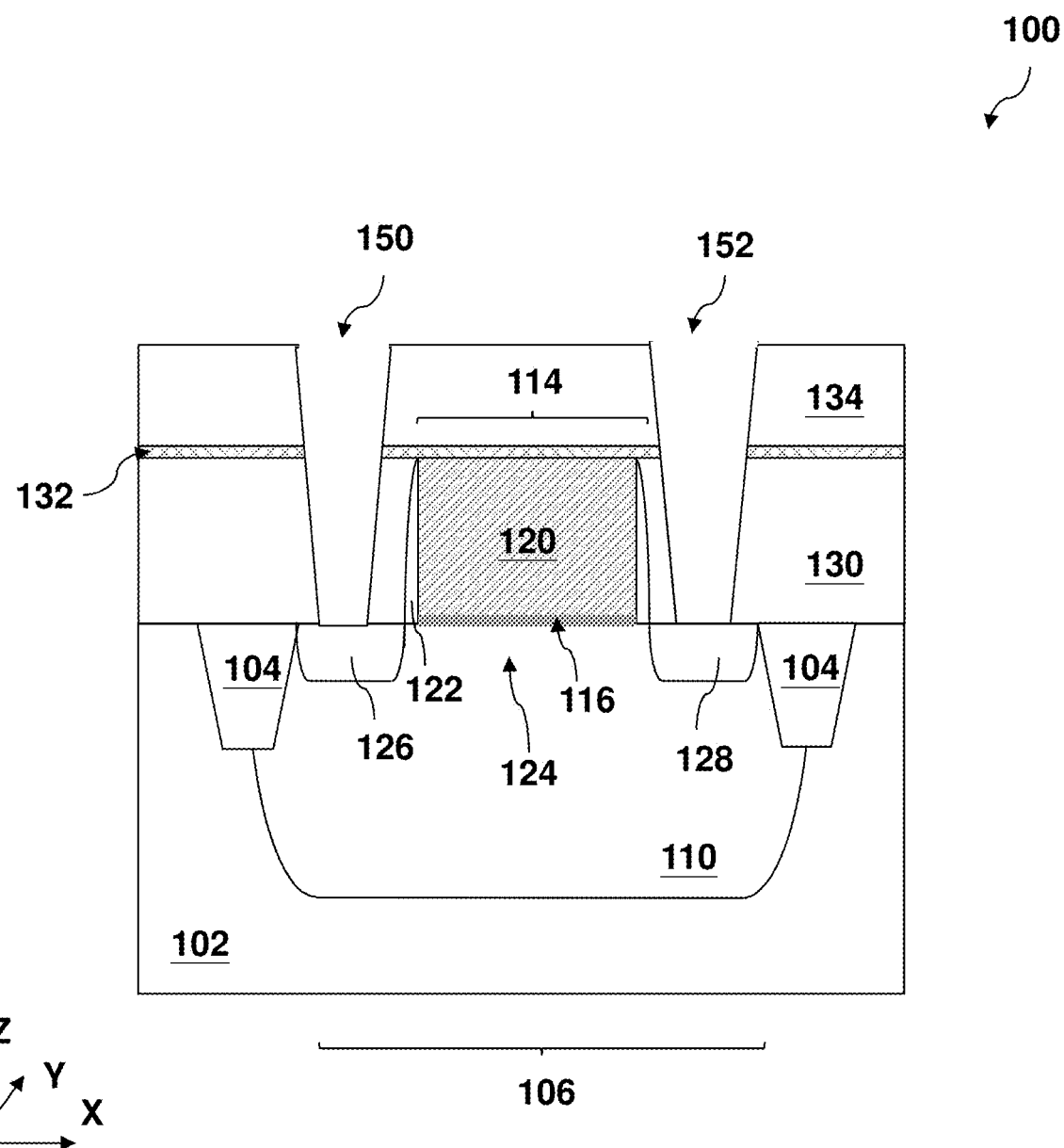

Referring to block 212 of FIG. 2A and FIG. 5, the method 200 includes an operation to form contact holes 150 and 152 in the ILD layers, particularly, in the ILD layer 130, the capping layer 132 and the ILD layer 134. The contact holes 150 and 152 are aligned with and expose the drain 126 and the source 128, respectively. The formation of the contact holes includes forming a patterned mask using lithography process; and etching through the openings of the patterned mask. The etching may include one or more etching steps with suitable etchants to etch respective material layers. In the present embodiment, the etching process may include dry etch, wet etch, or a combination thereof. The patterned mask can be a soft mask (such as photoresist) or a hard mask (such as a dielectric material layer with enough etching selectivity).

The method 200 proceeds to an operation 214 to form a dielectric material layer 146 in the contact holes. In the present embodiment, the dielectric material layer 146 is formed on sidewalls and bottom surface of the contact hole 152 for the source 128 but only formed on the sidewalls of the contact hole 150 of the drain 126, in which the bottom surface of the contact hole 150 is free of the dielectric material layer 146. The operation 214 is further described with reference to FIG. 2B as a flowchart of the operation 214 that includes multiple sub-operations.

Figure 6:
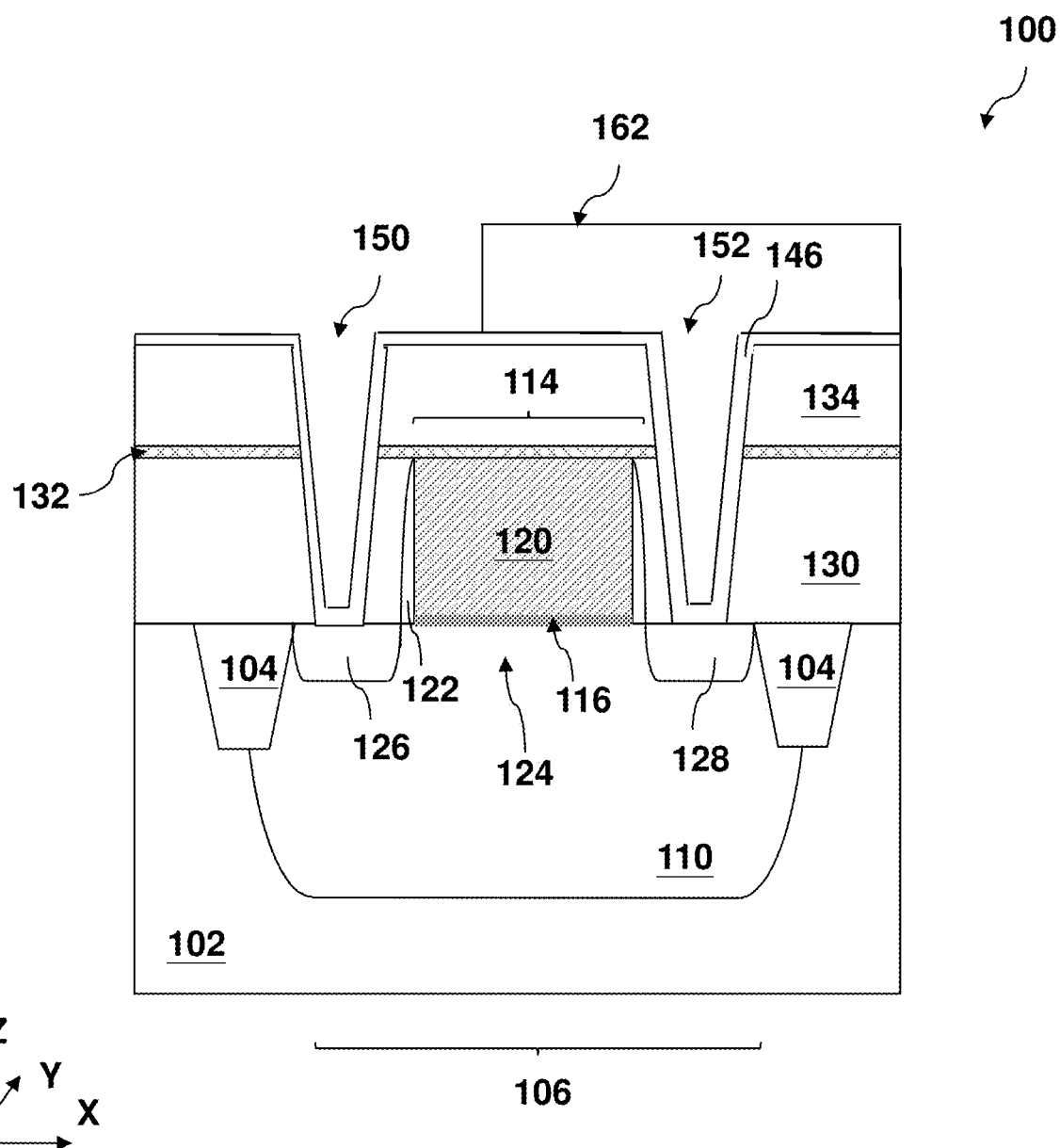

Referring to block 218 of FIG. 2B and FIG. 6, the method 214 includes an operation to deposit the dielectric material layer 146 in the contact holes and on the ILD layer 134 by a suitable deposition technology, such as ALD or CVD. The dielectric material layer 146 includes a suitable dielectric material, such as silicon oxide, silicon nitride, silicon oxynitride, silicon carbide, or a combination thereof. The deposition is controlled to have a proper thickness. The dielectric material layer 146 is formed on sidewalls and bottom surfaces of the contact holes 150 and 152. In some examples, the dielectric material layer 146 has a thickness ranging between 0.5 nm and 5 nm. In some examples, the dielectric material layer 146 has a thickness ranging between 1 nm and 2 nm.

Referring to block 220 of FIG. 2B and FIG. 6, the method 214 includes an operation to form a patterned mask (soft mask or hard mask) 162 to cover the second contact hole 152 and uncover the first contact hole 150.

Figure 7:
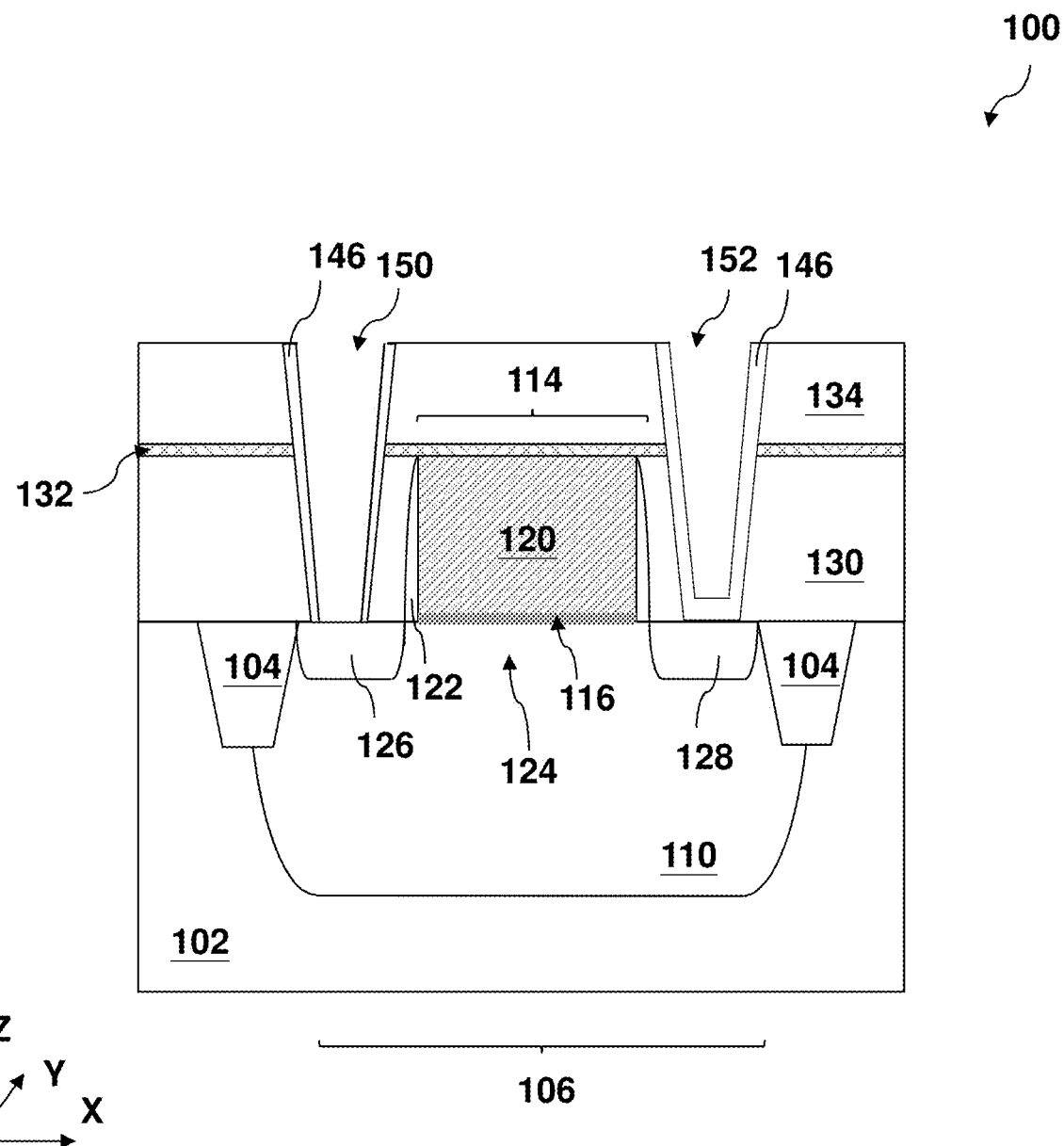

Referring to block 222 of FIG. 2B and FIG. 7, the method 214 includes an operation to perform an anisotropic etching process, such as dry etching, to remove the bottom portion of the dielectric material layer 146 in the first contact hole 150 using the patterned mask 162 as an etching mask. The etching process may also remove the portions of the dielectric material layer 146 on the ILD layer 134. The patterned mask 162 may be removed after the anisotropic etching process.

Figure 8:
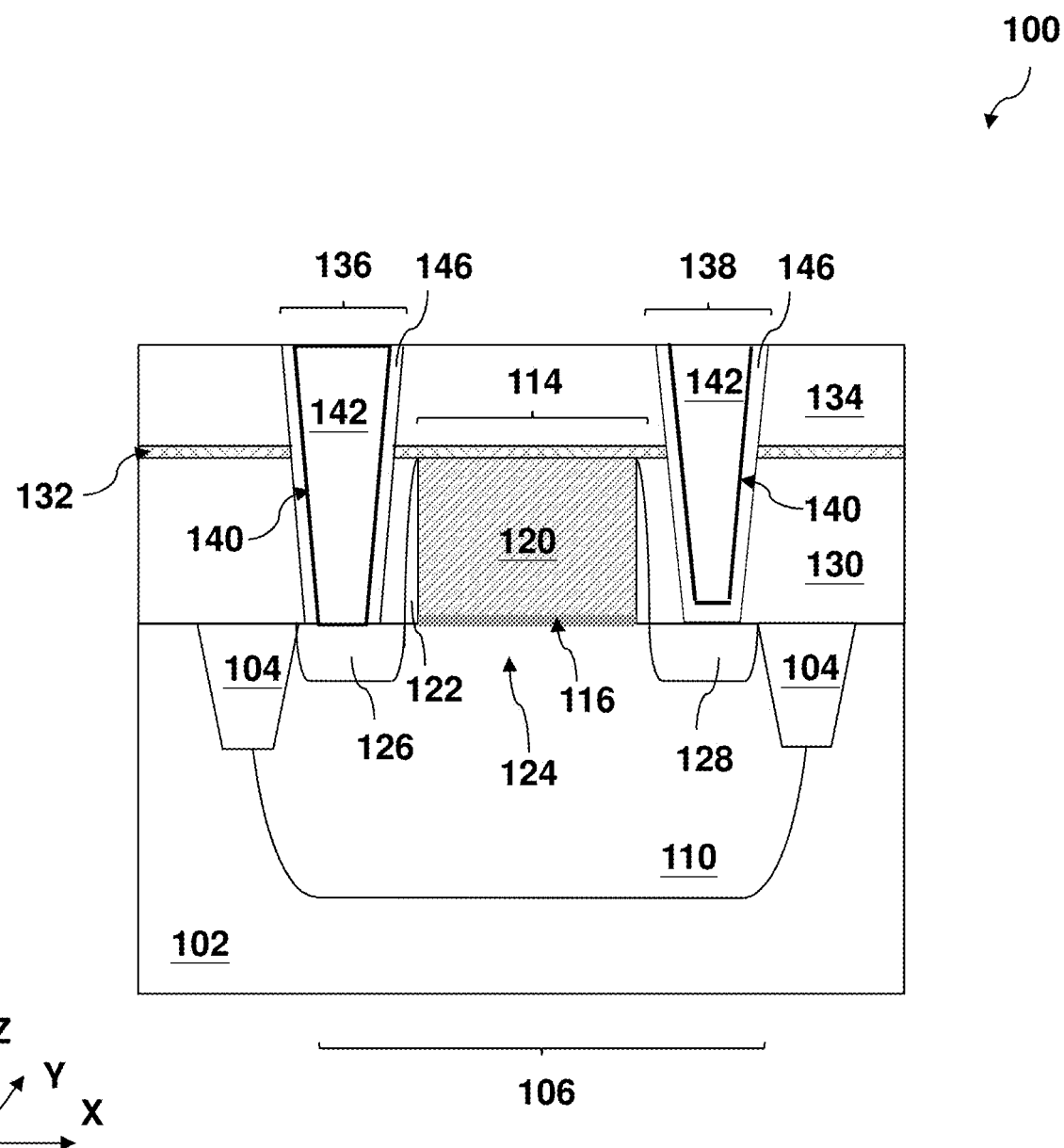

Referring back to block 216 of FIG. 2A and FIG. 8, the method 200 includes an operation to form contact features 136 and 138 in the contact holes 150 and 152, respectively. The formation of the contact features includes depositing a glue layer 140 in the contact holes by ALD, PVD or a combination thereof; depositing the conductive material 142 to fill the contact holes by PVD, plating, ALD, or a combination thereof; and performing a CMP process to remove the conductive material on the ILD layer 134. The glue layer 140 includes a titanium film and a titanium nitride film in the present examples. The conductive material 142 includes tungsten, copper, aluminum, aluminum copper alloy, or a combination thereof, according to some examples.

The contact feature 148 to the gate stack 114 is also formed in a separate process. For example, the formation of the contact feature 148 includes: forming a patterned mask with an opening to the gate stack 114; etching the ILD to form a contact hole aligned to the gate stack; depositing a glue layer; depositing the conductive material to fill the contact hole; and performing a CMP process.

Figure 9A:
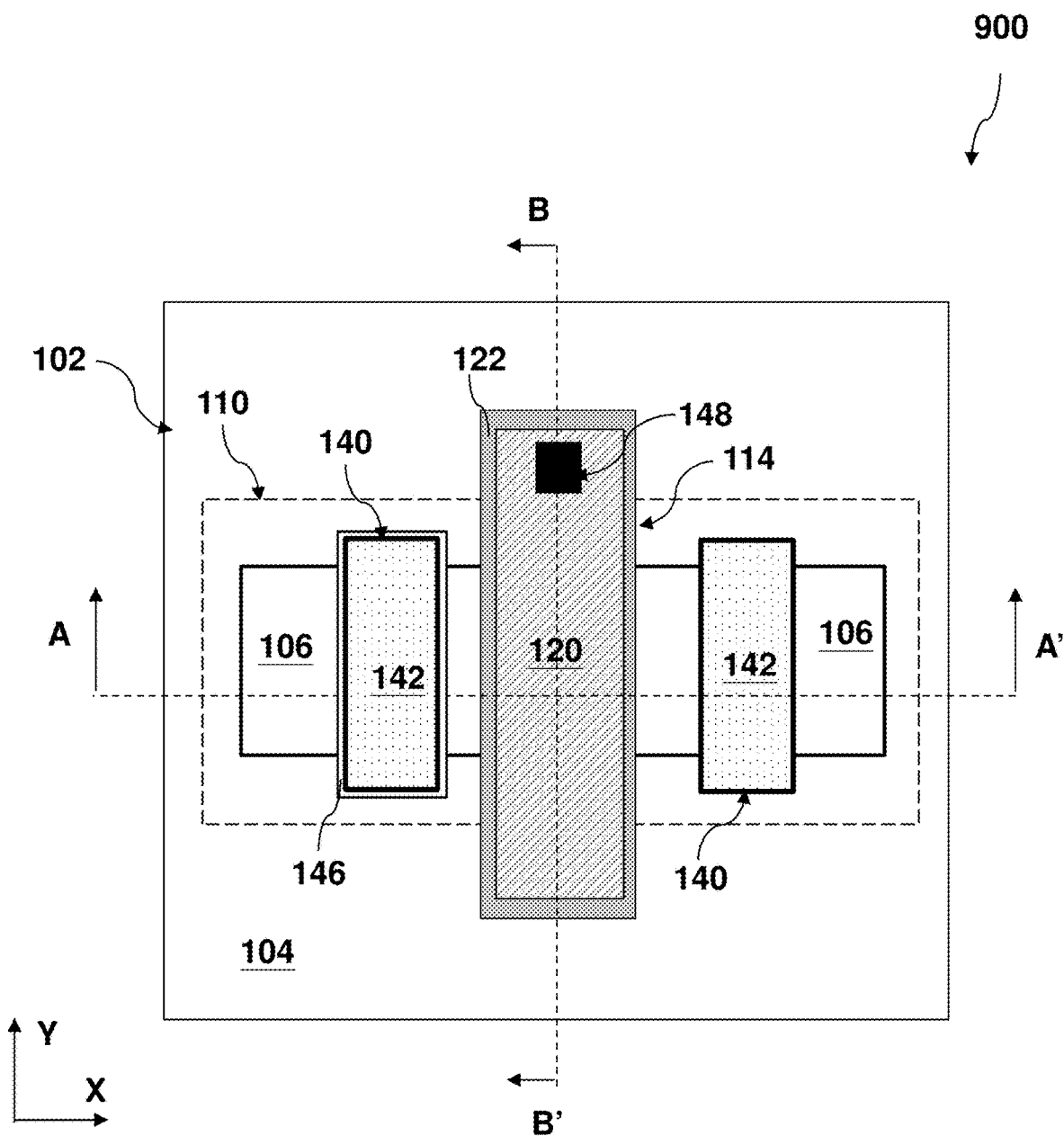
FIG. 9A is a top view of a semiconductor device structure constructed according to various aspects of the present disclosure in one embodiment.
Figure 9B:
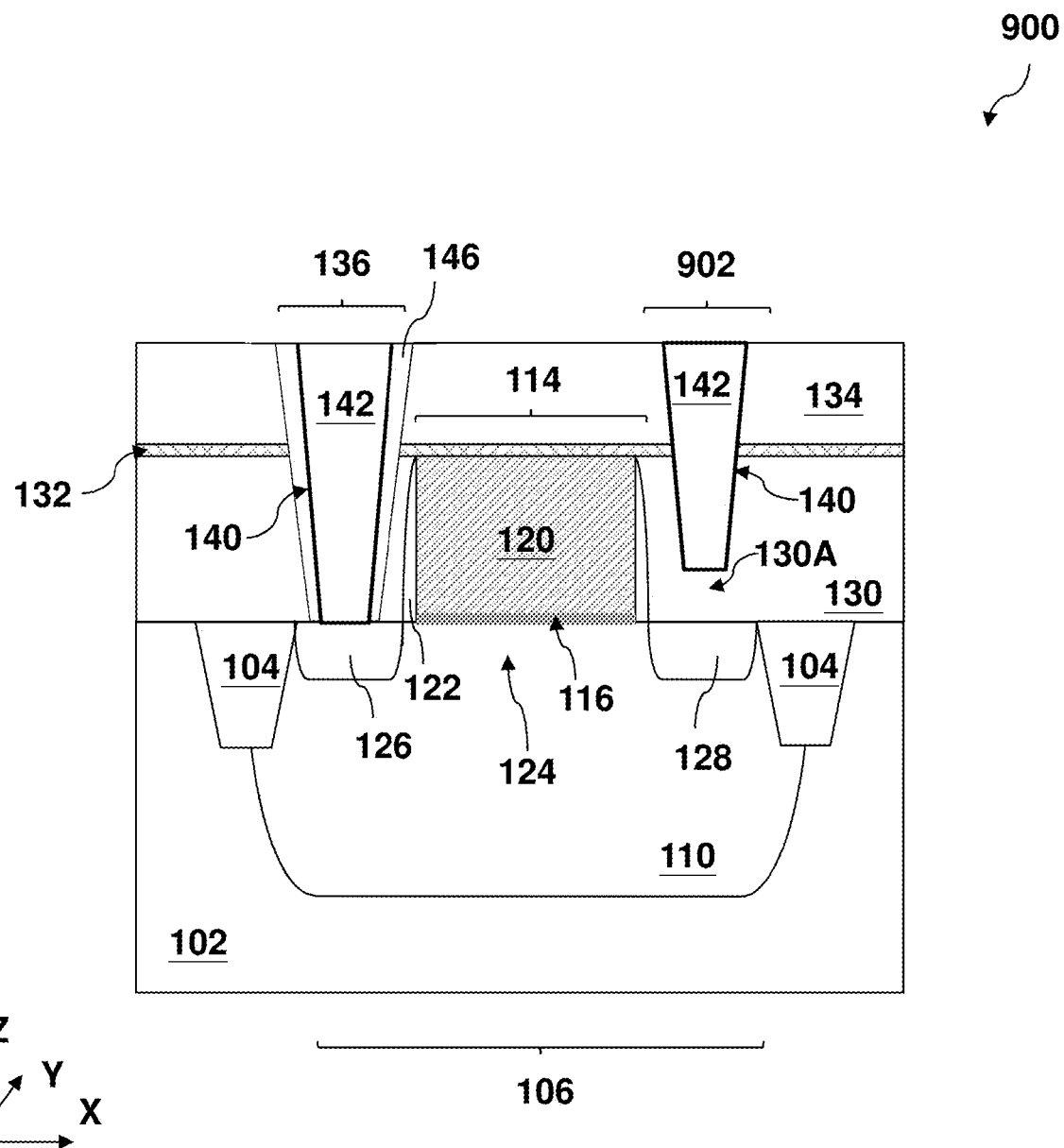
FIGS. 9B and 9C are sectional views of the semiconductor structure of FIG. 9A along the dashed lines AA' and BB' respectively, in accordance with some embodiments.
Figure 9C:
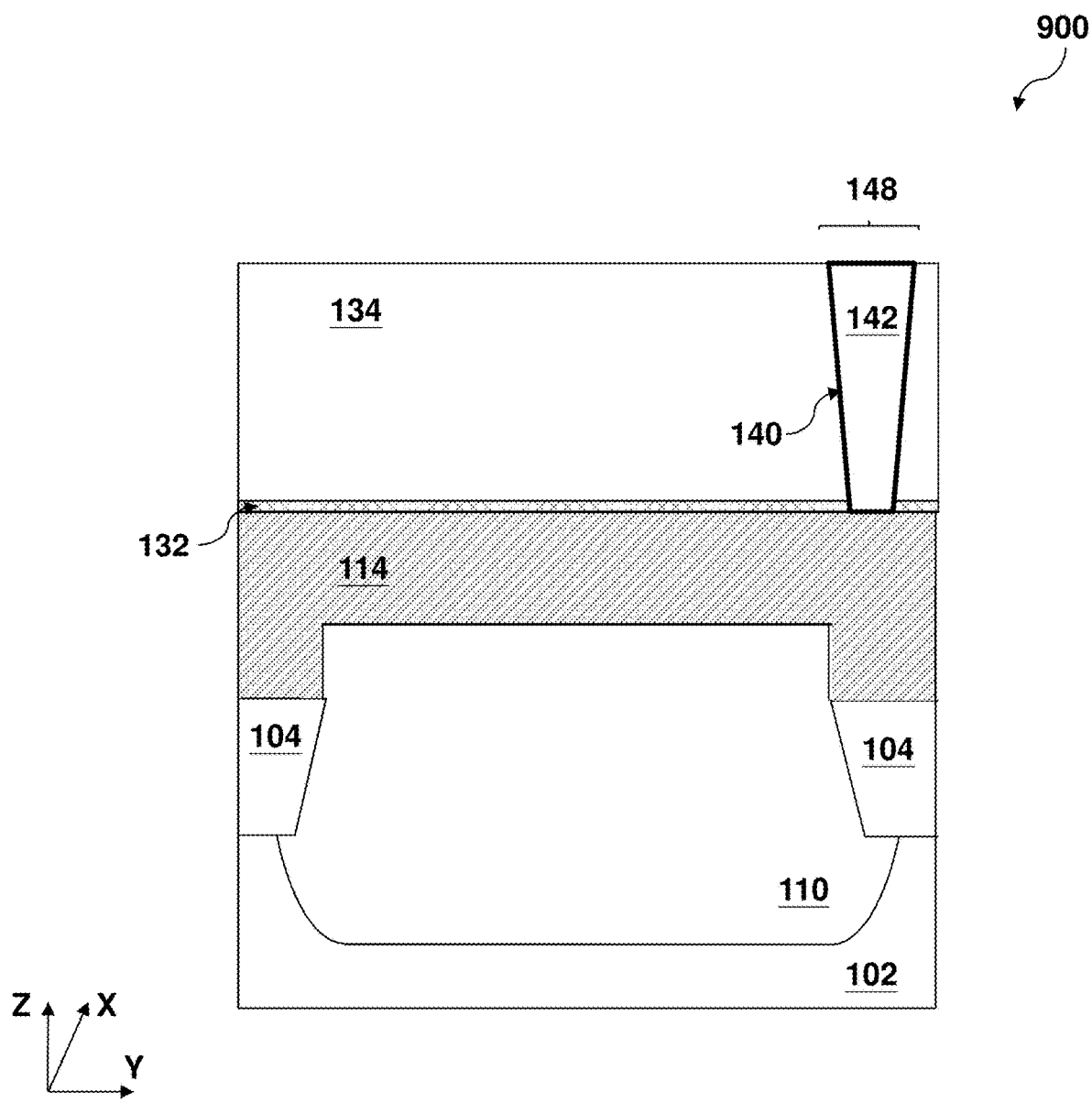
Figure 11:
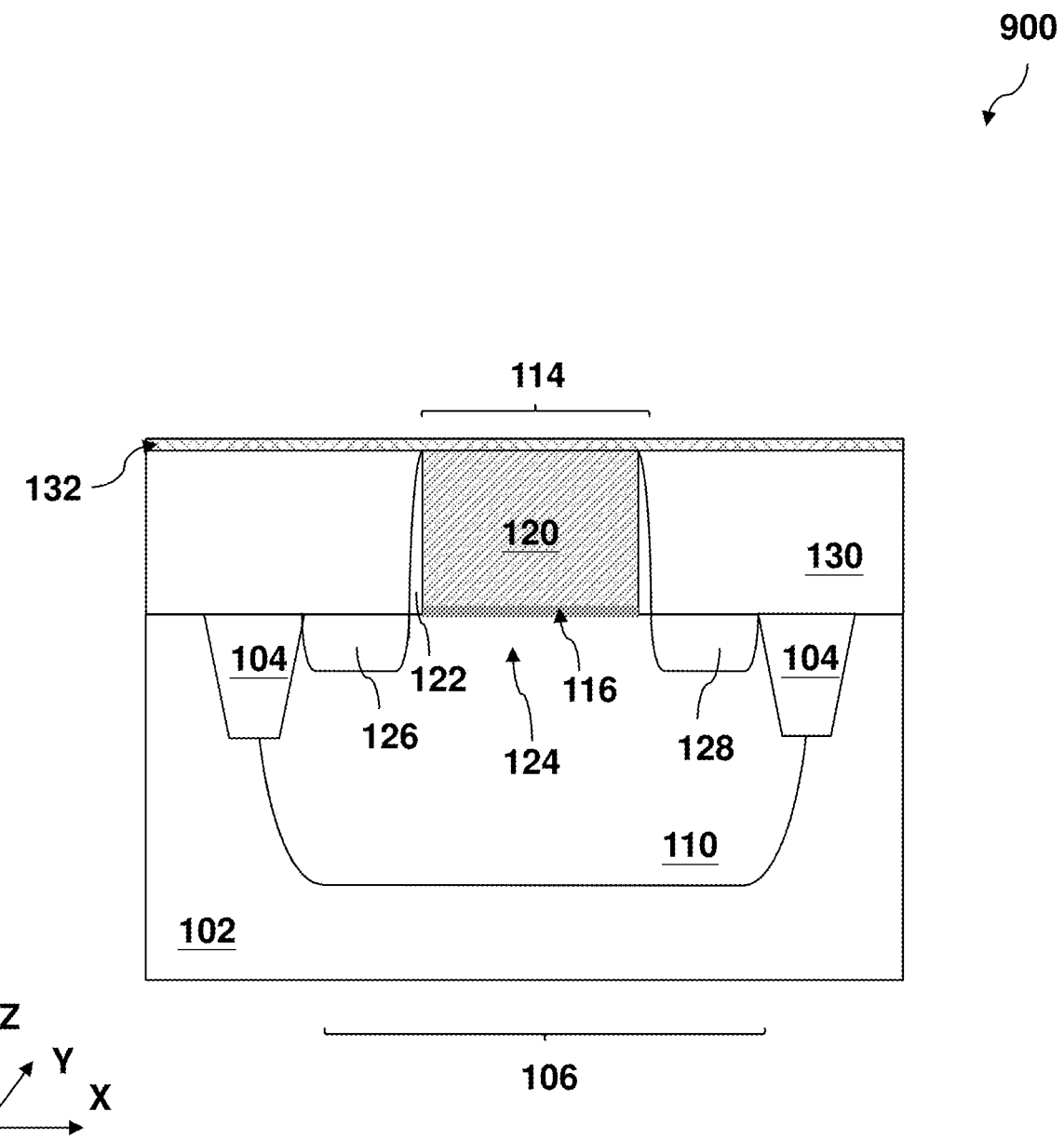
FIGS. 11, 12, 13, and 14 illustrate sectional views of an exemplary integrated circuit structure during various fabrication stages constructed in accordance with some embodiments.
Figure 12:
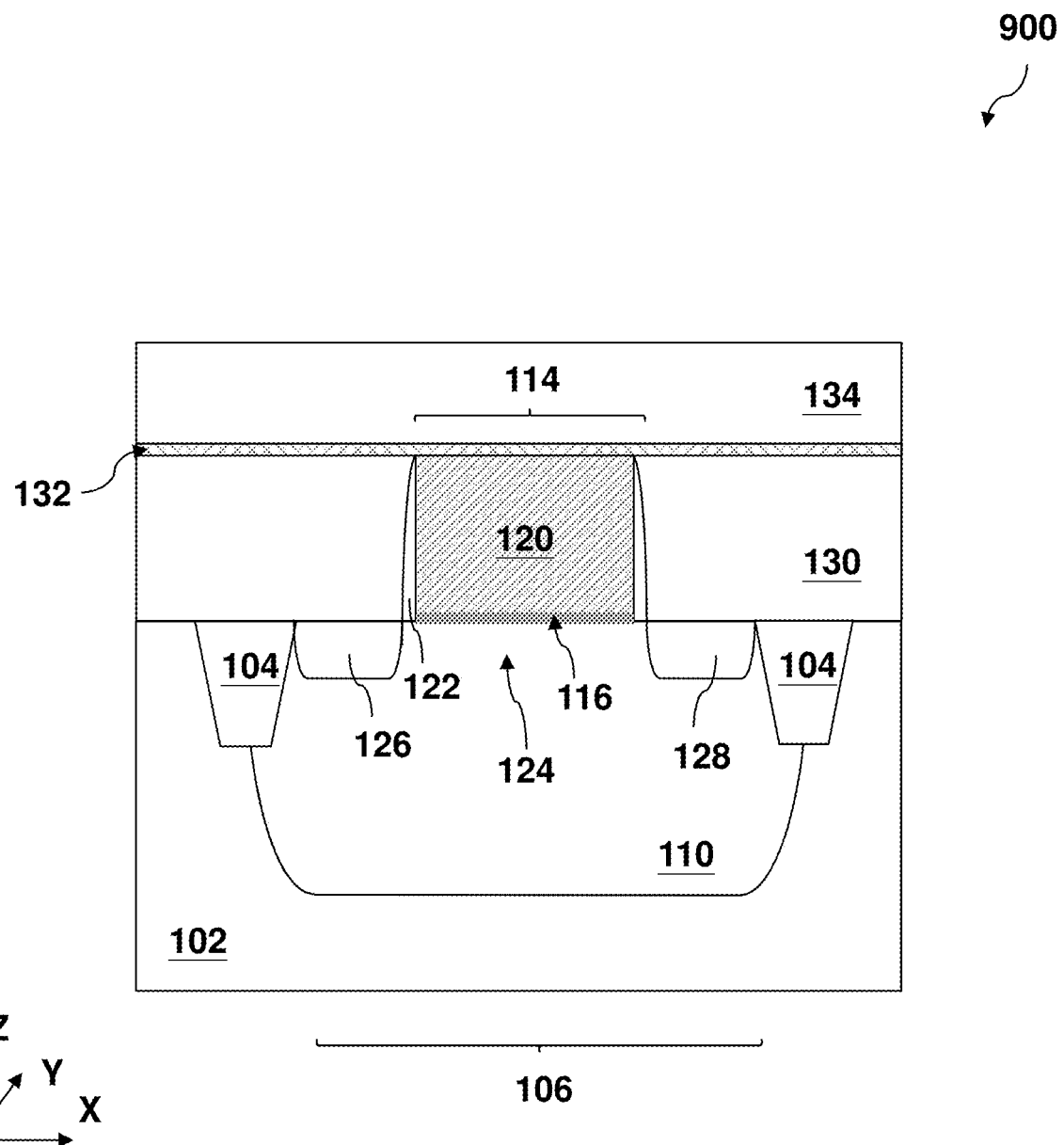

FIGS. 9A-9C provides a semiconductor structure 900 formed by the method 200 according to some other embodiments. FIG. 9A is a top view of a semiconductor structure 900 constructed according to various aspects of the present disclosure in one embodiment. FIG. 9B is a sectional view of the semiconductor structure 900 along the dashed lines AA' in accordance with some embodiments. FIG. 9C is a sectional view of the semiconductor structure 900 along the dashed lines BB' in accordance with some embodiments. The semiconductor structure 900 is similar to the semiconductor structure 100. The descriptions of the similar features are not repeated. In addition, the second contact feature 902 in the semiconductor structure 900 is aligned with the source 128 and is landing on a portion (referred as 130A) of the ILD layer 130, as illustrated in FIG. 9B. The source 128 is separated and isolated from the contact feature 902 by the portion 130A of the ILD layer 130. The portion 130A of the ILD layer 130 underlying the second contact feature 902 functions as a capacitor (collectively with the second contact feature 902 and the source 128). The FET and the capacitor are connected together and form a memory device, such as a RRAM, a DRAM, or an eOPT. Various features are formed by the method 200 of FIG. 2, as illustrated in FIGS. 11 through 14 at different fabrication stages. For example, the method 200 includes an operation 202 to form the isolation feature 104; an operation 206 to form source and drain; an operation 210 to form a metal gate stack; an operation 212 to form the contact holes; an operation 214 to form the dielectric material layer 146; and so on. The similar languages are not repeated here. Particularly, the operation 212 to form the contact holes and the operation 214 to form the dielectric material layer 146 are described in detail with reference to FIGS. 10A and 10B.

In the present embodiment, the first contact feature 136 and the second contact hole 902 of the semiconductor structure 900 are formed in separate procedures. In furtherance of the embodiment, the second contact feature 902 is formed in a same procedure to form the gate contact feature 148.

Figure 13:
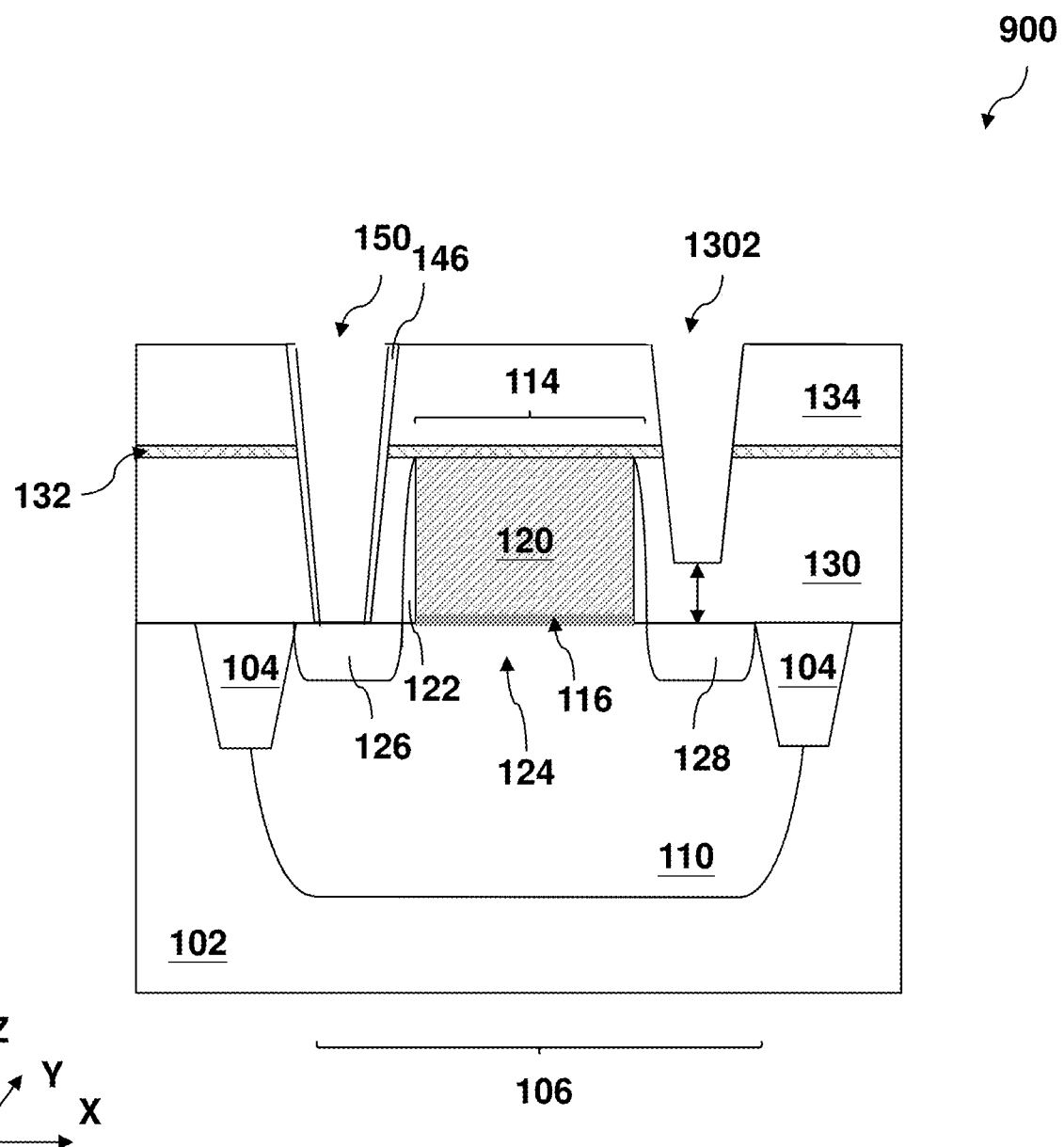

Referring to FIG. 10A and FIG. 13, the method 212 includes an operation 1002 to form a first contact hole 150 by a similar procedure to form the contact hole 150 of FIG. 5. For example, the operation 1002 includes forming a patterned mask and etching with the patterned mask as an etching mask. Particularly, the etching process is controlled to etch through the first ILD layer 130 such that the drain 126 is exposed within the first contact hole 150.

The method 212 also includes an operation 1004 to form a second contact hole 1302 by another procedure that collectively forms the contact hole 148 of the gate stack 114. The gate contact feature 148 and the contact feature 902 are collectively formed by a same operation 1004 while the contact feature 136 is formed by another operation 1002.

The operation 1004 also includes forming a patterned mask with openings that defines regions for contact holes; and performing an etching process to the ILD layers to form the corresponding contact holes aligned to the source 128 and the gate stack 114. The etching process is controlled to etch through the second ILD layer 134 and the capping layer 132 so that the gate stack 114 is exposed within the corresponding contact hole (not shown here). Furthermore, the etching process is controlled not to etch through the first ILD layer 130 so that a portion of the ILD layer 130 remains in the second contact hole 1302 with a desired thickness. In some embodiments, the etching process includes multiple etching steps with respective etchants. For example, a first etching step is applied to etch the second ILD layer 134 and stops on the capping layer 132; a second etching step is applied to etch the capping layer 132 and stops on the gate stack 114; and a third etching step is applied to selectively etch the first ILD layer 130. In the advanced technology nodes, due to the height difference between the gate stack and S/D feature, the gate contacts are formed separately from the formation of the S/S features. In the method 212, the second contact feature 902 to the source 128 is grouped with the gate contacts without using an additional photomask and a lithography process, leading to the reduced manufacturing cost.

Figure 14:
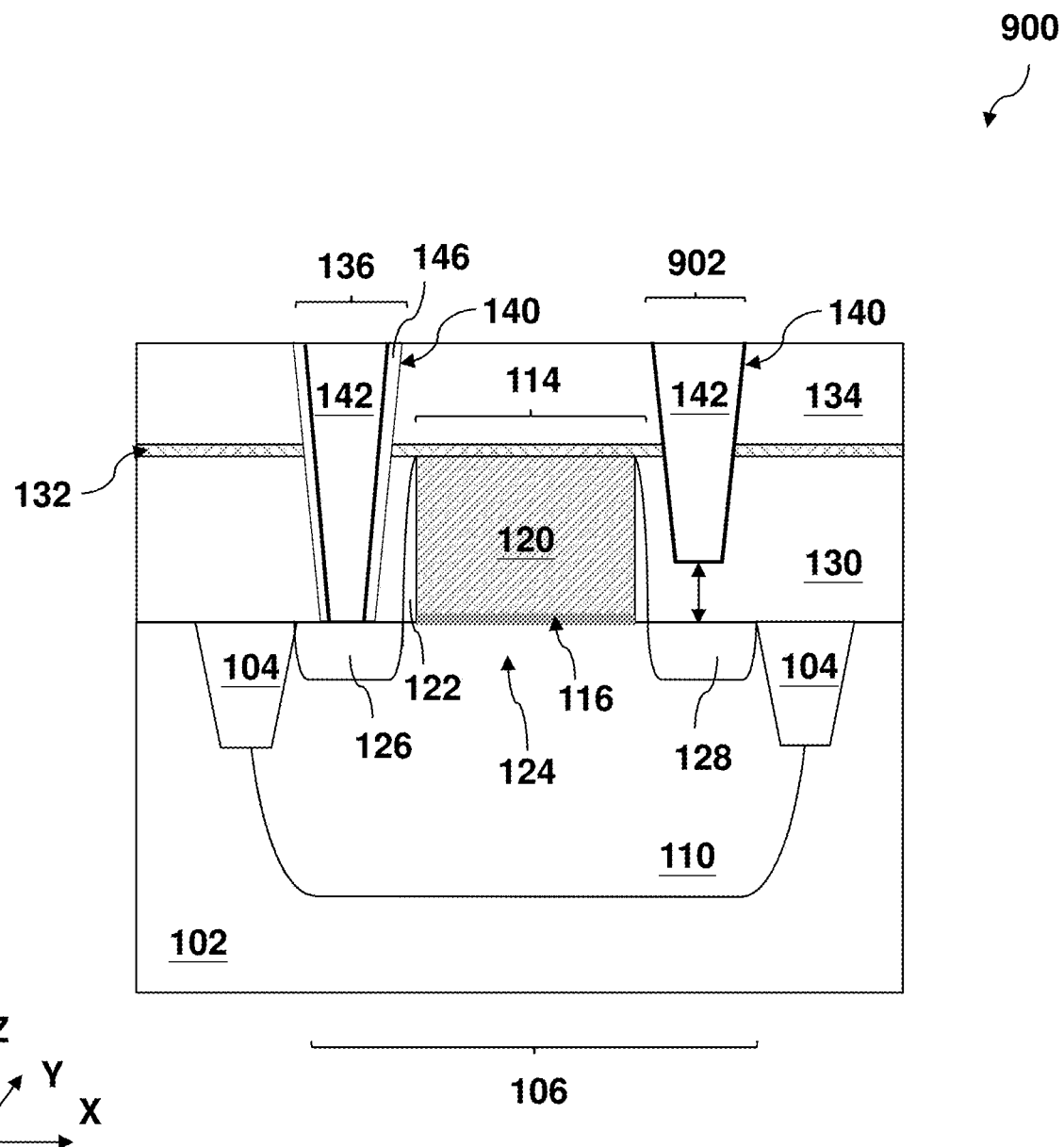

Referring to FIGS. 10B and 13, the operation 214 of the method 200 to form the dielectric material layer 146 is only applied to the first contact hole 150 in the procedure to form the first contact feature 136 aligned to the drain 126. As noted above, the first contact hole 150 is formed by the operation 1002 that further includes forming a patterned mask and etching. After the operation 1002, the operation 214 continues using the same patterned mask to form the dielectric material layer 146 in the first contact hole 150. Especially, the operation 214 includes a sub-operation 1006 to deposit the dielectric material layer 146 in the first contact hole 150; and a sub-operation 1008 to perform an anisotropic etching process to remove the dielectric material layer 146 from the bottom surface of the first contact hole 150 so that the drain 126 is exposed within the contact hole 150, as illustrated in FIG. 13. Thereafter, the contact features 136, 902 and 148 are formed by the operation 216 as illustrated in FIG. 14.

Figure 15A:
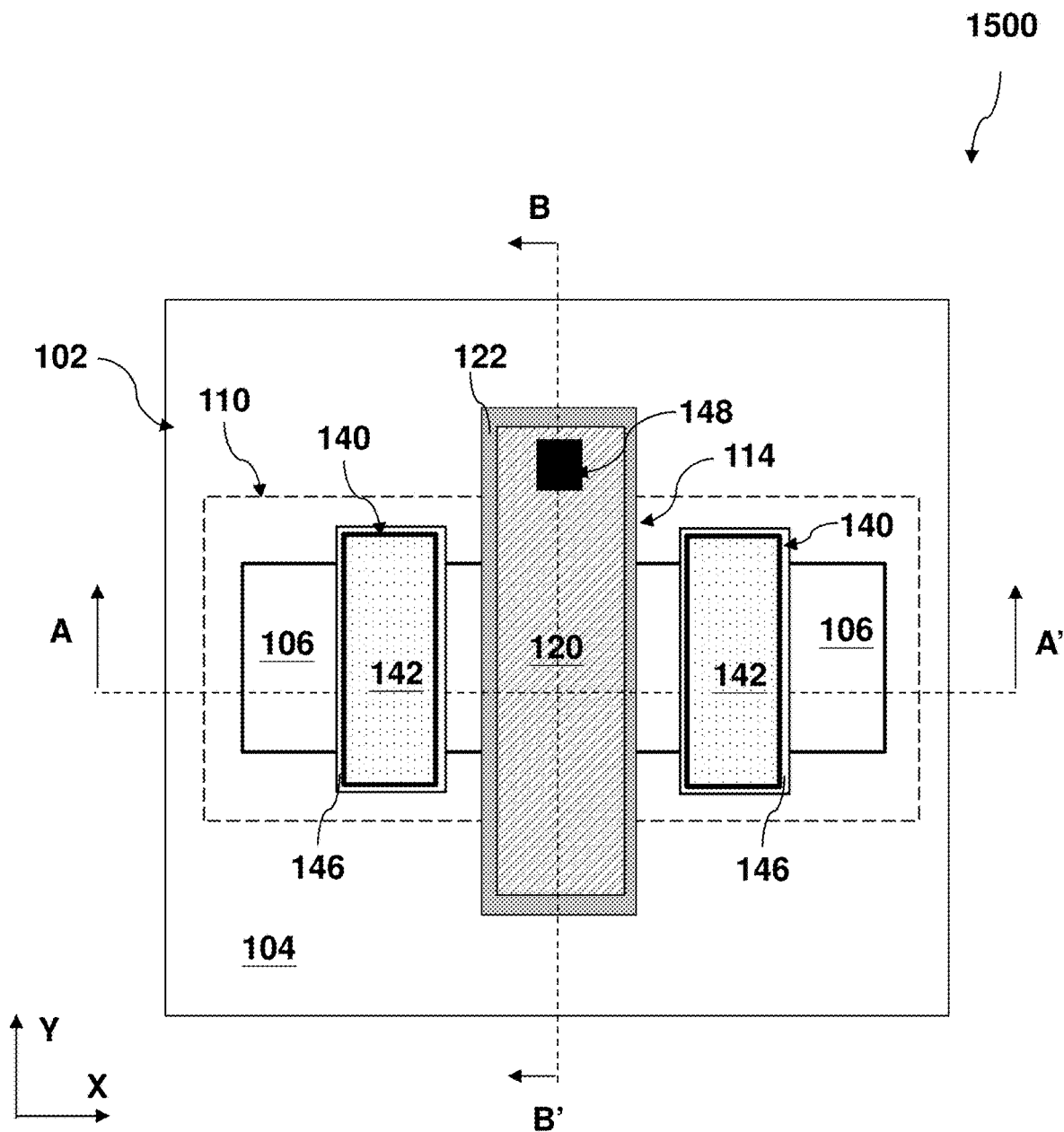
FIG. 15A is a top view of a semiconductor device structure constructed according to various aspects of the present disclosure in one embodiment.
Figure 15B:
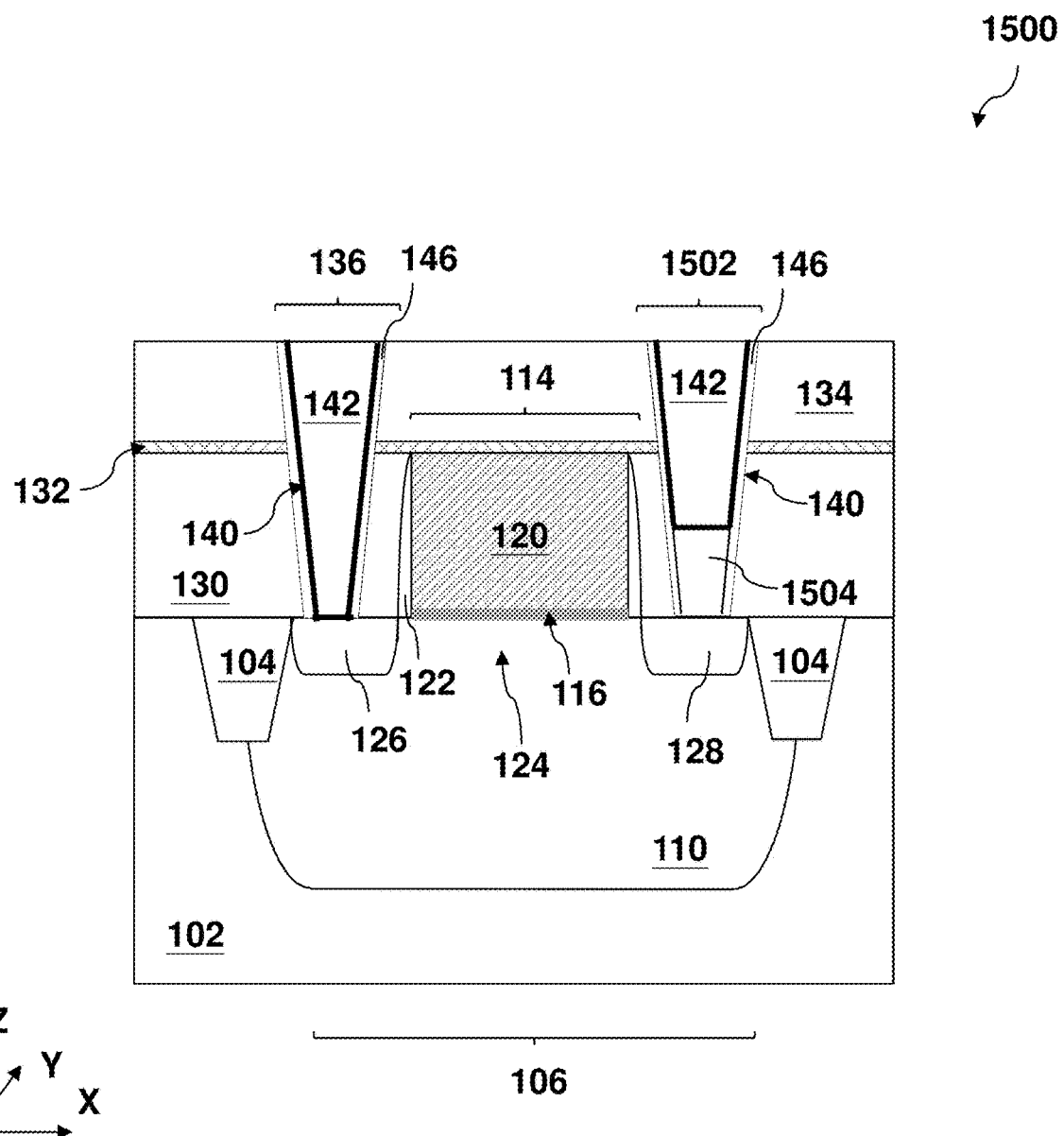
FIGS. 15B and 15C are sectional views of the semiconductor structure of FIG. 15A along the dashed lines AA' and BB' respectively, in accordance with some embodiments.
Figure 15C:
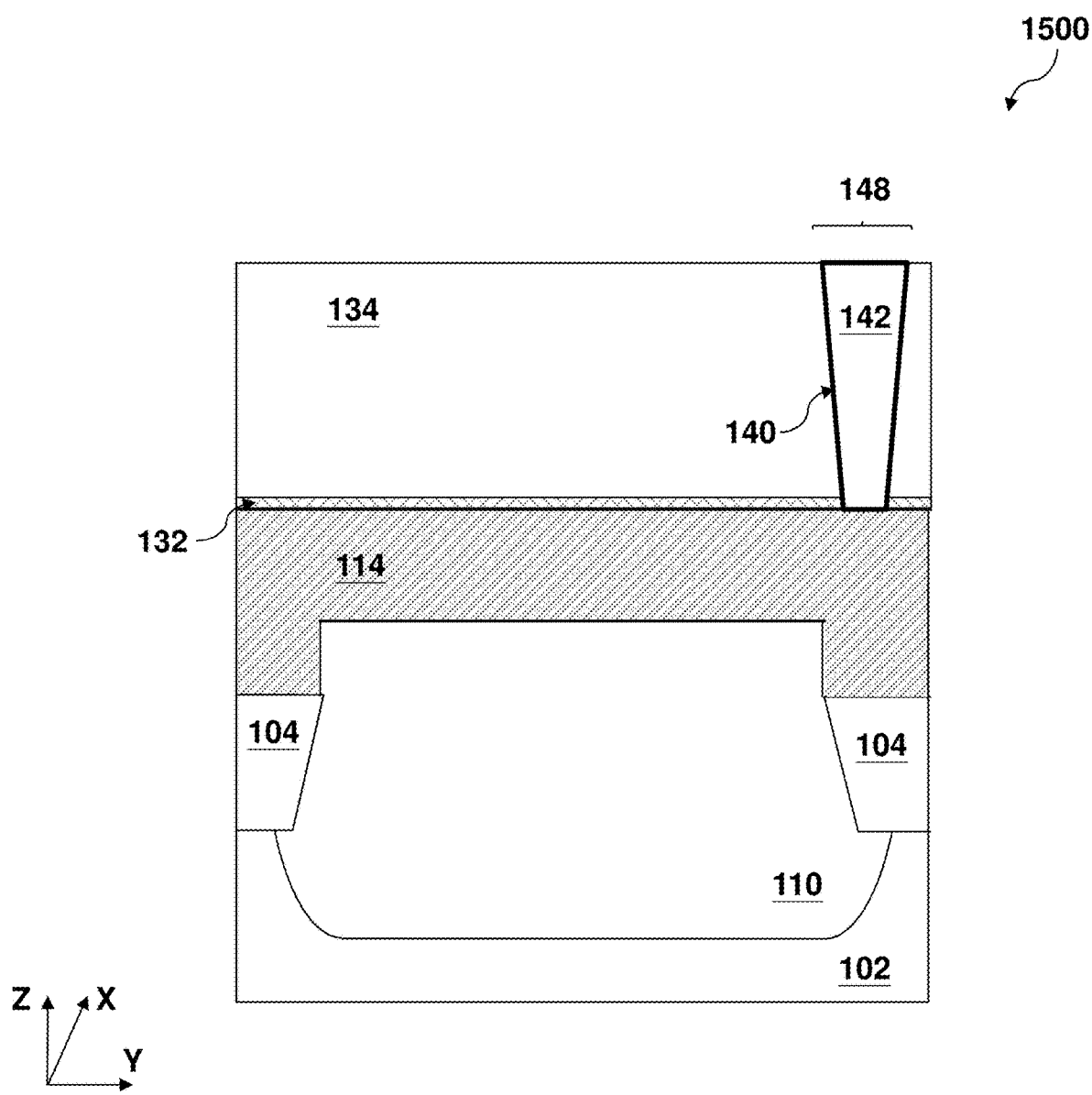

FIGS. 15A-15C provides a semiconductor structure 1500 formed by the method 200 according to some other embodiments. FIG. 15A is a top view of a semiconductor structure 1500 constructed according to various aspects of the present disclosure in one embodiment. FIG. 15B is a sectional view of the semiconductor structure 1500 along the dashed lines AA' in accordance with some embodiments. FIG. 15C is a sectional view of the semiconductor structure 1500 along the dashed lines BB' in accordance with some embodiments. The semiconductor structure 1500 is similar to the semiconductor structure 100. The descriptions of the similar features are not repeated. In addition, the second contact feature 1502 in the semiconductor structure 1500 is aligned with the source 128 and is landing on a resistive feature (or a dielectric feature) 1504. The source 128 is separated and isolated from the contact feature 1502 by the resistive feature 1504. The FET and the resistive feature 1504 form a memory device, such as eOPT (or alternatively a RRAM). In some embodiments, the resistive feature 1504 is different from the dielectric material layer 146 in composition. Various features are formed by the method 200, as illustrated in FIGS. 17 through 21. For example, the method 200 includes an operation 202 to form the isolation feature 104; an operation 206 to form source and drain; an operation 210 to form a metal gate stack 114; an operation 212 to form the contact holes; an operation 214 to form the dielectric material layer 146; and so on. The similar languages are not repeated here. Particularly, the operation (or method) 214 to form the dielectric material layer 146 includes forming the resistive feature 1504 and is described in detail with reference to FIG. 16A.

Figure 16A:
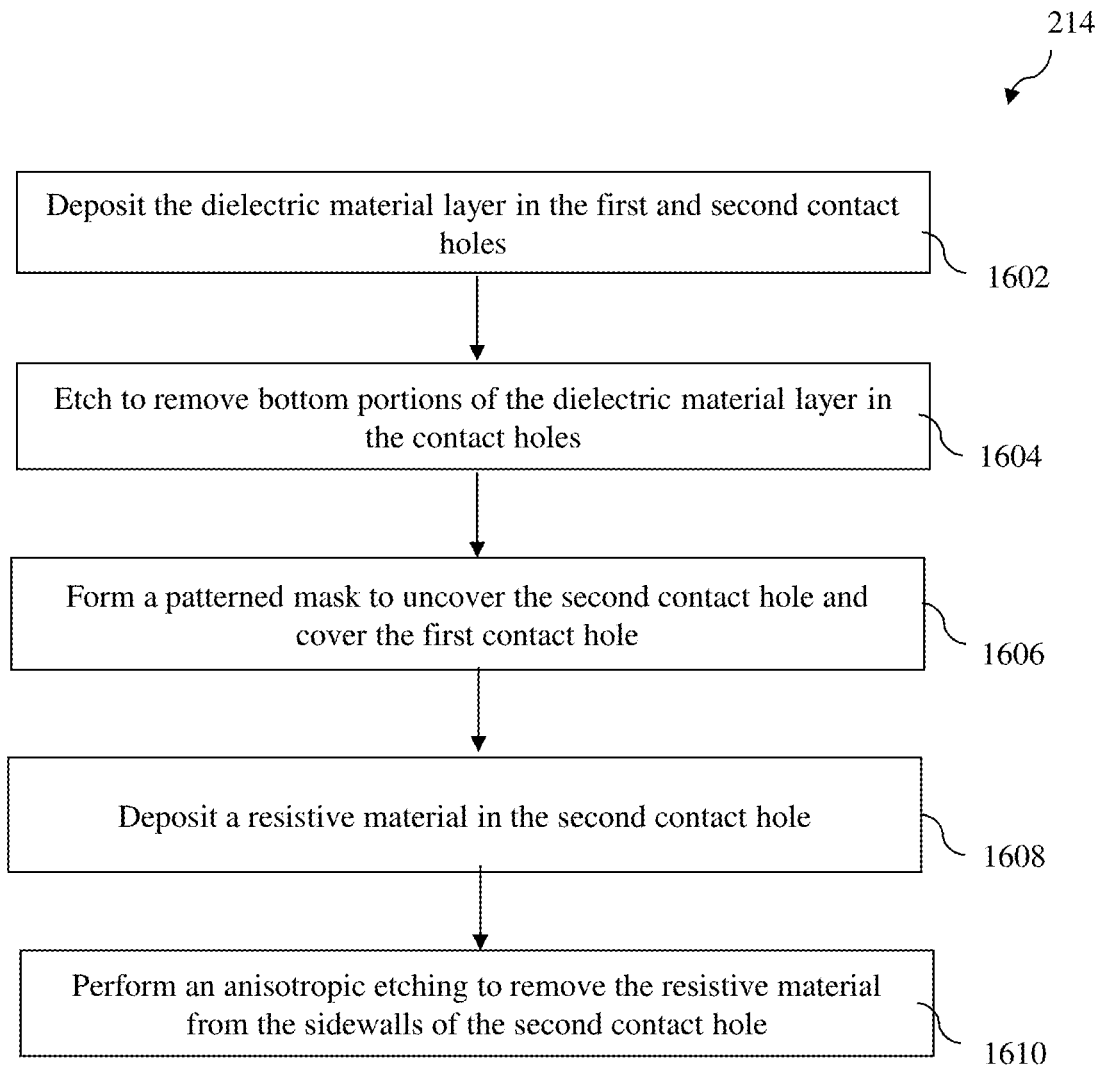
FIGS. 16A, 16B and 16C are flowcharts of an operation in the method of FIG. 2A according to various embodiments.
Figure 20:
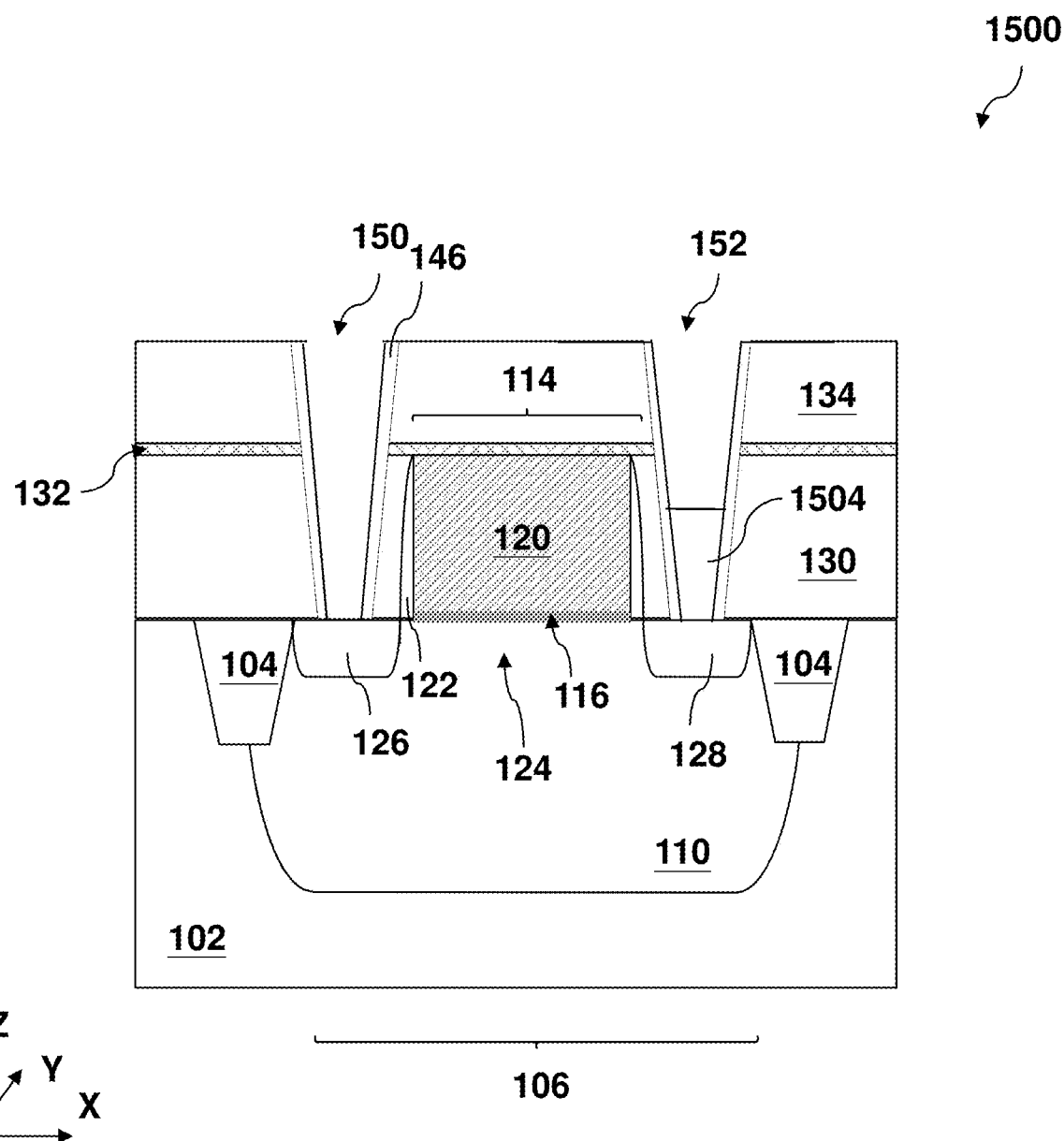
Figure 21:
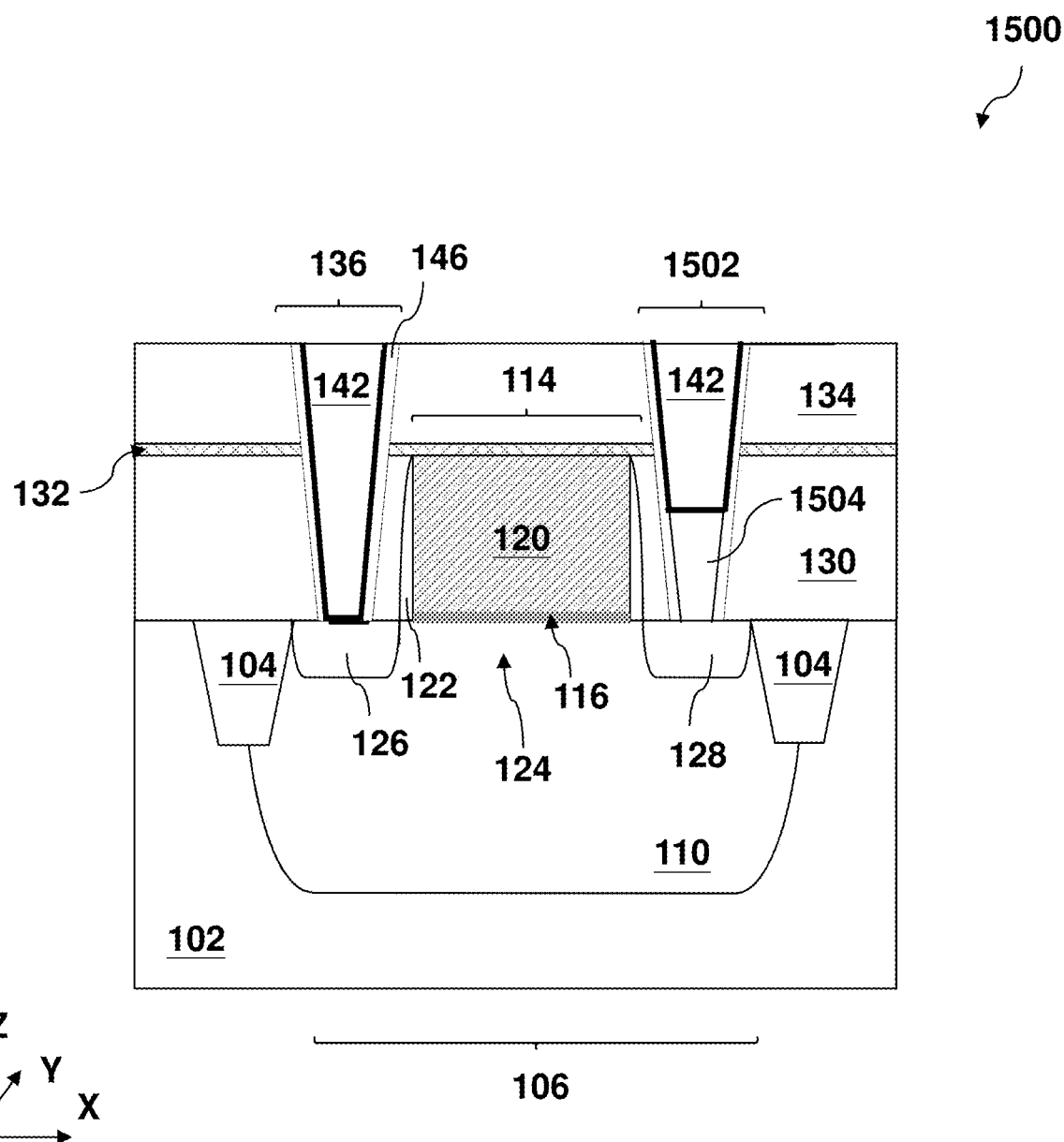

Referring to a block 1602 of FIG. 16A and FIG. 20, the method 214 includes an operation to deposit the dielectric material layer 146 in the first contact hole 150 and the second contact hole 152.

Referring to a block 1604 of FIG. 16A and FIG. 20, the method 214 includes an operation to perform an anisotropic etching process to remove the bottom portions of the dielectric material layer 146 in the contact holes.

Referring to a block 1606 of FIG. 16A and FIG. 20, the method 214 includes an operation to form a patterned mask to uncover the second contact hole 152 and cover the first contact hole 150.

Referring to a block 1608 of FIG. 16A and FIG. 20, the method 214 includes an operation to deposit a second dielectric material layer (or a resistive material layer) 1504 in the second contact hole 152. The second dielectric material layer 1504 includes any dielectric material different from the first dielectric material layer 146 and may include silicon oxide, silicon nitride, silicon oxynitride, high-k dielectric material (such as metal oxide, metal nitride, or metal oxynitride), or a combination thereof. The deposition process may include CVD, ALD, or other suitable deposition technology. The deposition process is controlled to deposit the second dielectric material layer 1504 with a desired thickness.

Referring to a block 1610 of FIG. 16A and FIG. 20, the method 214 includes an operation to perform an anisotropic etching process to remove the second dielectric material layer 1504 from the sidewalls of the second contact hole 152, resulting in a dielectric feature (still labeled with 1504) in the second contact hole 152. Thereafter, the contact features including 136, 1502 and 148 by the operation 216 in the respective contact holes.

Figure 16B:
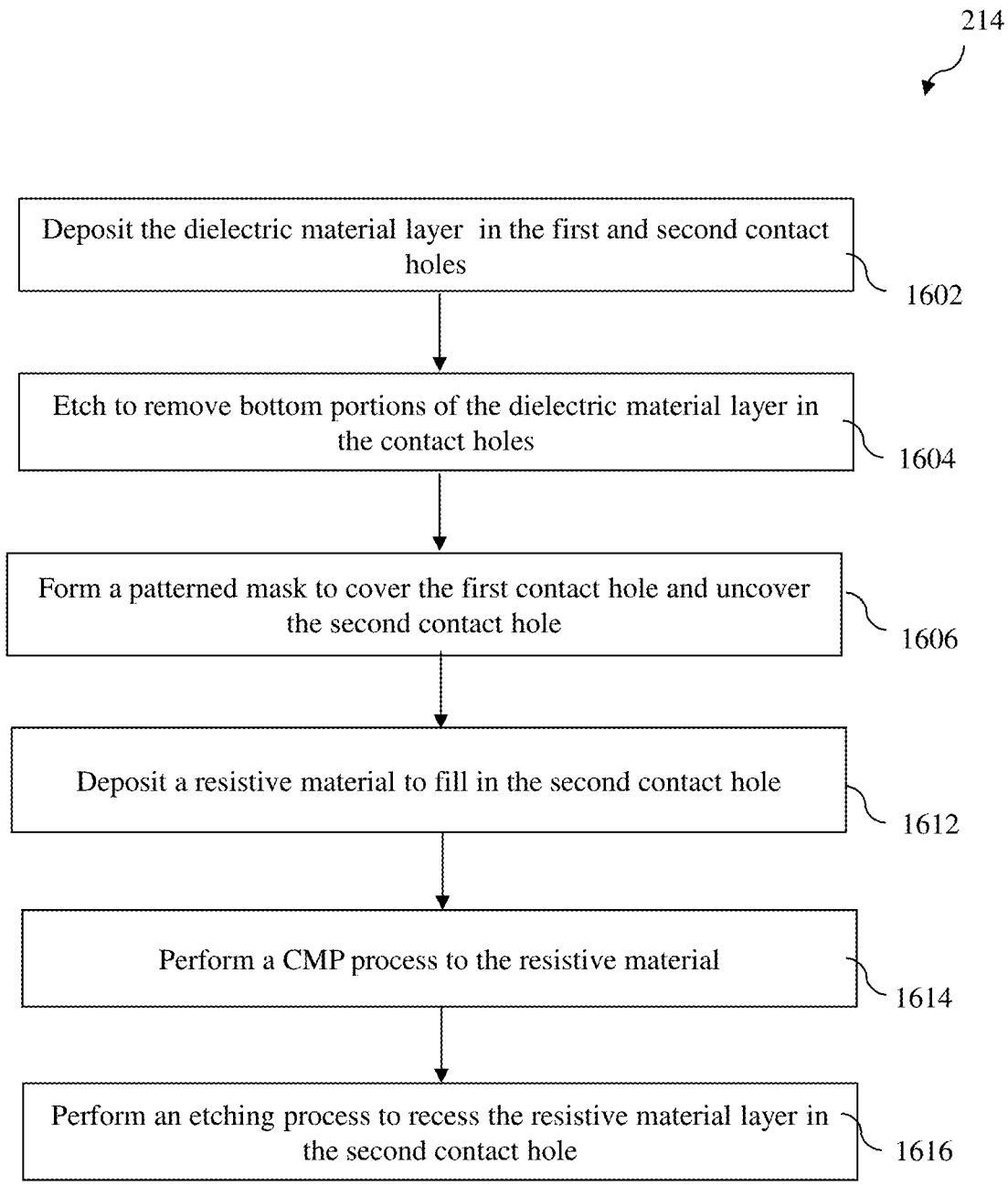

In an alternative embodiment, the method 214 to form the same structure is provided in FIG. 16B and is described in detail.

Referring to FIG. 16B and FIG. 20, the method 214 includes an operation 1602 to deposit the a second dielectric material layer 146 in the first contact hole 150 and the second contact hole 152; an operation 1604 to perform an anisotropic etching process to remove the bottom portions of the dielectric material layer 146 in the contact holes; and an operation 1606 to form a patterned mask to uncover the second contact hole 152 and cover the first contact hole 150, similar to the corresponding operations in FIG. 16A.

Referring to a block 1612 of FIG. 16B and FIG. 20, the method 214 includes an operation to deposit a second dielectric material layer 1504 to fill in the second contact hole 152. The second dielectric material layer 1504 includes any dielectric material different from the first dielectric material layer 146 and may include silicon oxide, silicon nitride, silicon oxynitride, high-k dielectric material (such as metal oxide, metal nitride, or metal oxynitride), or a combination thereof. The deposition process may include CVD, ALD, spin-on coating, or other suitable deposition technology. The deposition process fills the second contact hole 152.

Referring to a block 1614 of FIG. 16B and FIG. 20, the method 214 includes an operation to perform a CMP process to remove the second dielectric material layer 1504 from the ILD layer 134 and planarize the top surface.

Referring to a block 1616 of FIG. 16B and FIG. 20, the method 214 includes an operation to perform an etching process to recess the second dielectric material layer 1504 in the second contact hole 152 to a desired thickness, resulting in the dielectric feature 1504 in the second contact hole 152.

In another alternative embodiment, the method 214 to form the same structure is provided in FIG. 16C and is described below in details.

Figure 16C:
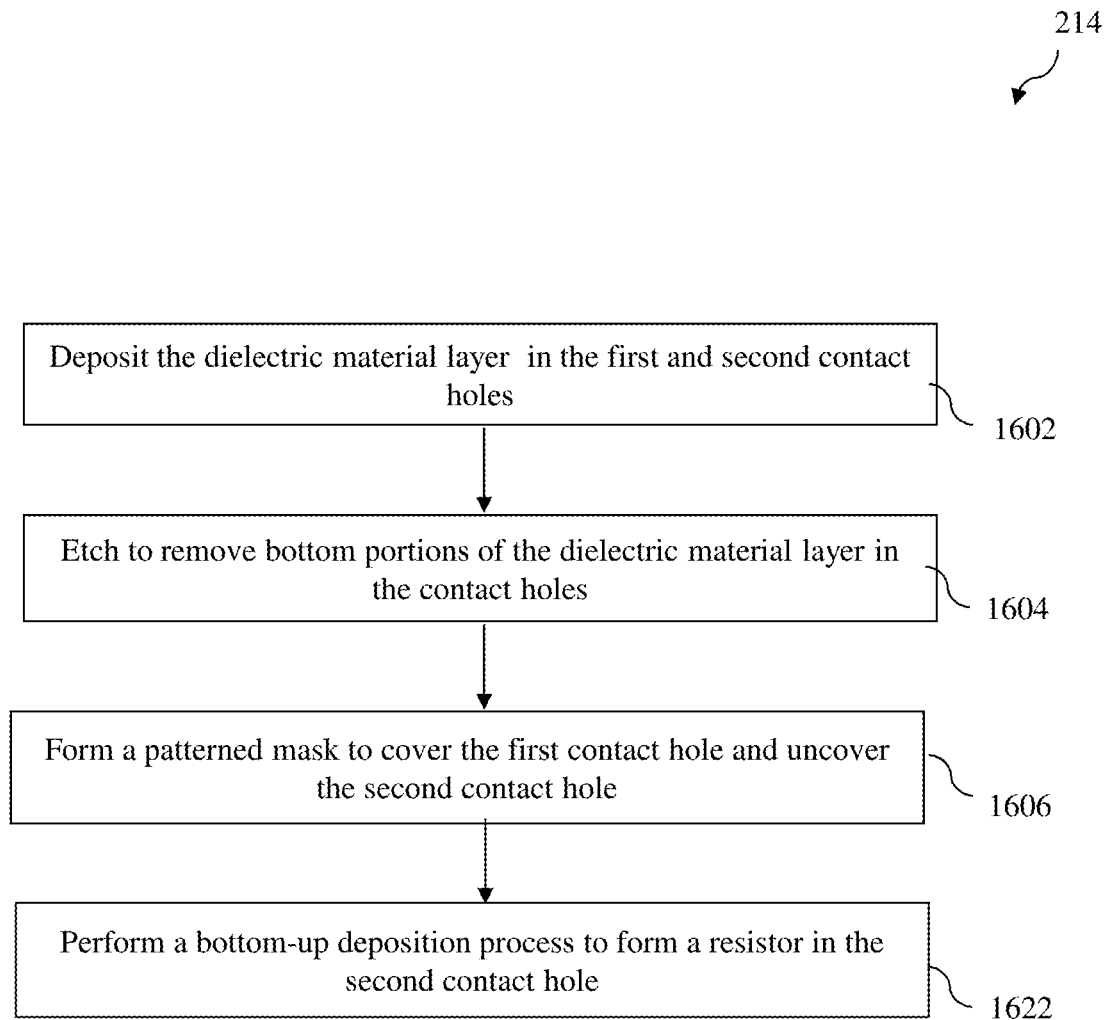
Figure 17:
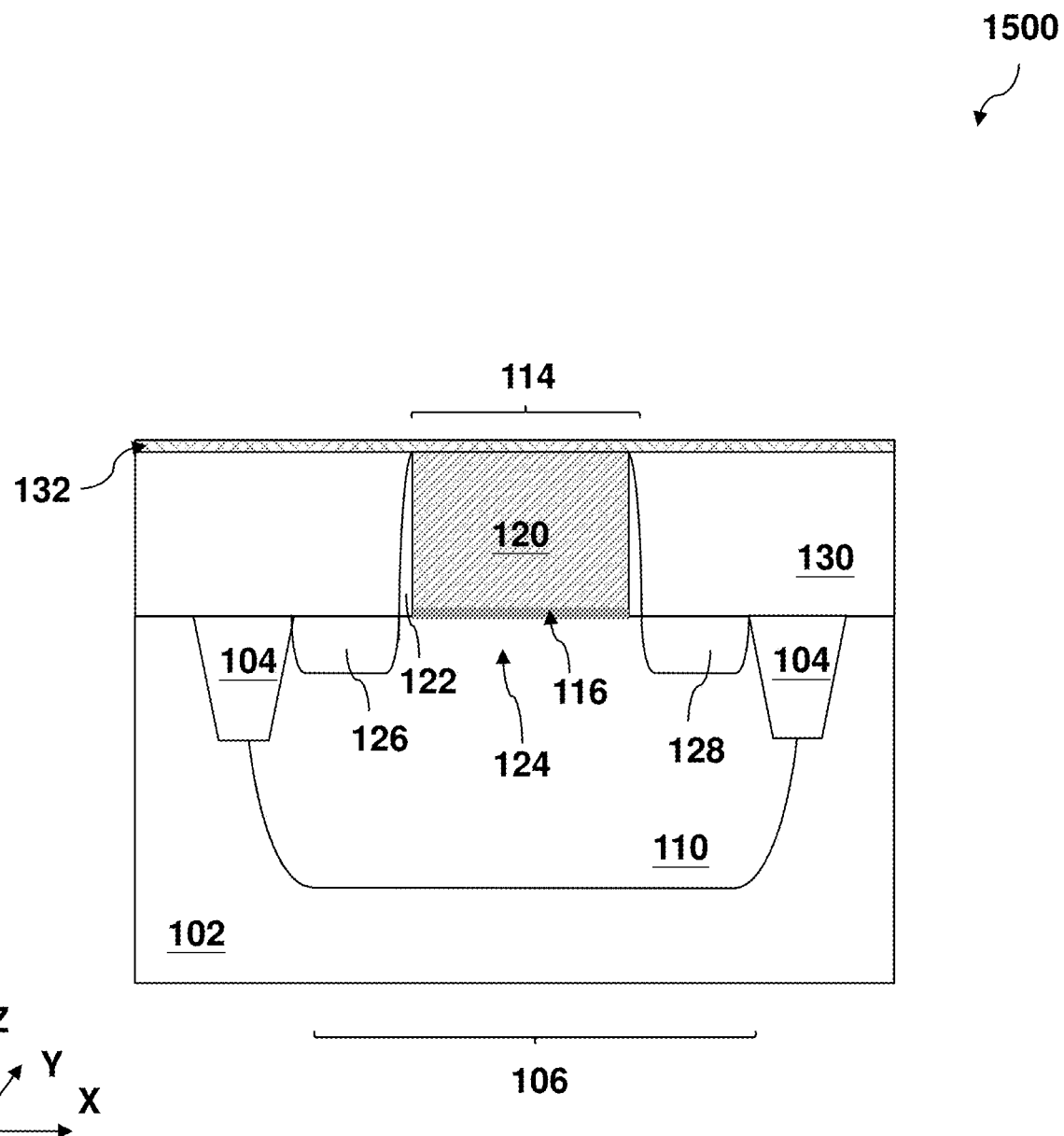
FIGS. 17, 18, 19, 20, and 21 illustrate sectional views of an exemplary integrated circuit structure during various fabrication stages constructed in accordance with some embodiments.
Figure 18:
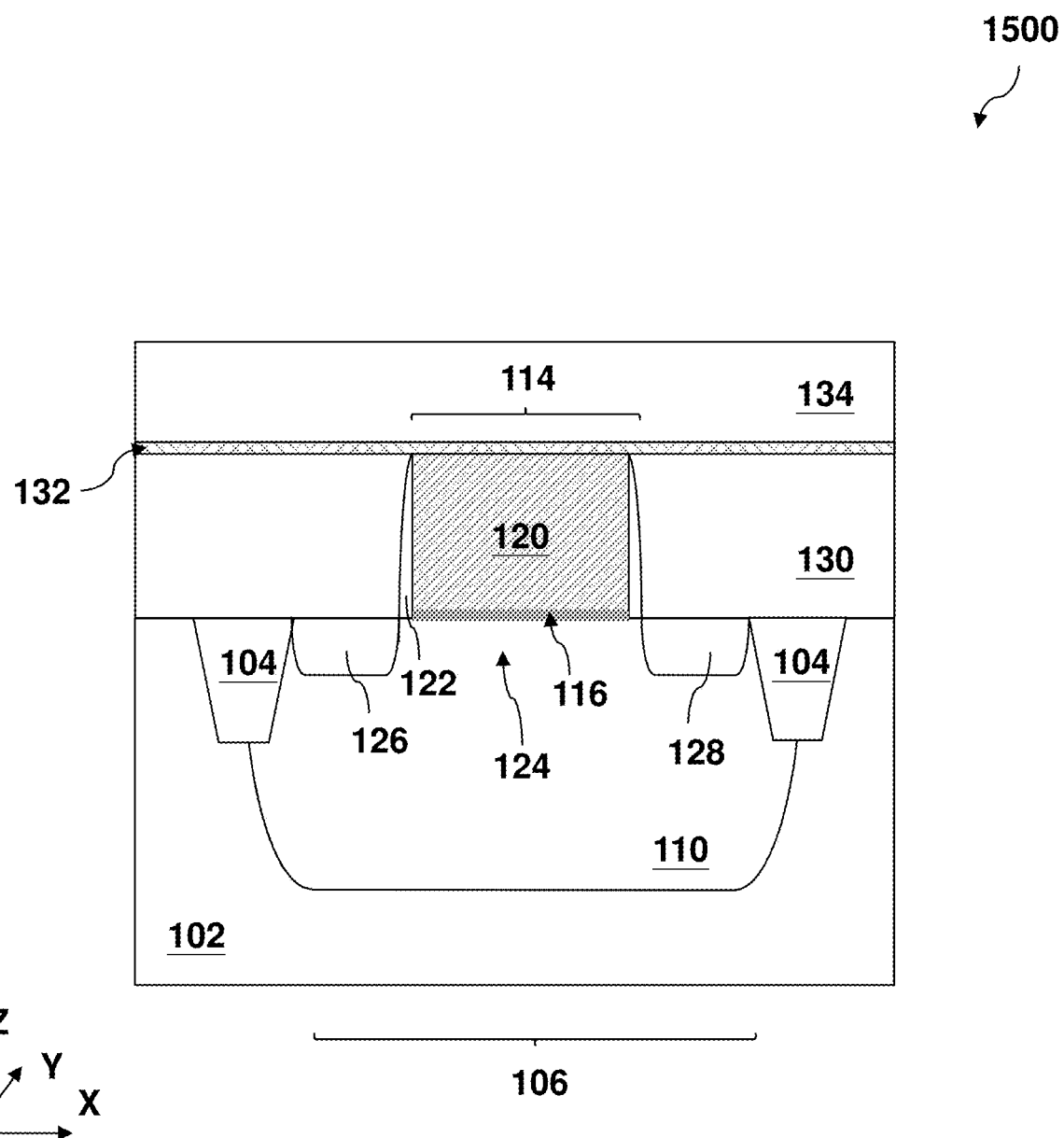
Figure 19:
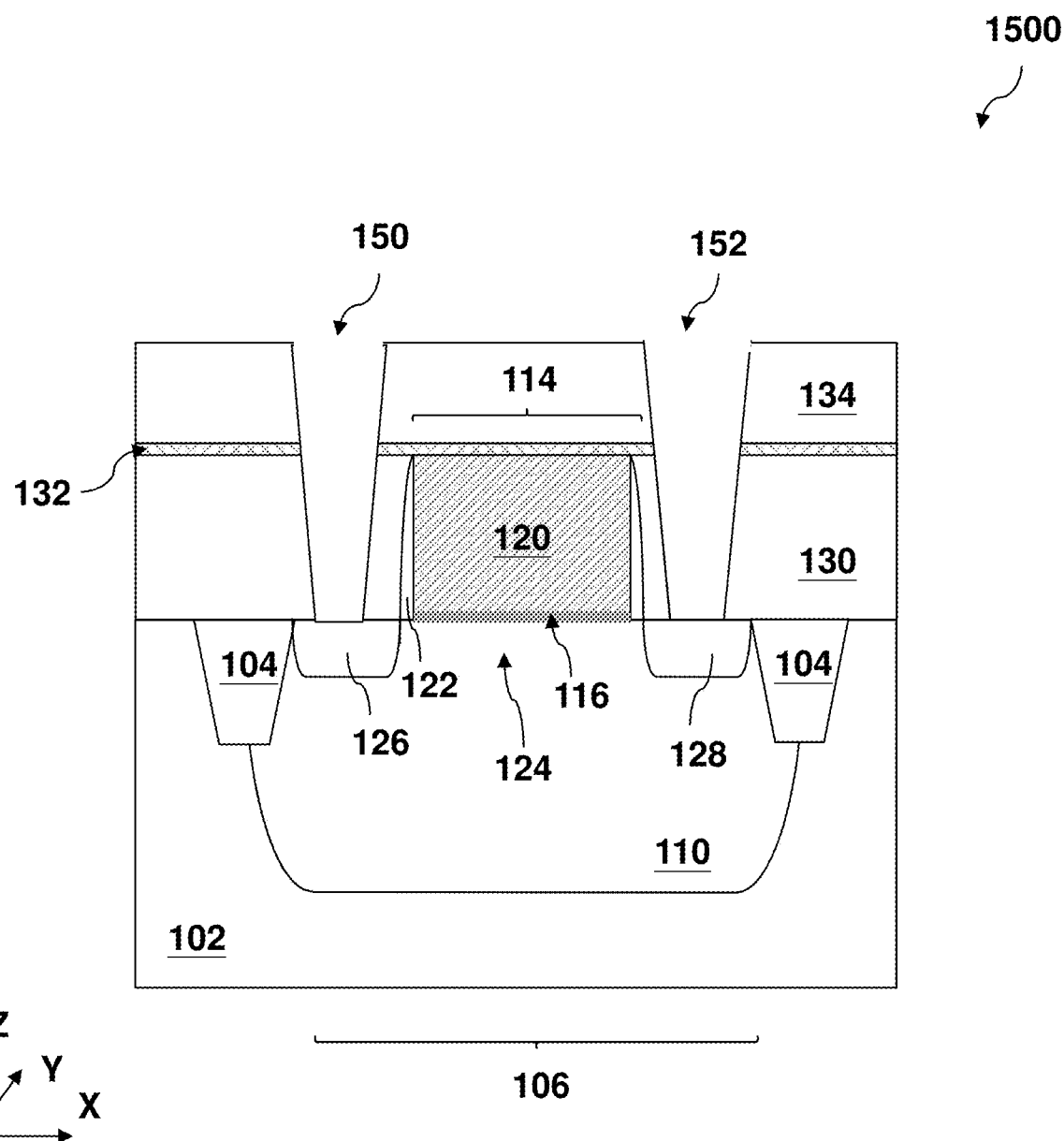

Referring to FIG. 16C and FIG. 20, the method 214 includes an operation 1602 to deposit the dielectric material layer 146 in the first contact hole 150 and the second contact hole 152; an operation 1604 to perform an anisotropic etching process to remove the bottom portions of the dielectric material layer 146 in the contact holes; and an operation 1606 to form a patterned mask to uncover the second contact hole 152 and cover the first contact hole 150, similar to the corresponding operations in FIG. 16A.

Referring to a block 1622 of FIG. 16C and FIG. 20, the method 214 includes an operation to perform a bottom-up deposition process that deposits a second dielectric material layer 1504 on the bottom surface of the second contact hole 152, resulting a resistor 1504 in the second contact hole 152. A bottom-up metal deposition process fills an opening from bottom up and does not have the step coverage issue. A bottom-up deposition may include glass-cluster ion beams (GCIBs), initiated CVD (iCVD), cyclic-deposition-etch (CDE), or other suitable deposition technology. In some examples, the bottom-up deposition process is a cyclic-deposition-etch process, where the deposition and etching are simultaneously implemented so that the second dielectric material is only deposited on the bottom surface since the deposited on the sidewalls of the second contact hole 152 is removed by etching.

Figure 22A:
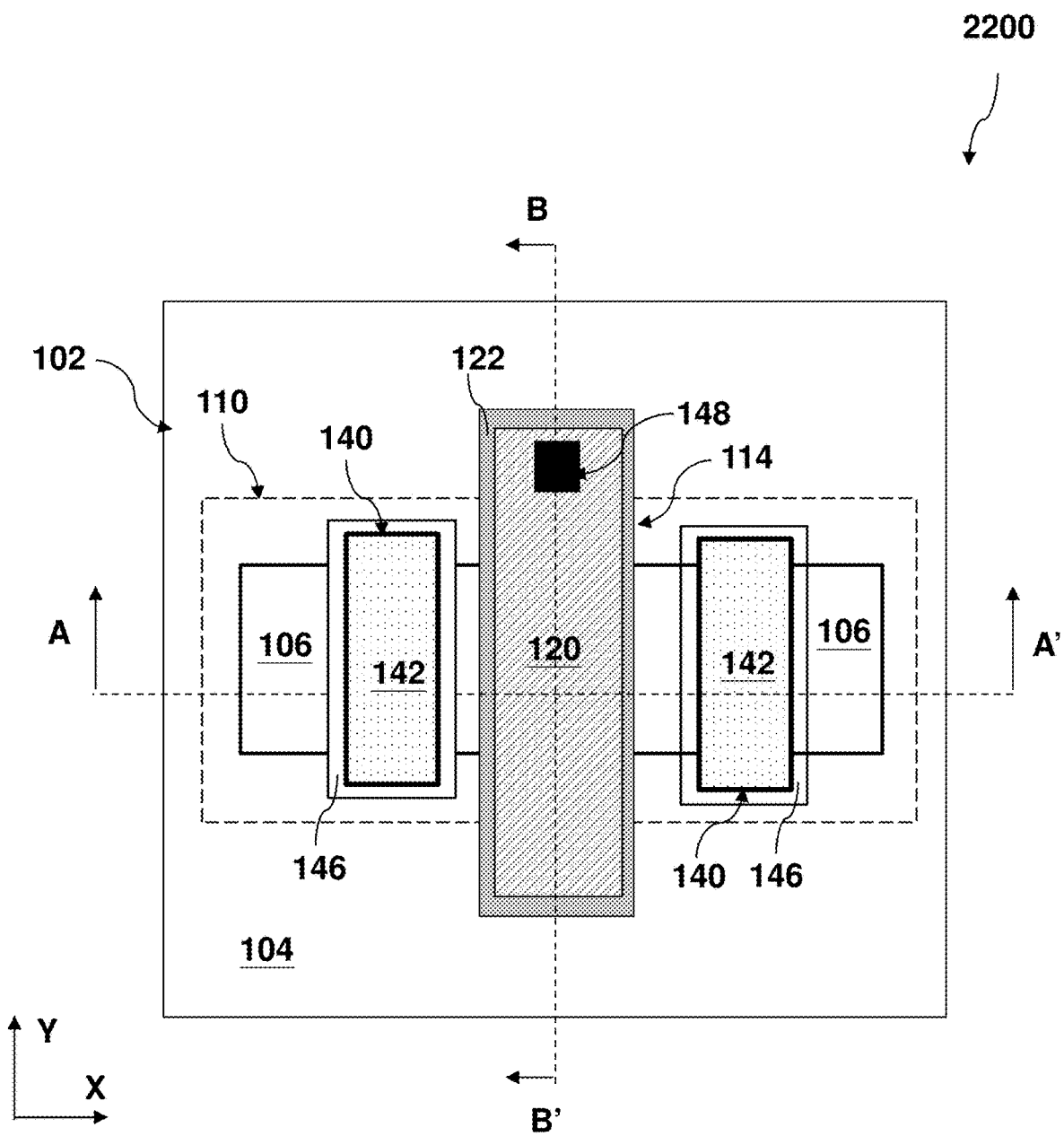
FIG. 22A is a top view of a semiconductor device structure constructed according to various aspects of the present disclosure in one embodiment.
Figure 22B:
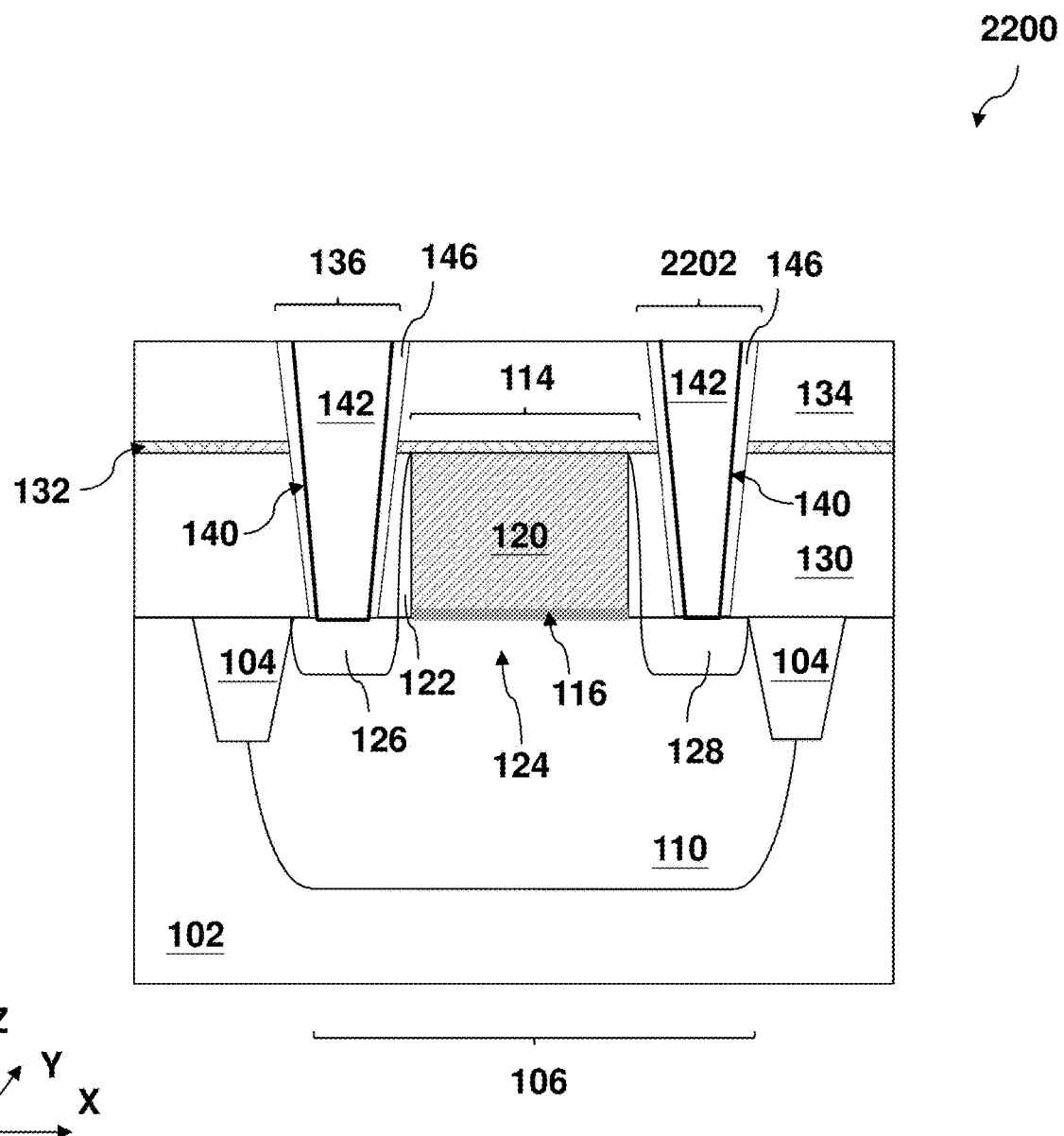
FIGS. 22B and 22C are sectional views of the semiconductor structure of FIG. 22A along the dashed lines AA' and BB' respectively, in accordance with some embodiments.
Figure 22C:
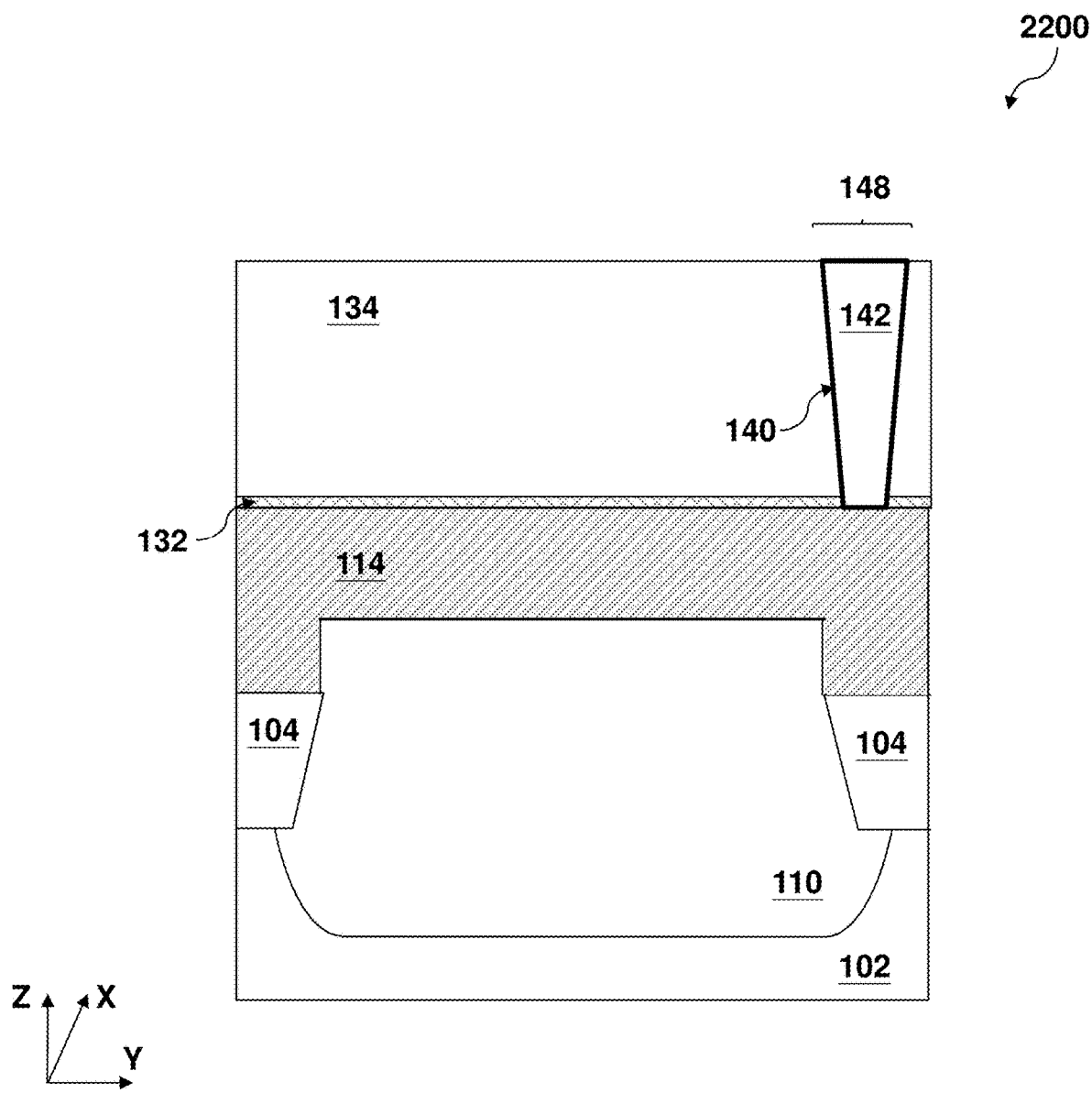

FIGS. 22A-22C provides a semiconductor structure 2200 formed by the method 200 according to some other embodiments. FIG. 22A is a top view of a semiconductor structure 2200 constructed according to various aspects of the present disclosure in one embodiment. FIG. 22B is a sectional view of the semiconductor structure 2200 along the dashed lines AA' in accordance with some embodiments. FIG. 22C is a sectional view of the semiconductor structure 2200 along the dashed lines BB' in accordance with some embodiments. The semiconductor structure 2200 is similar to the semiconductor structure 100. The descriptions of the similar features are not repeated. In addition, the second contact feature 2202 in the semiconductor structure 2200 is aligned with the source 128 and is directly landing on the source 128. The second contact feature 2202 is substantially similar to the first contact feature 136 in term of formation and structure. Various features are formed by the method 200, as illustrated in FIGS. 24 through 29. For example, the method 200 includes an operation 202 to form the isolation feature 104; an operation 206 to form source and drain; an operation 210 to form a metal gate stack 114; an operation 212 to form the contact holes; an operation 214 to form the dielectric material layer 146; and so on. The similar languages are not repeated here. Particularly, the operation (or method) 214 to form the dielectric material layer 146 is described in detail with reference to FIG. 23.

Figure 23:
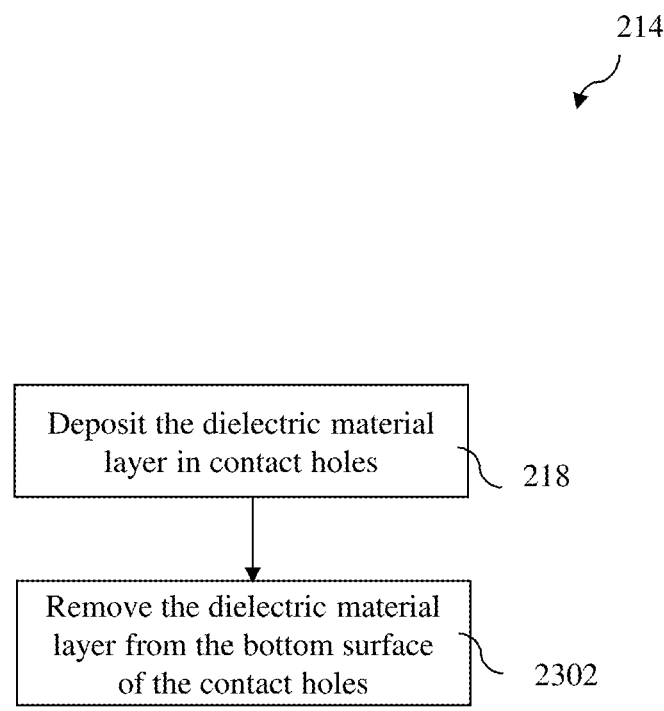
FIG. 23 is a flowchart of an operation in the method of FIG. 2A in accordance with some embodiments.
Figure 24:
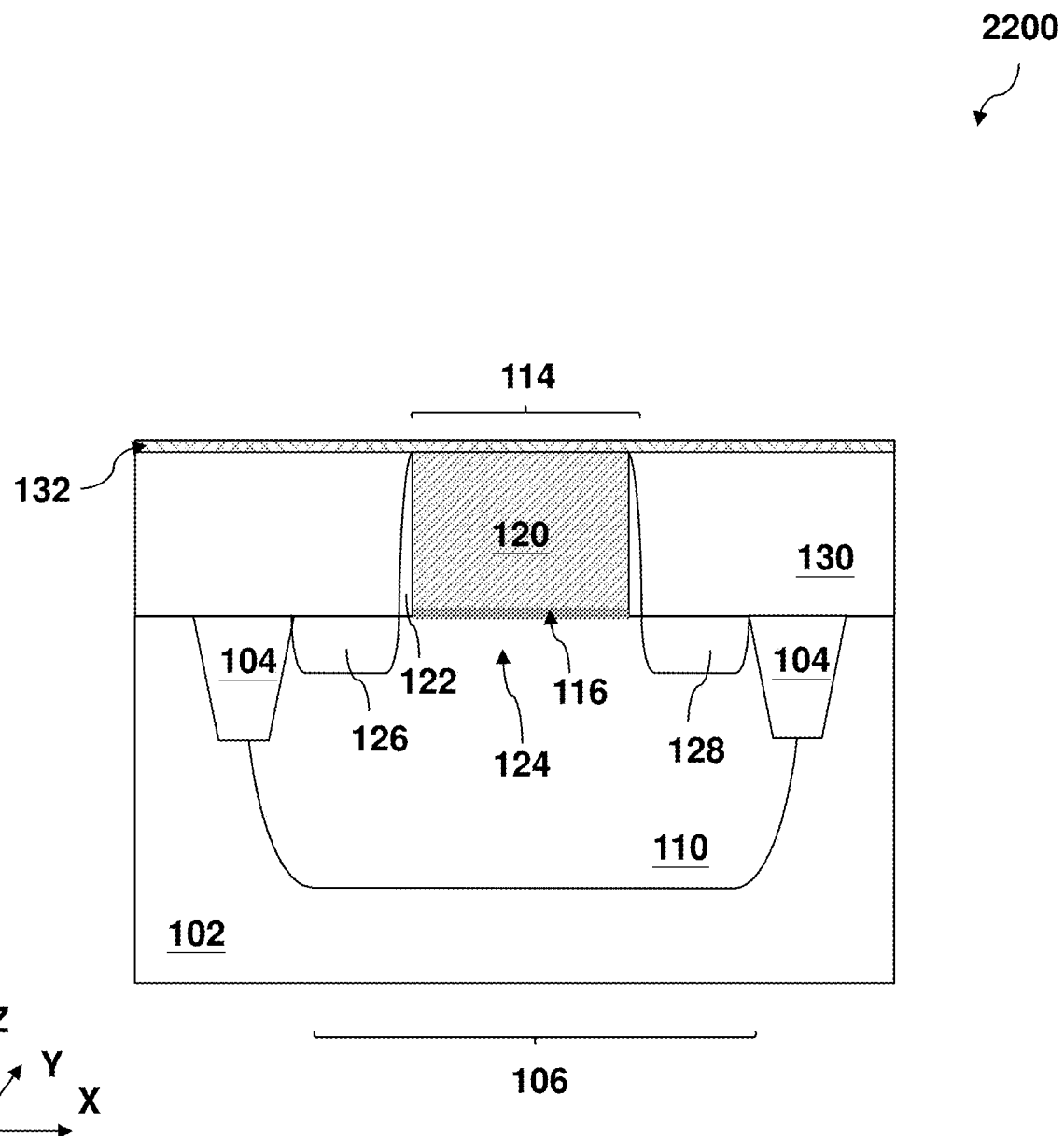
FIGS. 24, 25, 26, 27, 28, and 29 illustrate sectional views of an exemplary integrated circuit structure during various fabrication stages constructed in accordance with some embodiments.
Figure 25:
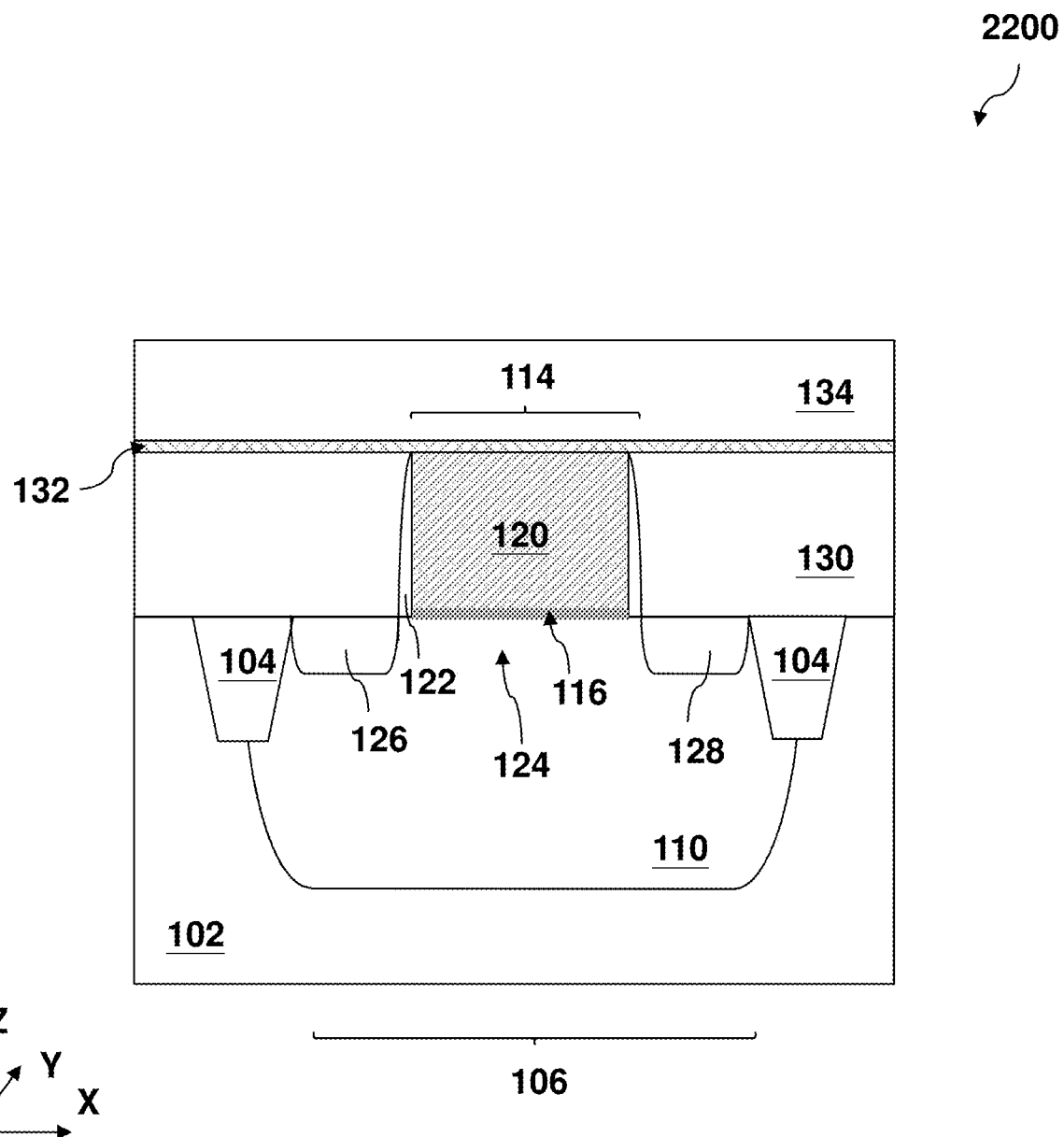
Figure 26:
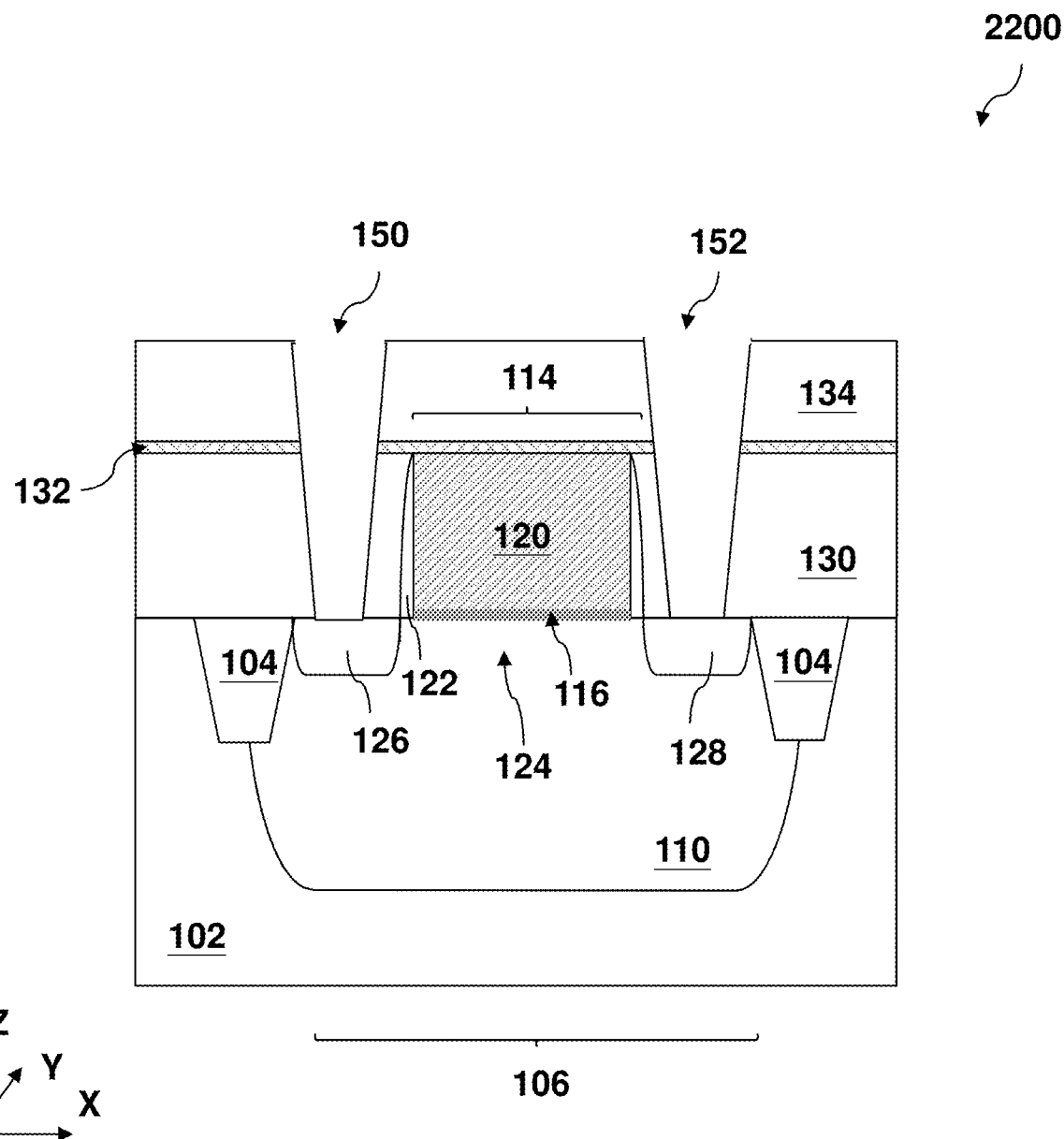
Figure 27:
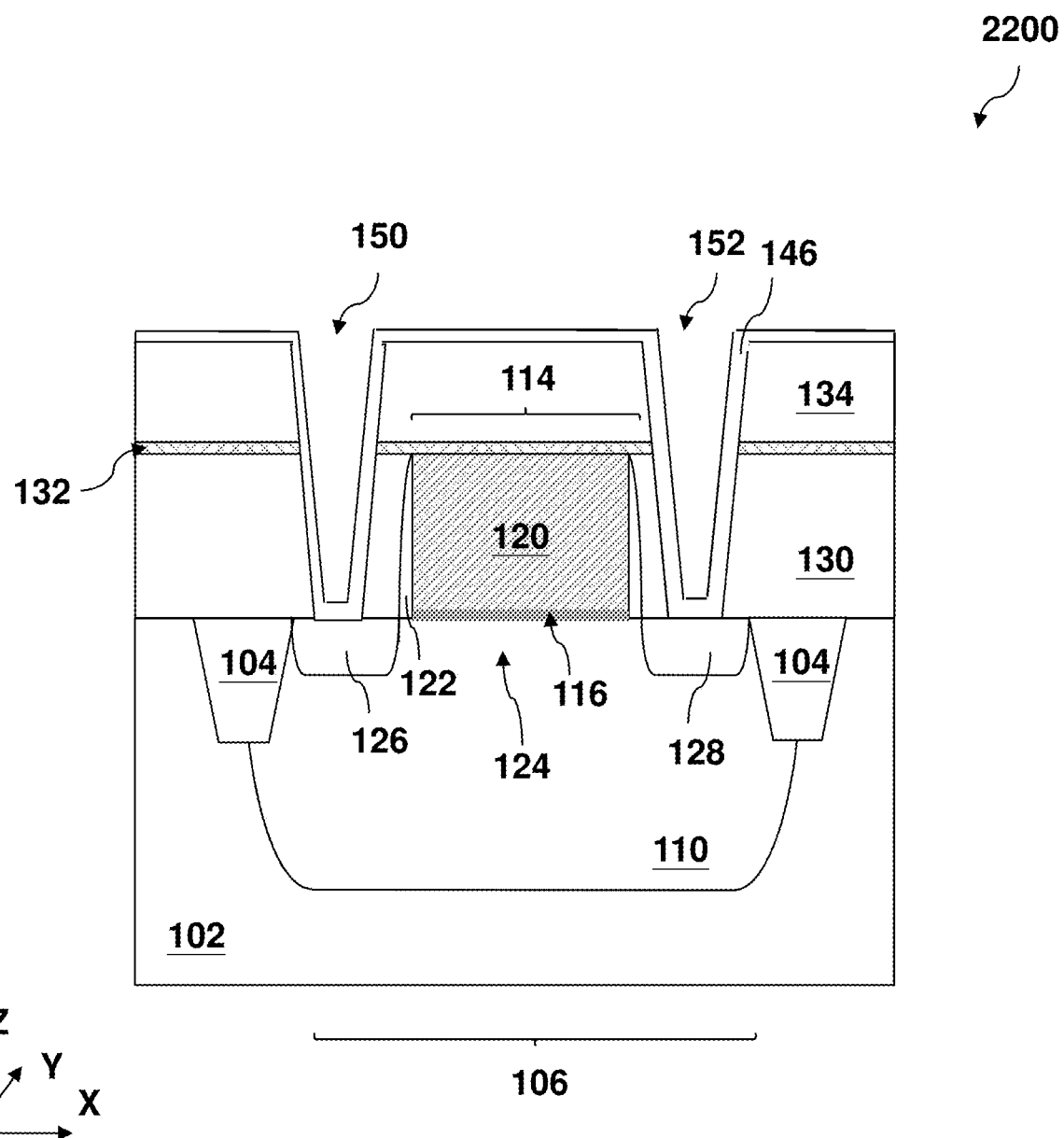

Referring to a block 218 of FIG. 23 and FIG. 27, the method 214 includes an operation to deposit the dielectric material layer 146 in the first contact hole 150 and the second contact hole 152.

Figure 28:
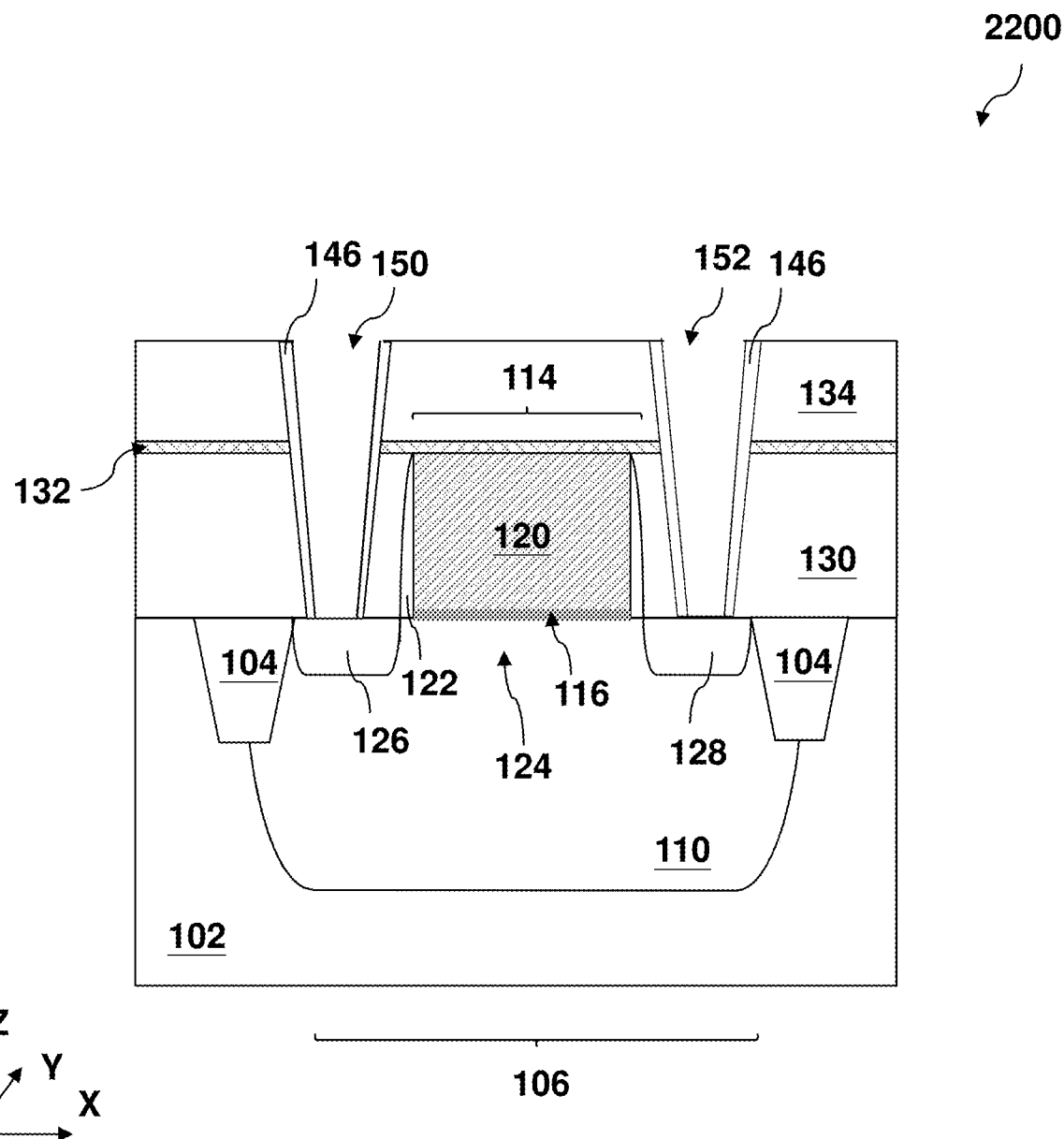
Figure 29:
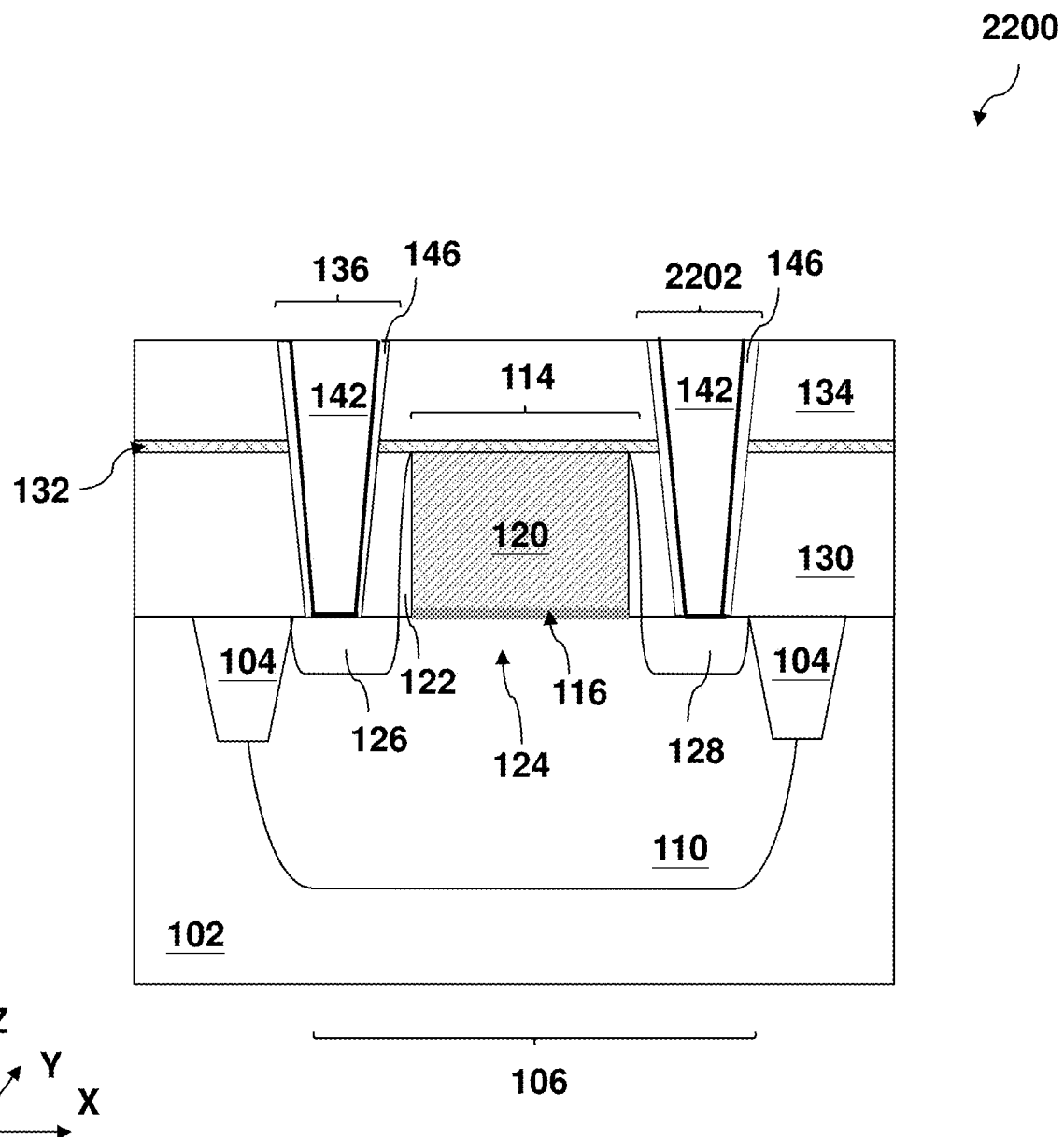

Referring to a block 2302 of FIG. 23 and FIG. 28, the method 214 includes an operation to perform an anisotropic etching process to remove the bottom portions of the dielectric material layer 146 from both the first and second contact holes. The anisotropic etching process also removes the dielectric material layer 146 on the ILD layer 134.

Figure 30A:
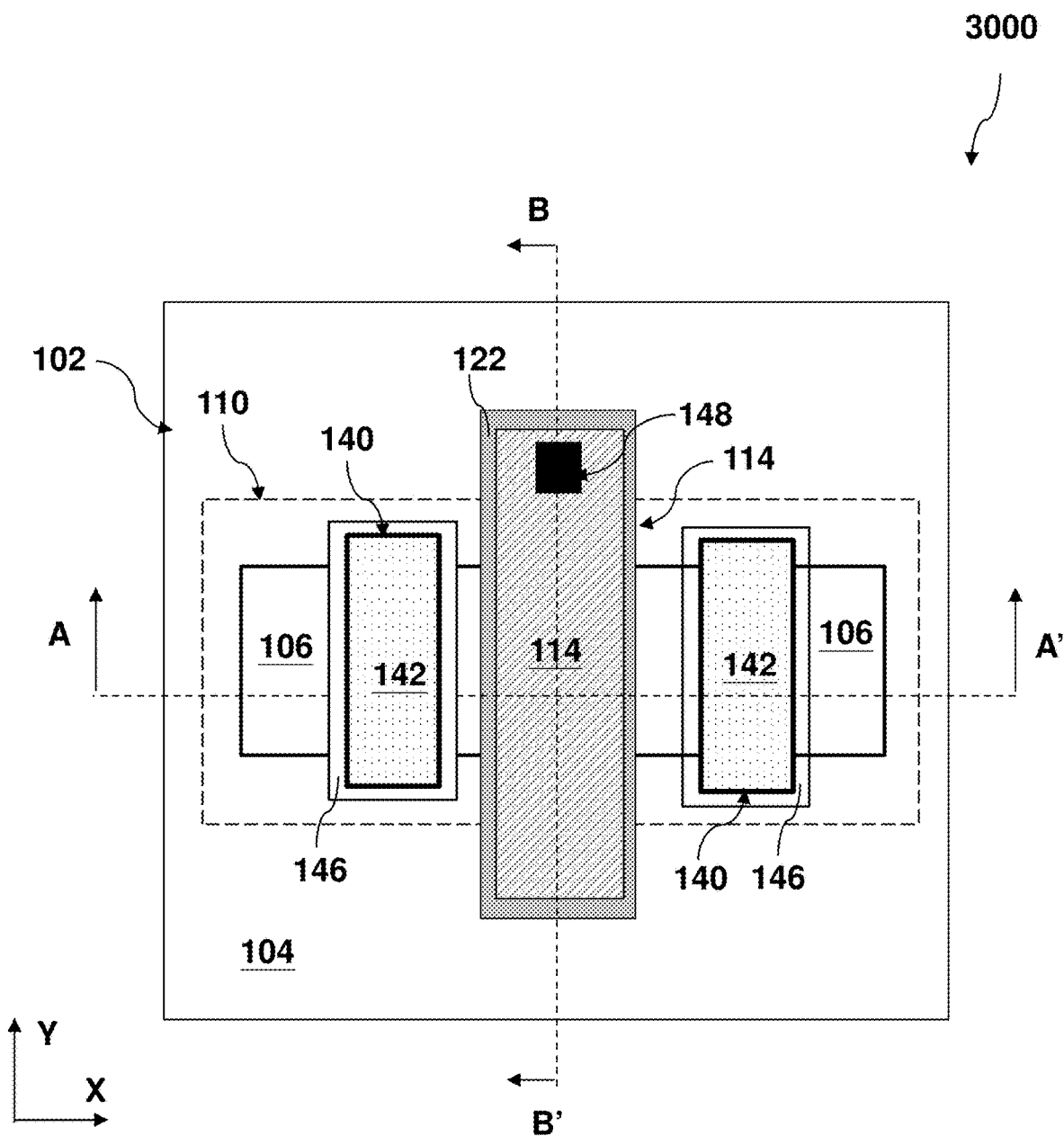
FIG. 30A is a top view of a semiconductor device structure constructed according to various aspects of the present disclosure in one embodiment.
Figure 30B:
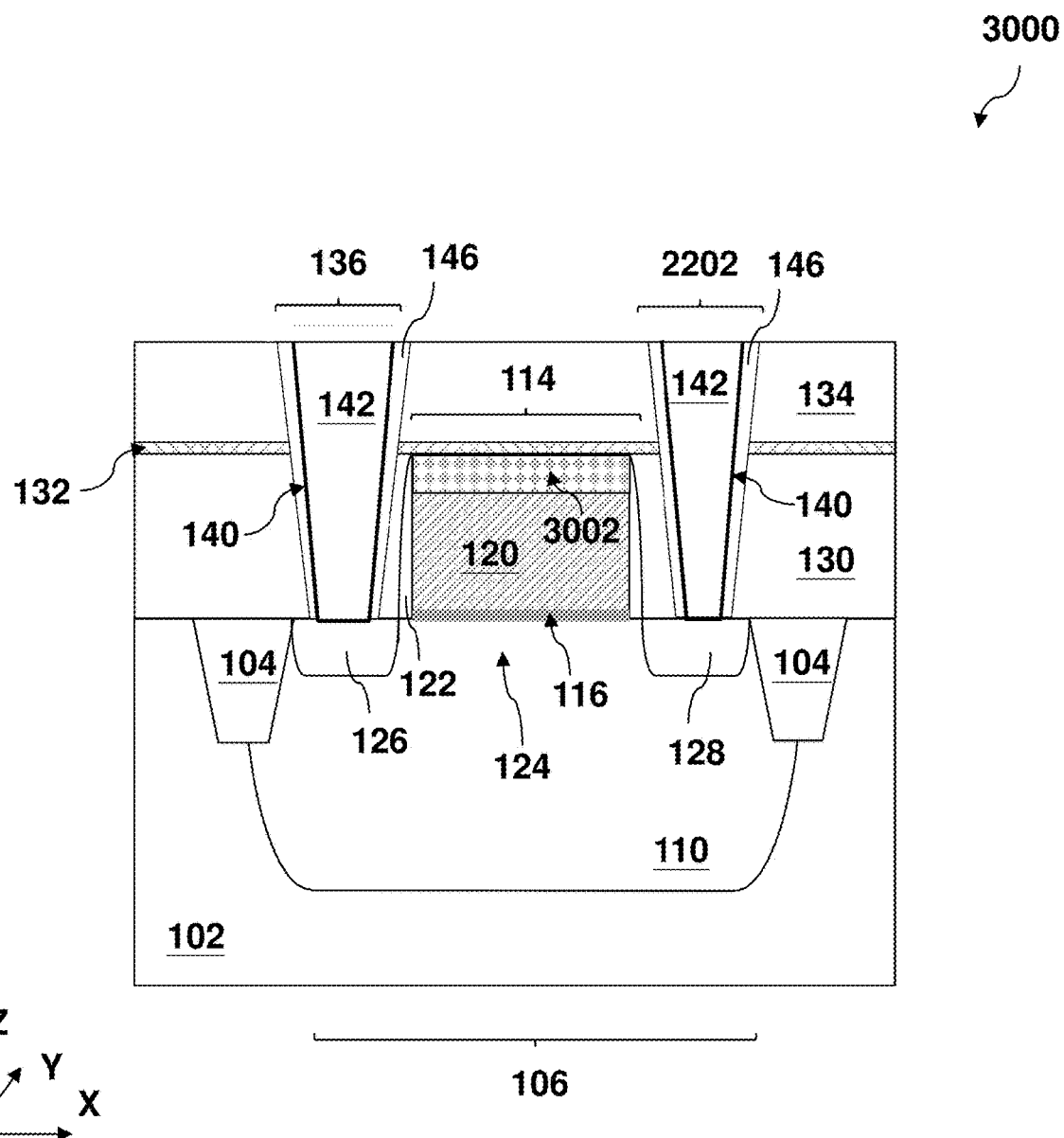
FIGS. 30B and 30C are sectional views of the semiconductor structure of FIG. 30A along the dashed lines AA' and BB' respectively, in accordance with some embodiments.
Figure 30C:
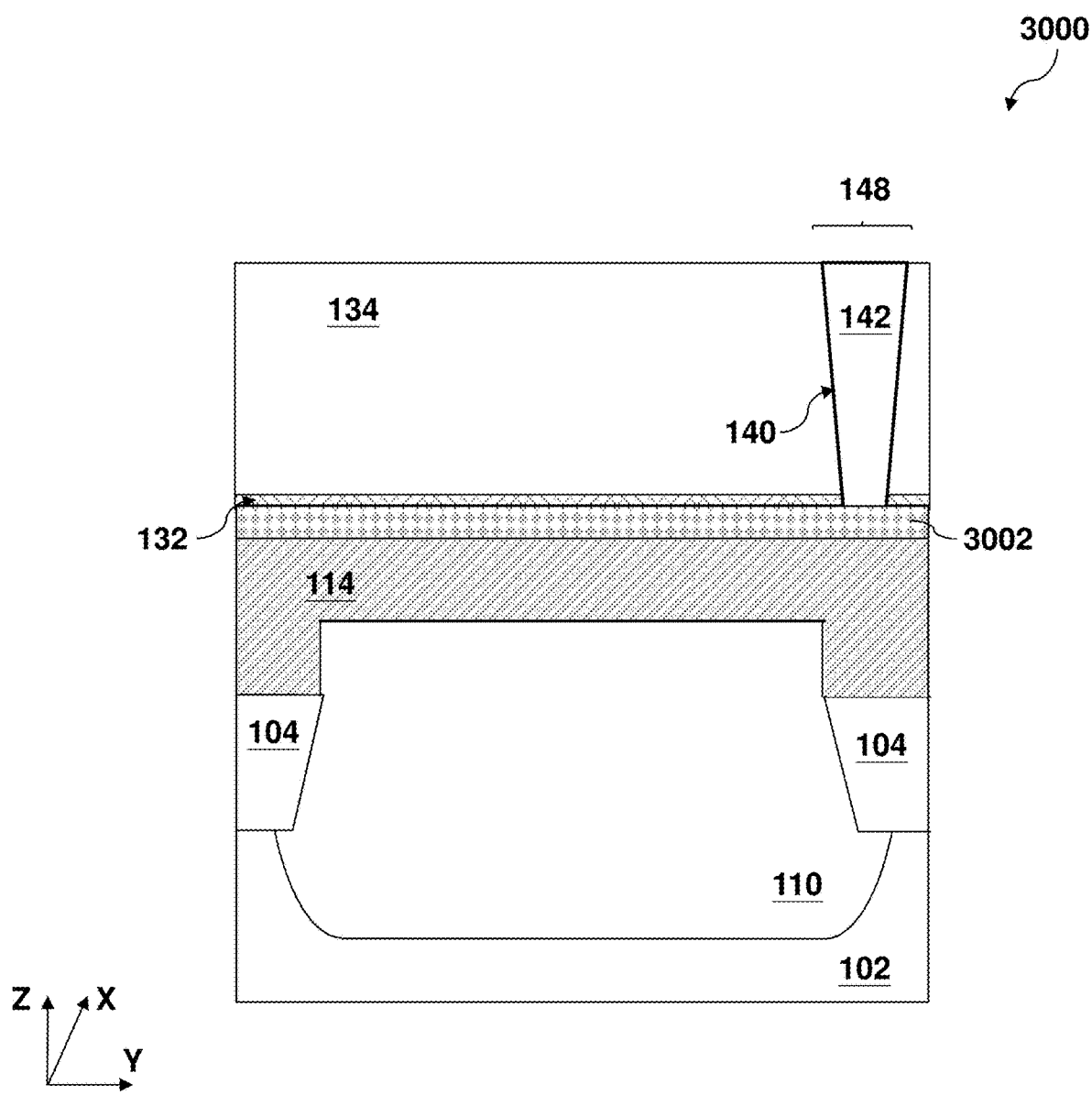

FIGS. 30A-30C provides a semiconductor structure 3000 formed by the method 200 according to some other embodiments. FIG. 30A is a top view of a semiconductor structure 3000 constructed according to various aspects of the present disclosure in one embodiment. FIG. 30B is a sectional view of the semiconductor structure 3000 along the dashed lines AA' in accordance with some embodiments. FIG. 30C is a sectional view of the semiconductor structure 3000 along the dashed lines BB' in accordance with some embodiments. The semiconductor structure 3000 is similar to the semiconductor structure 2200. The descriptions of the similar features are not repeated. However, the semiconductor structure 3000 includes a silicide feature 3002 self-aligned to the gate stack 114. The silicide feature 3002 protects the gate stack 114 from being oxidized or etch damaged during subsequent processes, and also decreases the contact resistance since the gate electrode 120 includes some conductive materials with high-resistance (such as one illustrated in FIG. 1D). Various features are formed by the method 200, as illustrated in FIGS. 32 through 38. For example, the method 200 includes an operation 202 to form the isolation feature 104; an operation 206 to form source and drain; an operation 210 to form a metal gate stack 114; an operation 212 to form the contact holes; an operation 214 to form the dielectric material layer 146; and an operation 216 to form the contact features. The similar languages are not repeated here. Particularly, the operation (or method) 210 to form the gate stack 114 is further described in detail with reference to FIG. 31.

Figure 31:
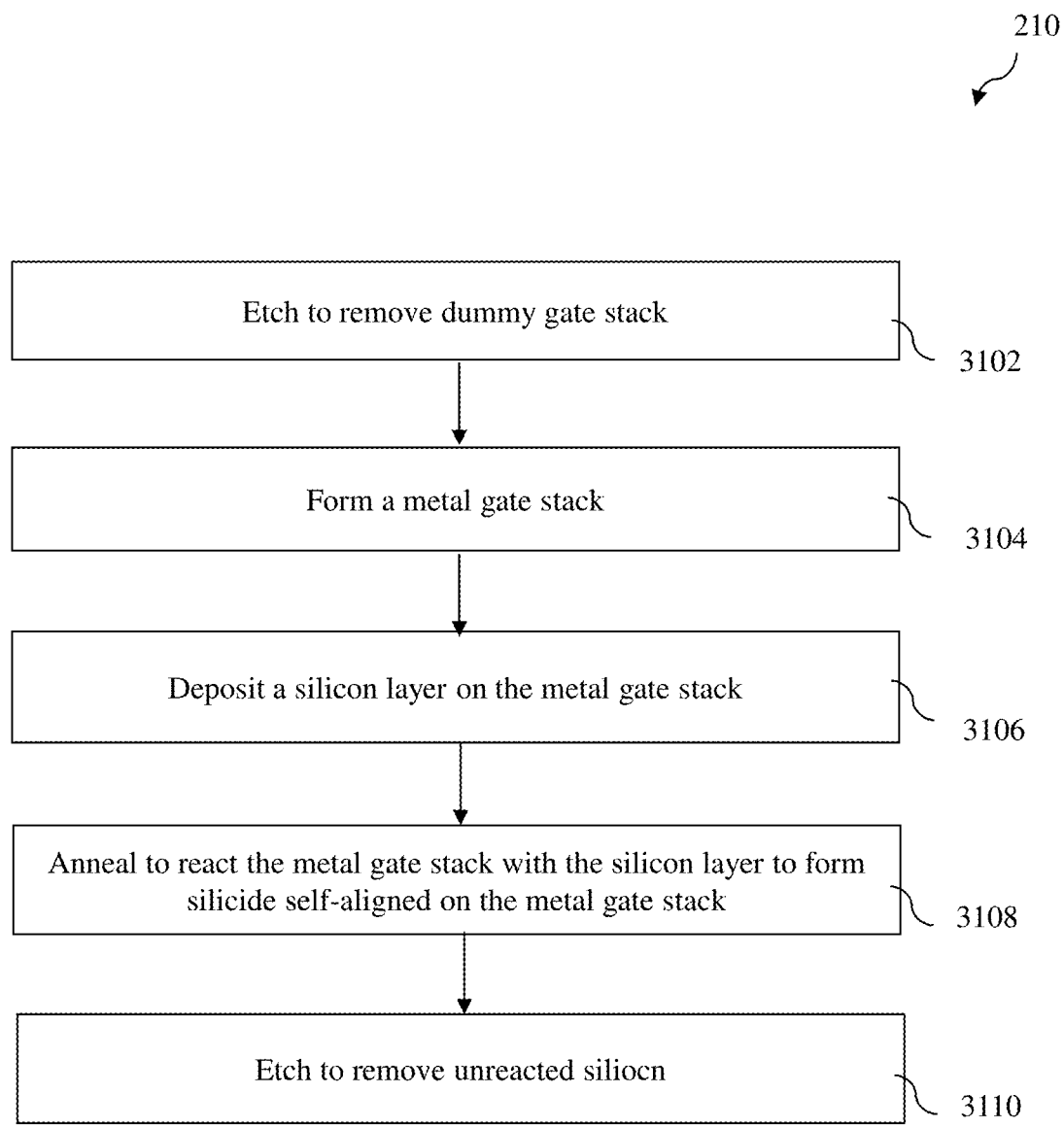
FIG. 31 a flowchart of an operation in the method of FIG. 2A in accordance with some embodiments.
Figure 32:
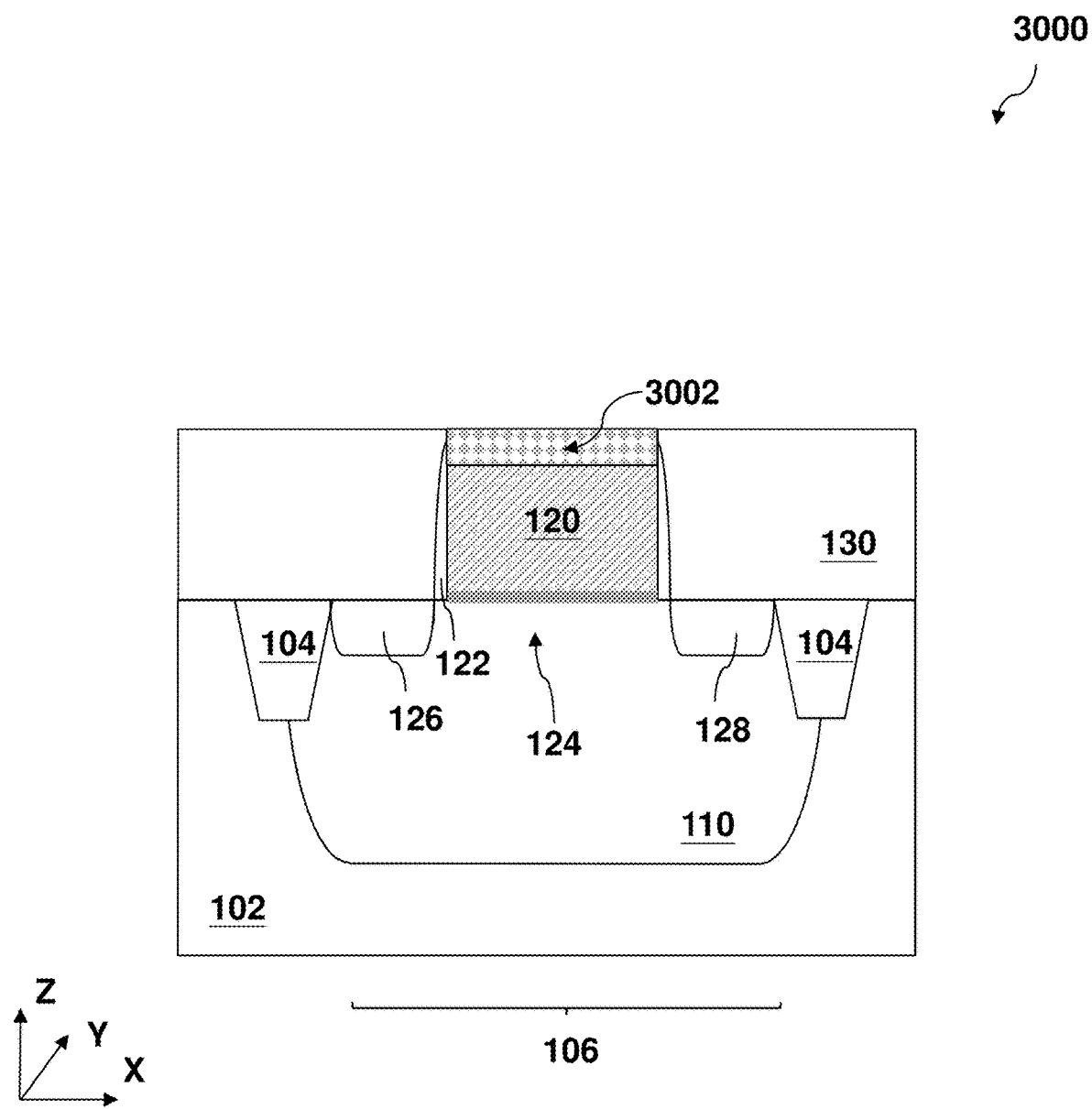
FIGS. 32, 33, 34, 35, 36, 37, and 38 illustrate sectional views of an exemplary integrated circuit structure during various fabrication stages constructed in accordance with some embodiments.
Figure 33:
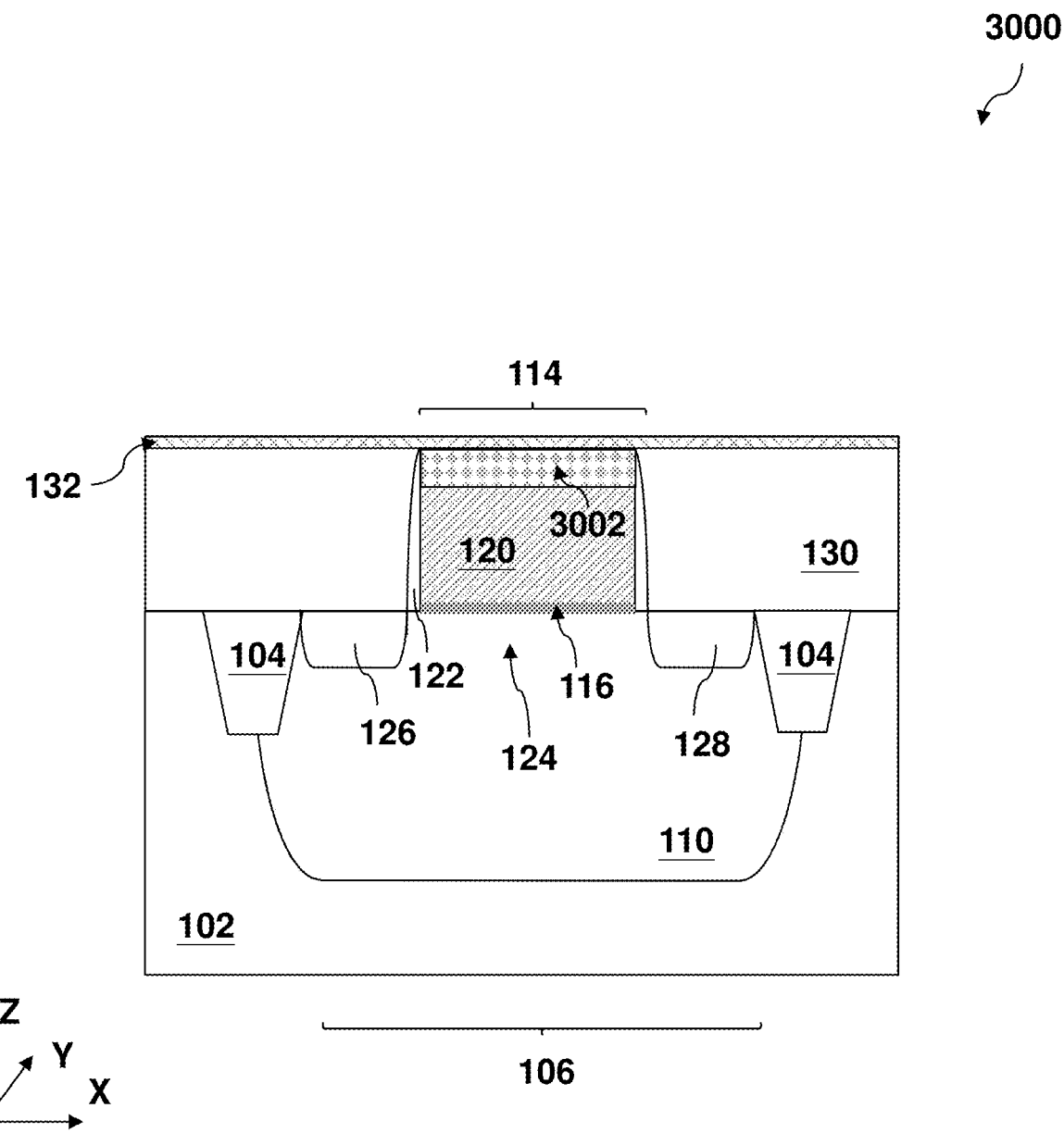
Figure 34:
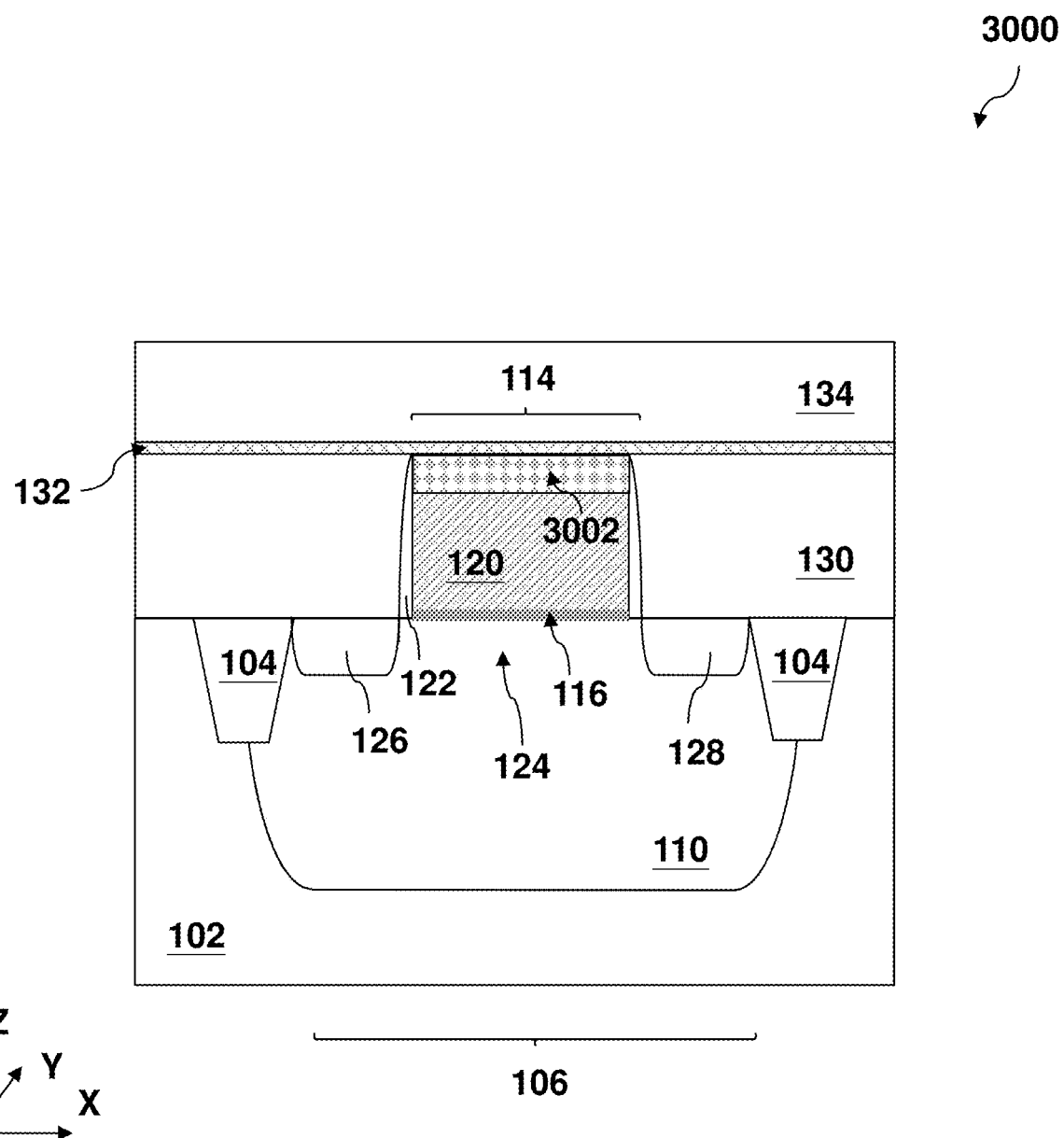
Figure 35:
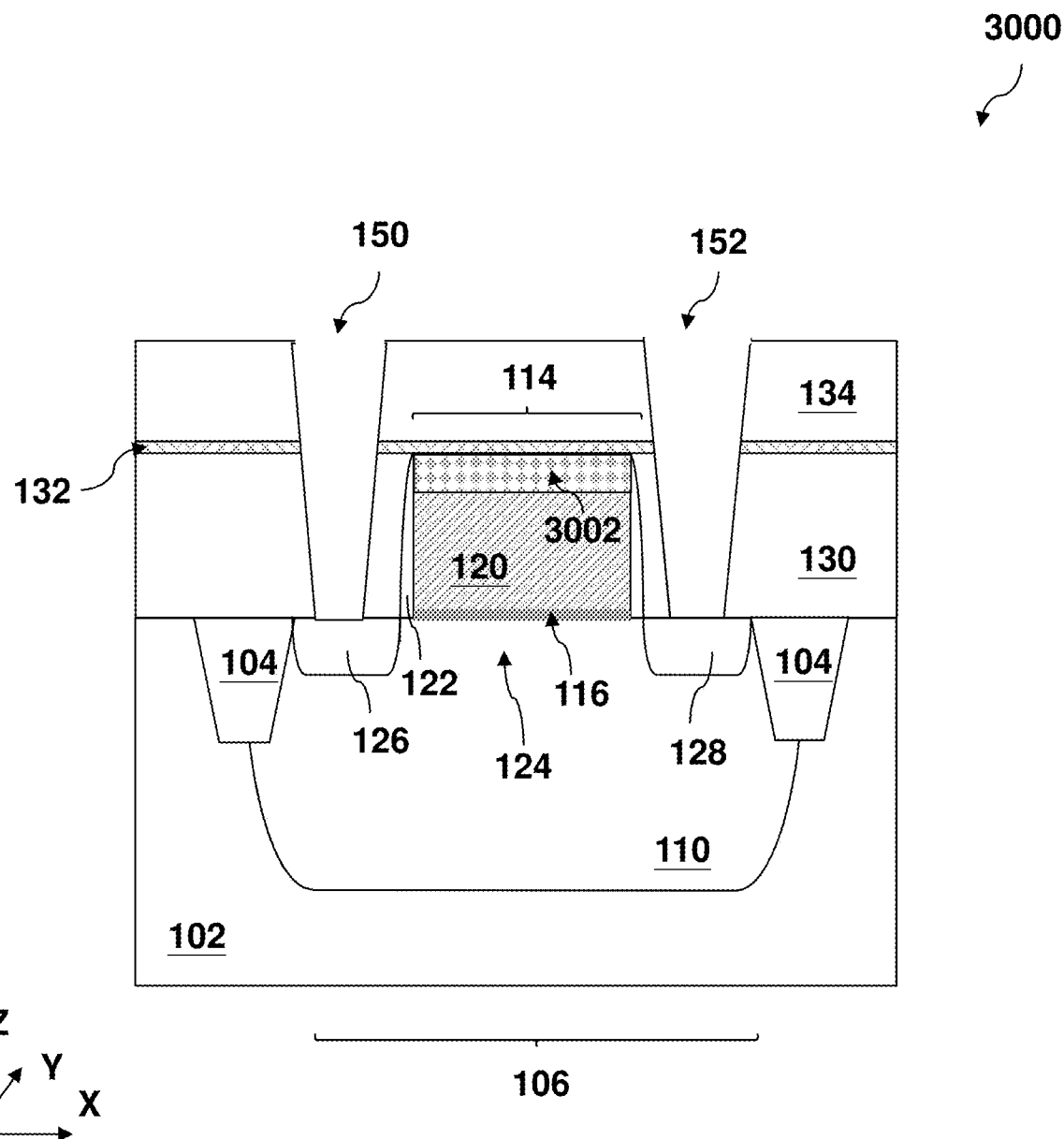
Figure 36:
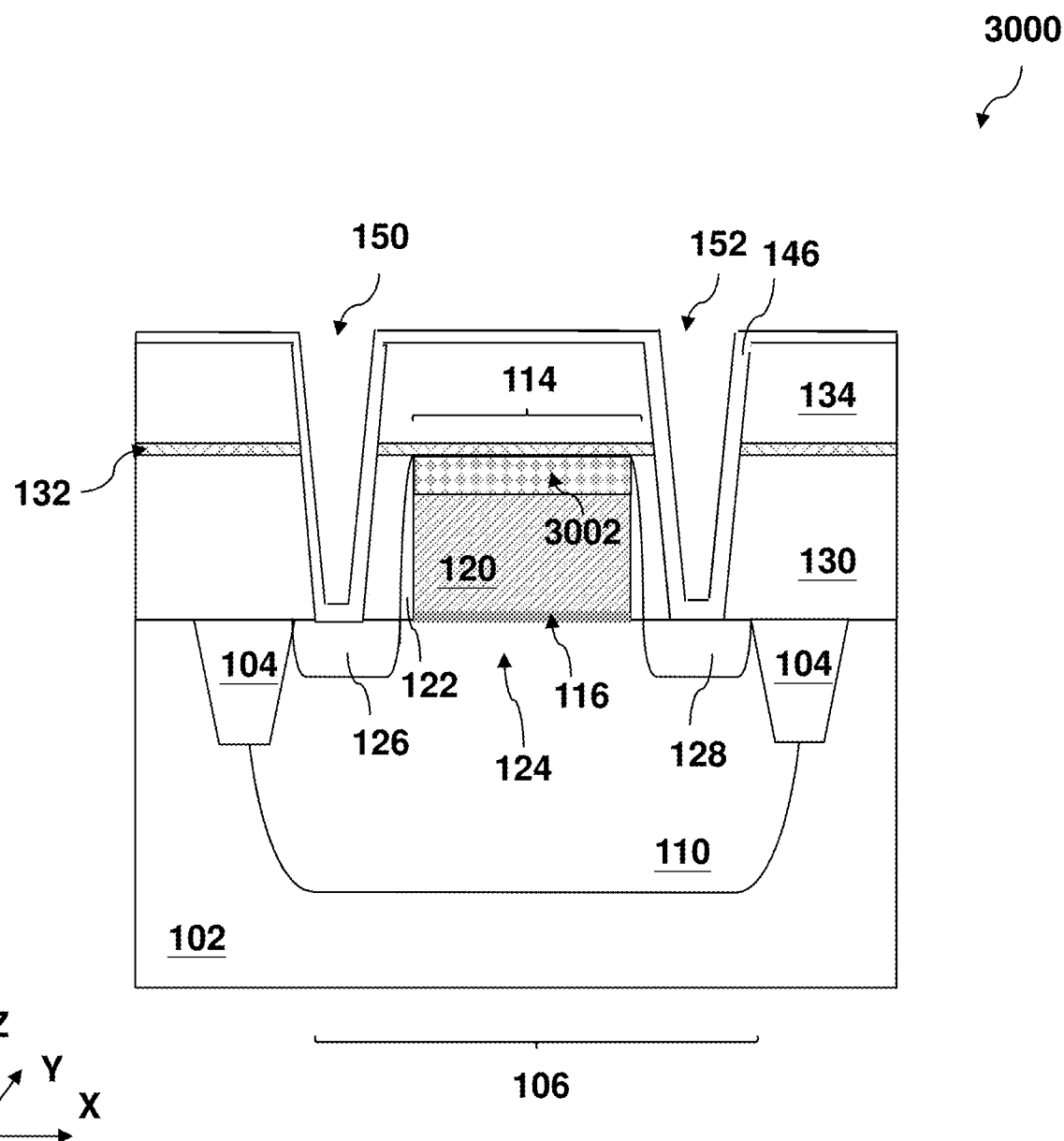
Figure 37:
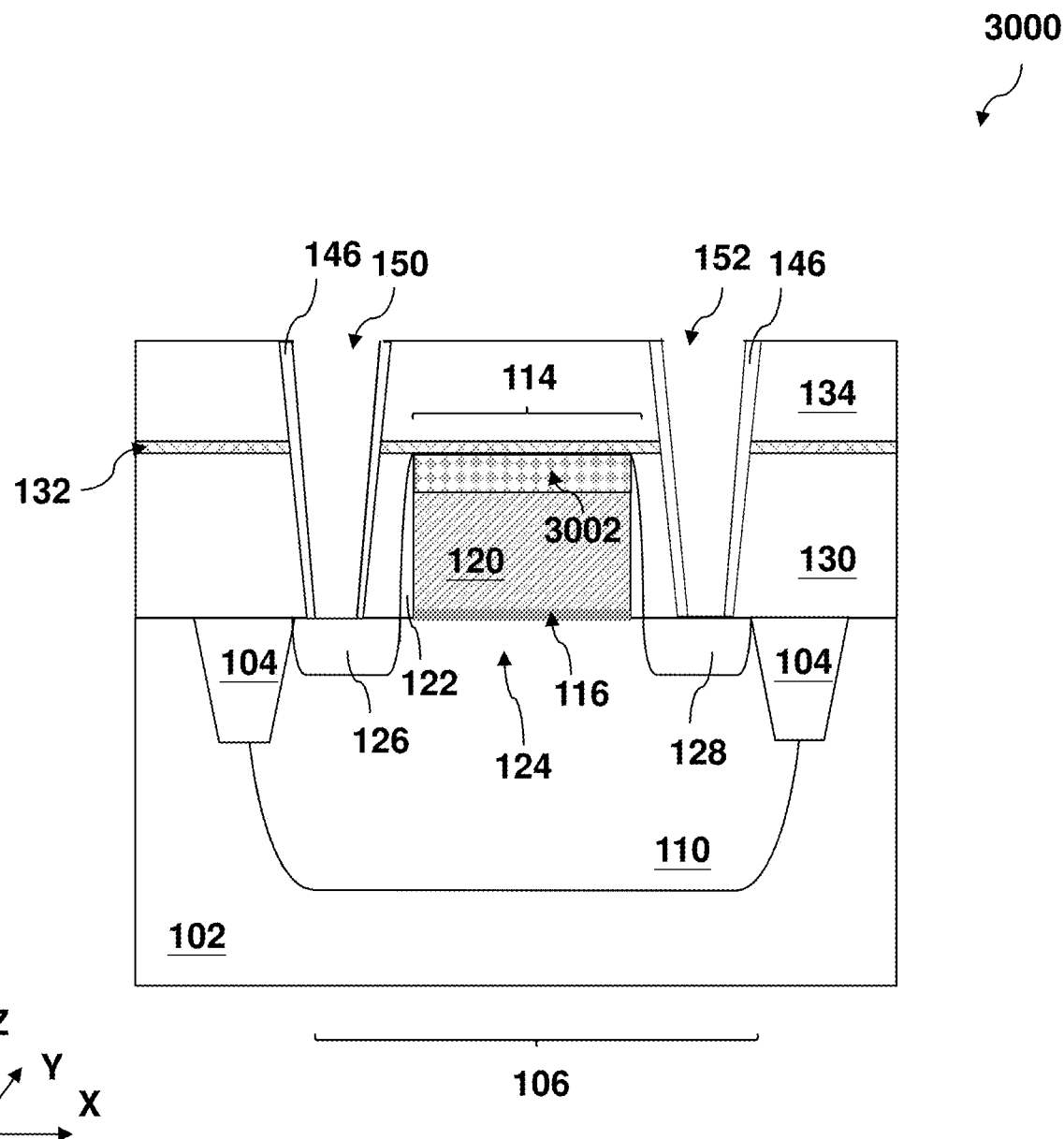
Figure 38:
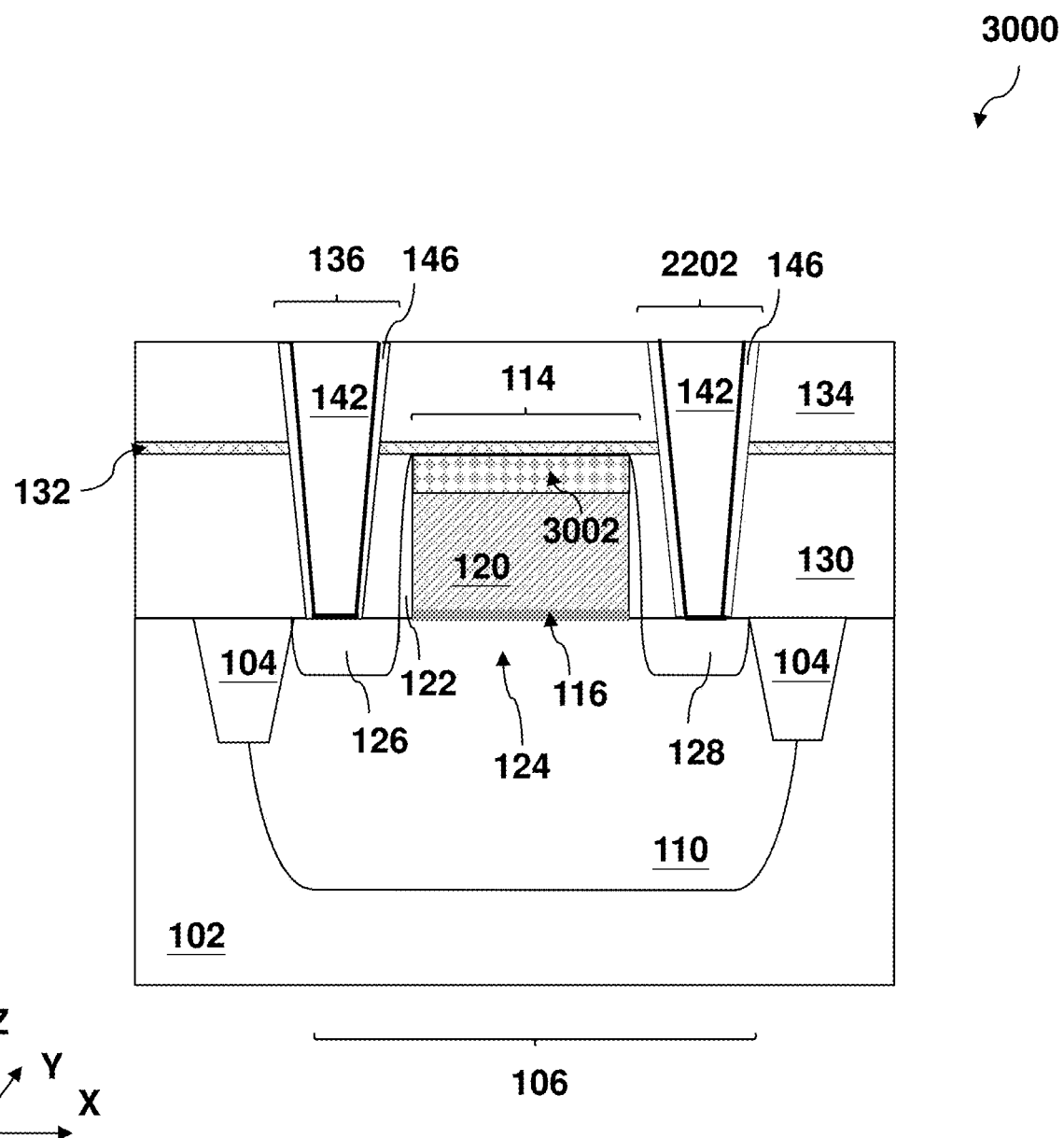

Referring to a block 3102 of FIG. 31 and FIG. 32, the method 210 includes an operation to remove the dummy gate stack by an etching process, resulting in a gate trench.

Referring to a block 3104 of FIG. 31 and FIG. 32, the method 210 includes an operation to form the metal gate stack 114 by a procedure that further includes depositing various gate materials (such as high-k dielectric material, a work function metal and a filling metal) in the gate trench, as described in FIG. 1D.

Referring to a block 3106 of FIG. 31 and FIG. 32, the method 210 includes an operation to deposit a silicon layer on the metal gate stack by a suitable method, such as CVD.

Referring to a block 3108 of FIG. 31 and FIG. 32, the method 210 includes an operation to perform a thermal annealing process with a suitable temperature to react the silicon layer and the metal electrode 120 to form a silicide feature 3002 directly on the gate electrode 120. In some embodiments, the silicide feature 3002 may include various portions with different compositions since the gate electrode 120 may include multiple metals or metal alloy.

Referring to a block 3110 of FIG. 31 and FIG. 32, the method 210 may include an operation to perform an etching process to selectively remove the unreacted silicon from the gate stack 114 and the ILD layer 134. The etching process may include wet etching, dry etching or a combination thereof. In some examples, the etching process may use an etching solution having a mixture of $HNO_3$, $H_2O$ and HF to selectively remove silicon.

The method 200 and the semiconductor structure made by the method 200 are provided in various embodiments. The method 200 may additionally include other operations before, during or after the operations described above. For example, the method 200 may further include an operation to form an interconnection structure to electrically couple various features, such as source, drain, gate stack, capacitor, resistor, or a combination thereof to form an integrated circuit. In some example, the integrated circuit includes a memory device, such as an eOTP, a RRAM, a DRAM, or a combination thereof. In the above descriptions to some embodiments, the source 128 and the drain 126 are described specifically and distinctively for better understanding of the structure of the FET or a memory device with one of the S/D features is connected to the aligned contact feature and another of the S/D features is separated from the aligned contact feature. However, the source and the drain may be swapped according to other embodiments. In other embodiments, the silicide feature 3002 self-aligned to the metal gate stack 114 in the semiconductor structure 300 may also be formed in the semiconductor structure 100, the semiconductor structure 900, the semiconductor structure 1500, and the semiconductor structure 2200.

The present disclosure provides a semiconductor structure and a method making the same in various embodiments. The semiconductor structure includes a FET with a dielectric material deposited in the contact hole before the contact feature is formed therein. In some embodiments, the dielectric material layer is extended to between the contact feature and the underlying source (or alternatively drain) and functions as a capacitor (or resistor). In some embodiments, the FET and capacitor form a memory device, such as a RRAM, a DRAM, or an eOTP. Furthermore, the dielectric material layer in the contact hole also provides isolation between the gate and the source/drain features with reduced leakage. In some embodiments, the semiconductor structure includes a method to form a silicide feature on the metal gate stack and self-aligned with the gate electrode. By implementing the disclosed method in various embodiments, some of advantages described below may present. However, it is understood that different embodiments disclosed herein offer different advantages and that no particular advantage is necessarily required in all embodiments. As one example, the dielectric layer 146 is formed in the contact hole by deposition, and the thickness of the dielectric material layer 146 is controlled by the deposition process. Therefore, the electric parameter of the dielectric material layer (such as capacitance or resistance) can be more precisely controlled since the thickness can be more precisely controlled by deposition than etching. In another example, the dielectric material layer 146 is disposed on the sidewalls of the contact hole(s) and provides isolation between the source/drain feature(s) and the gate stack, preventing from leaking. Furthermore, the process is easy to implement and is more compatible with advanced technology nodes, such as 7 nm technology node.

Thus, the present disclosure provides a method of fabricating an integrated circuit in accordance with some embodiments. The method includes forming a source and a drain on a fin active region of a semiconductor substrate; depositing an interlayer dielectric (ILD) layer on the source and drain; patterning the ILD layer to form a first contact hole and a second contact hole aligning with the source and drain, respectively; forming a dielectric material layer in the first contact hole; and forming a first conductive feature and a second conductive feature in the first and second contact holes, respectively.

The present disclosure provides a method of fabricating an integrated circuit in accordance with other embodiments. The method includes forming a metal gate stack on a fin active region of a semiconductor substrate; forming a source and a drain on the fin active region; forming a silicide layer self-aligned on the metal gate stack; forming an interlayer dielectric (ILD) layer on the source and drain; patterning the ILD layer to form a first contact hole and a second contact hole aligning with the source and drain, respectively; forming a dielectric material layer in the first contact hole; and forming a first conductive feature and a second conductive feature in the first and second contact holes, respectively.

The present disclosure provides an integrated circuit in accordance with some embodiments. The IC structure includes a fin active region on a substrate; a metal gate stack on the fin active region; a source and a drain on the fin active region, wherein the metal gate stack in interposed between the source and drain; an interlayer dielectric (ILD) layer disposed on the source and the drain; a first conductive feature and a second conductive feature formed in the ILD layer and being aligned on the source and the drain, respectively; and a dielectric material layer surrounding the first and second conductive features. The dielectric material layer continuously extends to a bottom surface of the first conductive feature and includes a portion interposing between the first conductive feature and the source. The second conductive feature directly contacts the drain.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit (IC) structure, comprising:
a fin active region on a substrate;
a metal gate stack on the fin active region;
a source and a drain on the fin active region, wherein the metal gate stack is interposed between the source and drain;
an interlayer dielectric (ILD) layer disposed on the source and the drain;
a first conductive feature and a second conductive feature formed in the ILD layer and being aligned on the source and the drain, respectively; wherein
the first conductive feature is separated and isolated from the source by a portion of the ILD layer;
the second conductive feature contacts the drain; and
a dielectric material layer surrounding and contacting the second conductive feature, wherein a dielectric capping layer extends from a first portion of the dielectric material layer on a first sidewall of the second conductive feature to a second portion of the dielectric material layer on a second sidewall of the second conductive feature, wherein
the dielectric material layer continuously extends from a top surface of the second conductive feature to a bottom surface of the second conductive feature; and
the first dielectric material layer is different from the ILD layer in composition.

2. The IC structure of claim 1, wherein
each of the first and second conductive features includes a glue layer and a bulk metal being wrapped by the glue layer;
the glue layer includes a titanium film and a titanium nitride film; and
the bulk metal includes one of tungsten, copper, aluminum, and a combination thereof.

3. The IC structure of claim 1, further comprising a doped well of a first-type conductivity, wherein
the source and the drain have a second-type of conductivity and are disposed in the doped well;
a portion of the active region functions as a channel, the channel is underlying the metal gate stack has the first-type of conductivity; and
the source, the drain, the channel and the metal gate stack are configured to be components of a field-effect transistor.

4. An integrated circuit (IC) structure, comprising:
a fin active region on a semiconductor substrate;
a metal gate stack on the fin active region and having a gate dielectric layer and a gate electrode;
a source and a drain on the fin active region, wherein the metal gate stack spans from the source to the drain;
an interlayer dielectric (ILD) layer disposed on the source and the drain, wherein the ILD layer surrounds the metal gate stack and wherein the gate electrode has a top surface being coplanar with a top surface of the ILD layer;
a dielectric capping layer disposed on the ILD layer and the metal gate stack, wherein the dielectric capping layer contacts the gate electrode, and wherein the dielectric capping layer extends over the metal gate stack from a first portion of the ILD layer on one side of the metal gate stack to a second portion of the ILD layer on an opposing side of the metal gate stack;
a first conductive feature and a second conductive feature formed in the ILD layer and being aligned on the source and the drain, respectively; and
a dielectric material layer surrounding the first and second conductive features, wherein
the dielectric capping layer extends from a first portion of the dielectric material layer on a sidewall of the first conductive feature to a second portion of the dielectric material layer on a sidewall of the second conductive feature;
the second conductive feature contacts the drain;
the dielectric material layer continuously extends to a bottom surface of the first conductive feature and isolates the first conductive feature from the source;
the dielectric material layer includes a first dielectric material; and
the ILD layer includes a second dielectric material different from the first dielectric material in composition.

5. The IC structure of claim 4, wherein
the metal gate stack includes a height H;
the dielectric material layer includes a thickness T; and
a ratio T/H ranges from 1/20 to 1/2.

6. The IC structure of claim 4, wherein
the first dielectric material includes one of silicon oxide, silicon nitride, silicon oxynitride, silicon carbide, and a combination thereof; and
the second dielectric material includes a low-k dielectric material.

7. The IC structure of claim 4, wherein the dielectric material layer vertically extends through the dielectric capping layer.

8. The IC structure of claim 4, wherein
each of the first and second conductive features includes a glue layer and a bulk metal being wrapped by the glue layer;
the glue layer includes a titanium film and a titanium nitride film; and
the bulk metal includes one of tungsten, copper, aluminum, and a combination thereof.

9. The IC structure of claim 8, wherein the glue layer continuously extends to separate the bulk metal of the first conductive feature from the dielectric material layer.

10. The IC structure of claim 4, wherein
the metal gate stack has an elongated shape oriented along a first direction;
the gate electrode includes multiple metal-containing films being U-shaped from a cross-sectional view along a plane perpendicular to the first direction; and
the dielectric capping layer contacts each of the multiple metal-containing films.

11. The IC structure of claim 4, further comprising a silicide layer disposed on and self-aligned with the metal gate stack.

12. The IC structure of claim 4, further comprising a doped well of a first-type conductivity, wherein
the source and the drain have a second-type of conductivity and are disposed in the doped well; and
the source, the drain, the channel and the metal gate stack are configured to be components of a field-effect transistor.

13. An integrated circuit (IC) structure, comprising:
a fin active region on a semiconductor substrate;
a metal gate stack on the fin active region and having a gate dielectric layer and a gate electrode;
a source and a drain on the fin active region, wherein the metal gate stack spans from the source to the drain;

an interlayer dielectric (ILD) layer disposed on the source and the drain, wherein the ILD layer surrounds the metal gate stack and wherein the gate electrode has a top surface being coplanar with a top surface of the ILD layer;

a dielectric capping layer disposed on the top surface of the ILD layer and the top surface of the metal gate stack, wherein the dielectric capping layer contacts the gate electrode, and wherein the dielectric capping layer extends over the metal gate stack from a first portion of the ILD layer on one side of the metal gate stack to a second portion of the ILD layer on an opposing side of the metal gate stack;

a first conductive feature and a second conductive feature formed in the ILD layer and being aligned on the source and the drain, respectively, wherein the first conductive feature is isolated from the source and the second conductive feature contacts the drain; and a first dielectric material layer surrounding the first and second conductive features, wherein the dielectric capping layer extends from a first portion of the first dielectric material layer on a sidewall of the first conductive feature to a second portion of the first dielectric material layer on a sidewall of the second conductive feature, wherein the first dielectric material layer continuously extends to a bottom surface of the first conductive feature and isolates the first conductive feature from the source; and the first dielectric material layer is different from the ILD layer in composition.

14. The IC structure of claim 13, wherein the first conductive feature is isolated from the source by the ILD layer.

15. The IC structure of claim 13, wherein
the metal gate stack includes a height H;
the first dielectric material layer includes a thickness T; and
a ratio T/H ranges from 1/20 to 1/2.

16. The IC structure of claim 15, wherein the first dielectric material layer contacts the first conductive feature and separates the first conductive feature from the ILD layer and the dielectric capping layer.

17. The IC structure of claim 15, wherein the first dielectric material layer extends through the dielectric capping layer.

18. The IC structure of claim 13, wherein
the first conductive feature spans a height less than that of the second conductive feature;
the first conductive feature includes a first top surface and a first bottom surface;
the second conductive feature includes a second top surface and a second bottom surface;
the first top surface and the second top surface are coplanar; and
the second bottom surface is below the first bottom surface.

19. The IC structure of claim 4, wherein the dielectric material layer contacts the first conductive feature and separates the first conductive feature from the ILD layer and the dielectric capping layer.

20. The IC structure of claim 8, wherein the dielectric capping layer directly contacts the glue layer and the dielectric material layer.

* * * * *